(12) United States Patent
Palfreyman et al.

(10) Patent No.: US 10,190,753 B2
(45) Date of Patent: Jan. 29, 2019

(54) SEALED AND SEALABLE SCALABLE LIGHTING SYSTEMS INCORPORATING FLEXIBLE LIGHT SHEETS AND RELATED METHODS

(71) Applicants: Paul Palfreyman, Vancouver (CA); Vitali Tikhomolov, Vancouver (CA); Michael A. Tischler, Vancouver (CA)

(72) Inventors: Paul Palfreyman, Vancouver (CA); Vitali Tikhomolov, Vancouver (CA); Michael A. Tischler, Vancouver (CA)

(73) Assignee: COOLEDGE LIGHTING INC., Richmond, British Columbia (CA)

( * ) Notice: Subject to any disclaimer, the term of this patent is extended or adjusted under 35 U.S.C. 154(b) by 0 days.

(21) Appl. No.: 15/787,020

(22) Filed: Oct. 18, 2017

(65) Prior Publication Data

US 2018/0073706 A1    Mar. 15, 2018

Related U.S. Application Data

(63) Continuation-in-part of application No. 15/296,590, filed on Oct. 18, 2016, which is a continuation of
(Continued)

(51) Int. Cl.
*F21V 19/02*   (2006.01)
*F21V 31/00*   (2006.01)
(Continued)

(52) U.S. Cl.
CPC .............. *F21V 19/02* (2013.01); *E04B 9/241* (2013.01); *E04B 9/32* (2013.01); *E04B 9/366* (2013.01); *F21S 8/026* (2013.01); *F21V 7/00* (2013.01); *F21V 15/01* (2013.01); *F21V 19/005* (2013.01); *F21V 23/001* (2013.01); *F21V 23/003* (2013.01); *F21V 23/06* (2013.01);
(Continued)

(58) Field of Classification Search
CPC . F21V 19/02; F21V 23/06; F21V 7/00; F21V 19/005; F21V 23/001; F21V 23/003; F21V 15/01; F21V 33/006; F21V 31/005
See application file for complete search history.

(56) References Cited

U.S. PATENT DOCUMENTS 6,371,637 B1    4/2002   Atchinson et al.
8,294,075 B2 *  10/2012  Roberts ..................... F21K 9/00
                                                      250/205

(Continued)

OTHER PUBLICATIONS

PCT International Patent Application No. PCT/US2017/057146, International Search Report and Written Opinion dated Feb. 1, 2018, 9 pages.

*Primary Examiner* — Joseph L Williams
(74) *Attorney, Agent, or Firm* — Morgan, Lewis & Bockius, LLP

(57) ABSTRACT

In accordance with certain embodiments, illumination elements having different shapes defined by contiguous arrangements of illumination unit cells may be assembled to illuminate an arbitrary two-dimensional area. In various embodiments, the illumination elements include flexible light sheets and one or more sealed regions containing light-emitting elements, the sealed regions defined by seals between a top housing and a bottom housing and/or the light sheet.

27 Claims, 26 Drawing Sheets

Related U.S. Application Data application No. 14/301,859, filed on Jun. 11, 2014, now Pat. No. 9,506,633, and a continuation-in-part of application No. 14/195,175, filed on Mar. 3, 2014, now Pat. No. 8,884,534, which is a continuation of application No. 13/970,027, filed on Aug. 19, 2013, now Pat. No. 8,704,448, which is a continuation-in-part of application No. 13/799,807, filed on Mar. 13, 2013, now Pat. No. 8,947,001.

(60) Provisional application No. 62/409,586, filed on Oct. 18, 2016, provisional application No. 61/834,183, filed on Jun. 12, 2013, provisional application No. 61/697,411, filed on Sep. 6, 2012.

(51) Int. Cl.

| | | |
|---|---|---|
| *F21V 23/06* | (2006.01) | |
| *F21V 23/00* | (2015.01) | |
| *F21S 8/02* | (2006.01) | |
| *F21V 7/00* | (2006.01) | |
| *F21V 15/01* | (2006.01) | |
| *F21V 33/00* | (2006.01) | |
| *E04B 9/32* | (2006.01) | |
| *E04B 9/24* | (2006.01) | |
| *H05B 33/08* | (2006.01) | |
| *F21V 19/00* | (2006.01) | |
| *E04B 9/36* | (2006.01) | |
| *F21V 17/10* | (2006.01) | |
| *F21V 5/00* | (2018.01) | |
| *F21Y 115/10* | (2016.01) | |
| *F21Y 105/10* | (2016.01) | |
| *H05K 3/28* | (2006.01) | |
| *F21Y 101/00* | (2016.01) | |
| *F21Y 113/00* | (2016.01) | |

(52) U.S. Cl.
CPC .............. *F21V 31/00* (2013.01); *F21V 31/005* (2013.01); *F21V 33/006* (2013.01); *H05B 33/0827* (2013.01); *F21V 5/007* (2013.01); *F21V 5/008* (2013.01); *F21V 7/0083* (2013.01); *F21V 17/101* (2013.01); *F21Y 2101/00* (2013.01); *F21Y 2105/10* (2016.08); *F21Y 2113/00* (2013.01); *F21Y 2115/10* (2016.08); *H05K 3/284* (2013.01); *H05K 2201/10106* (2013.01); *H05K 2201/2054* (2013.01)

(56) References Cited

U.S. PATENT DOCUMENTS

| | | |
|---|---|---|
| 2010/0065873 A1 | 3/2010 | Bhattacharya et al. |
| 2012/0060895 A1* | 3/2012 | Rubin ................. H01L 31/048 136/246 |
| 2013/0140430 A1* | 6/2013 | Roberts .................... F21K 9/00 250/205 |
| 2014/0362566 A1 | 12/2014 | Tischler et al. |
| 2015/0117039 A1 | 4/2015 | Yang |

\* cited by examiner

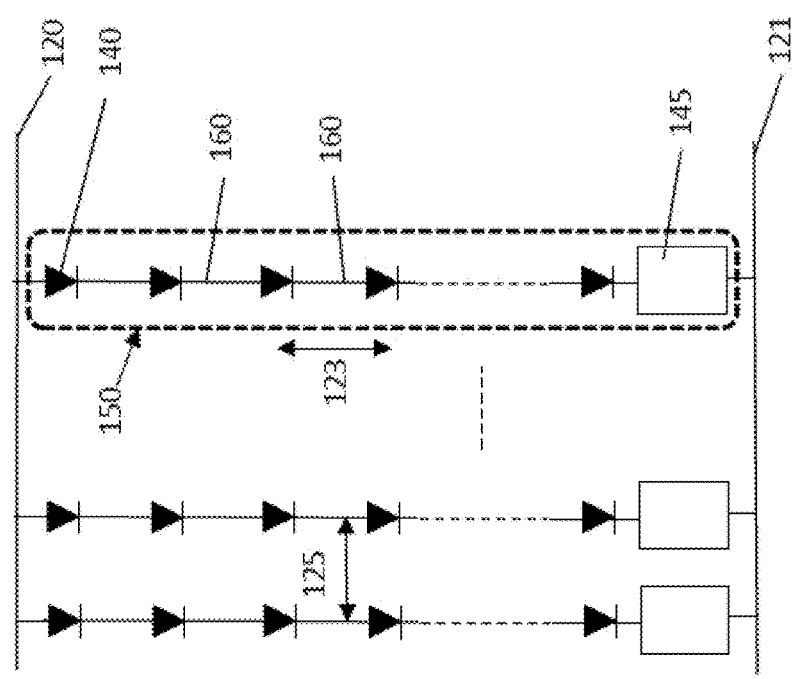

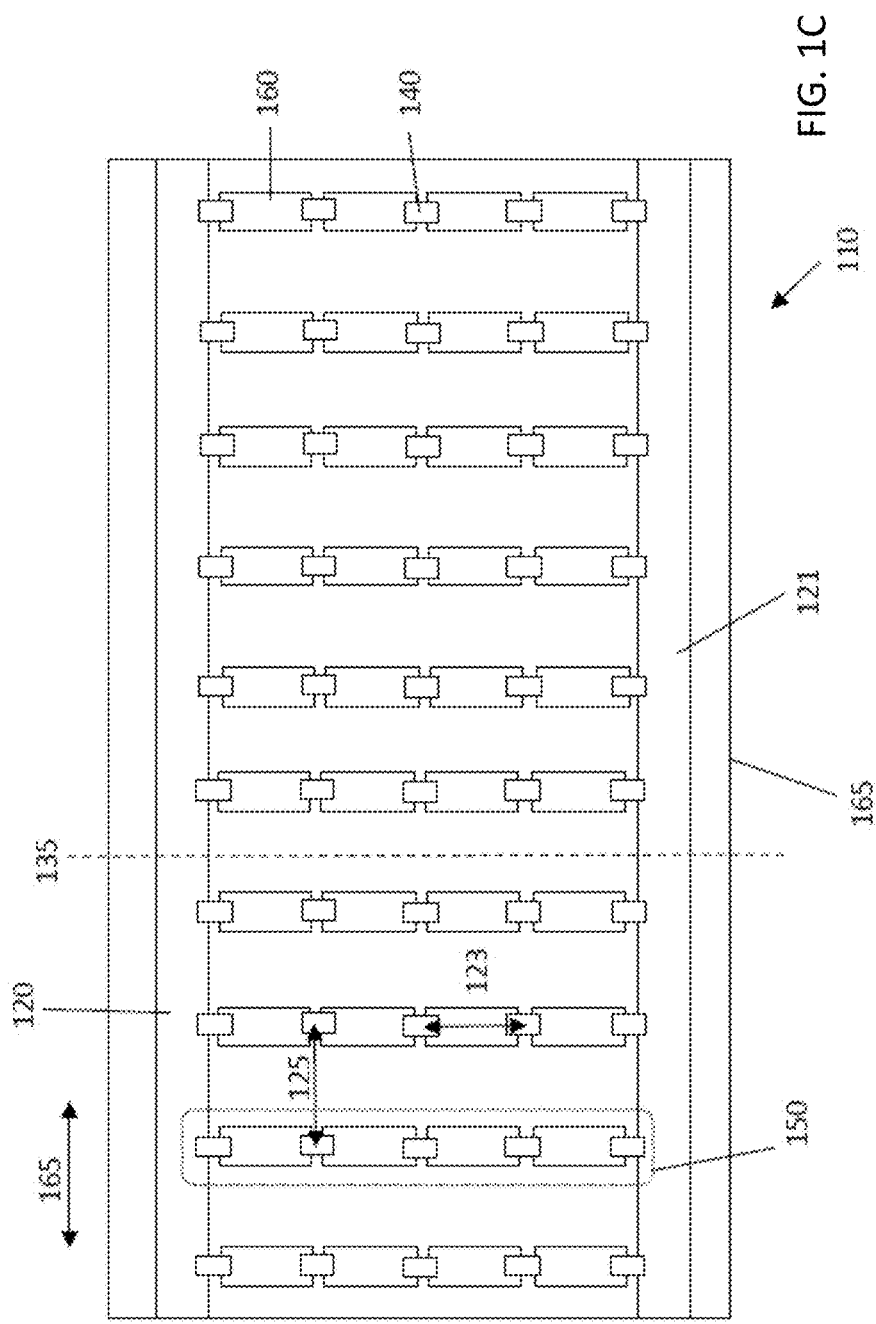

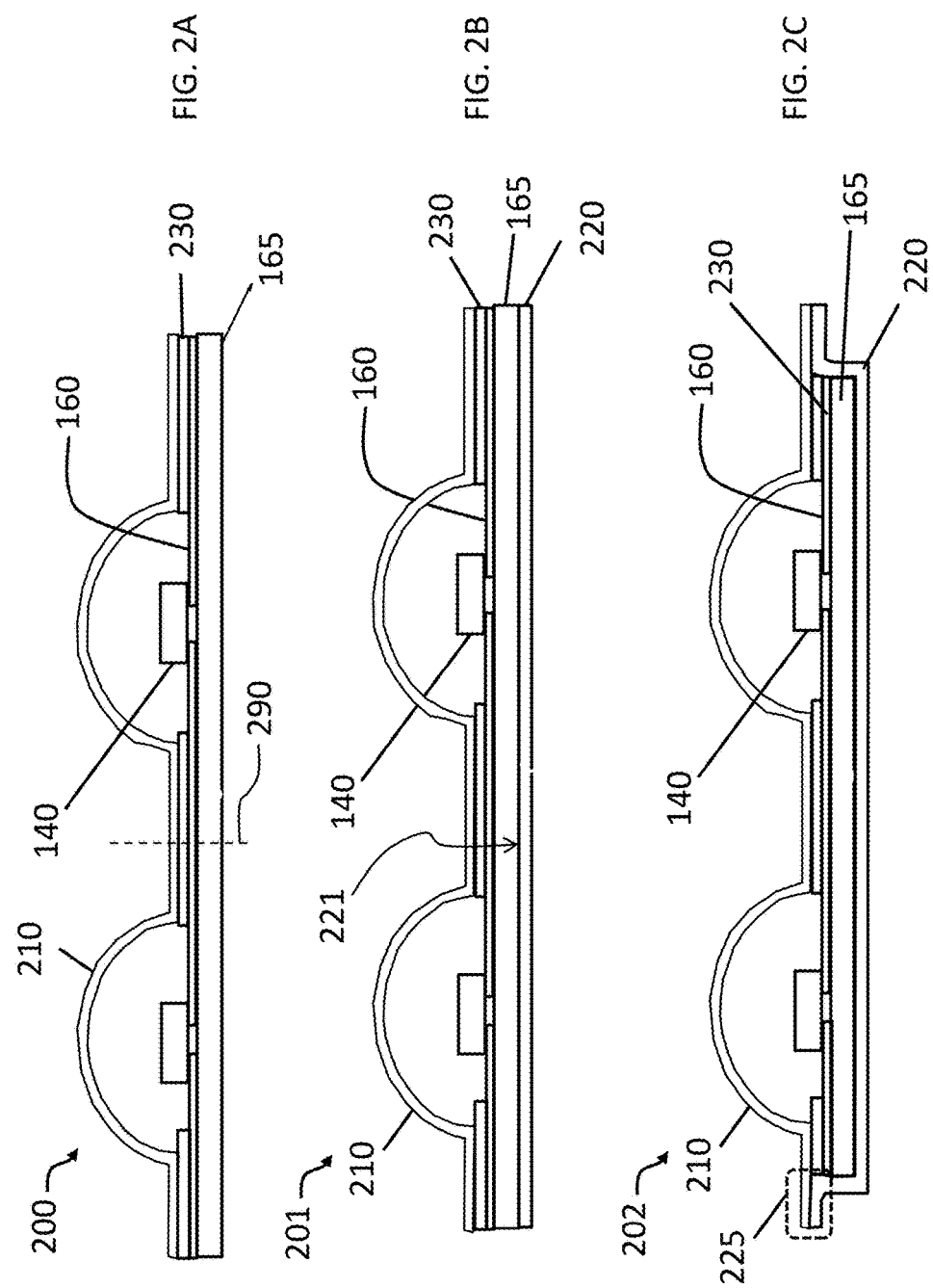

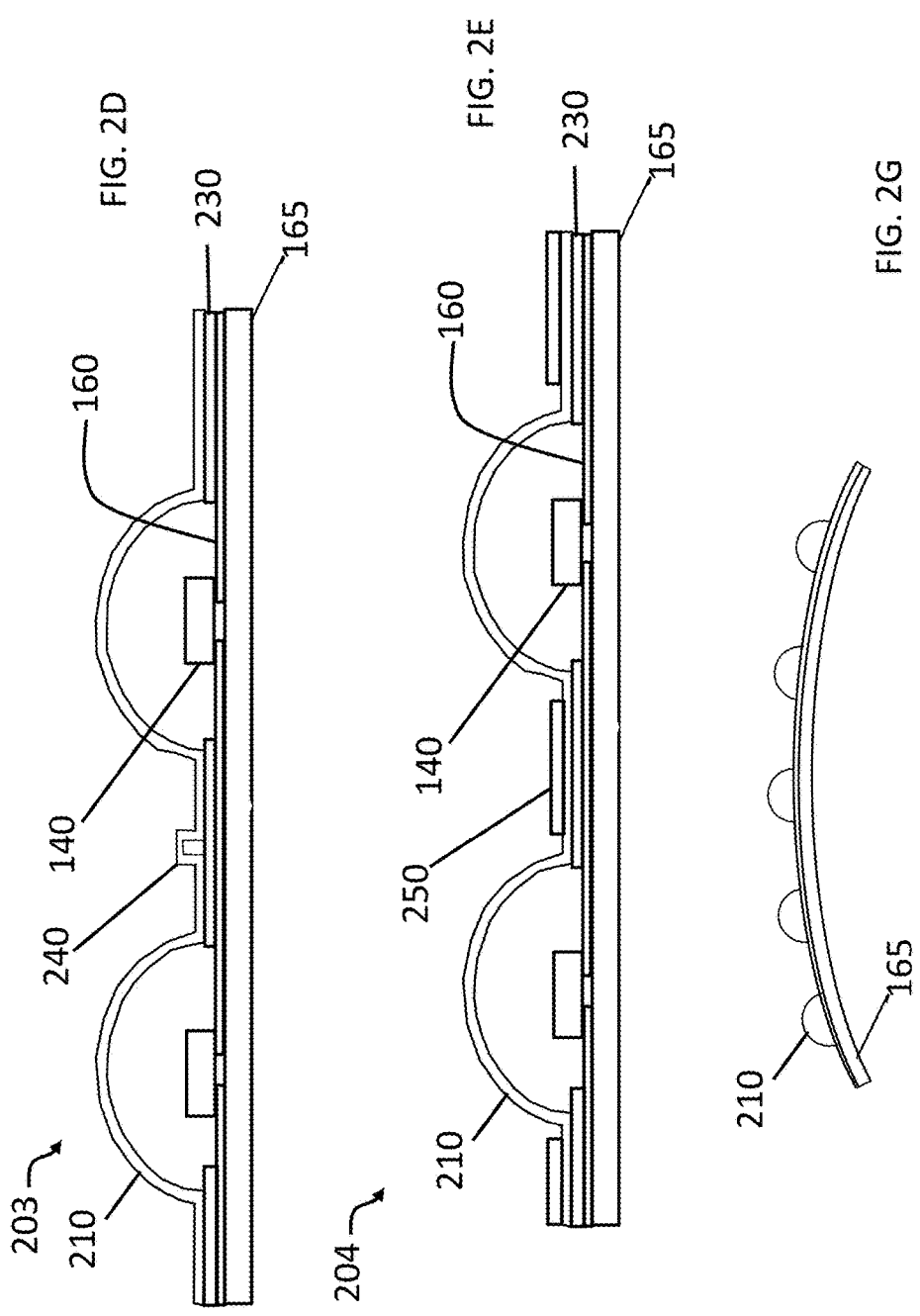

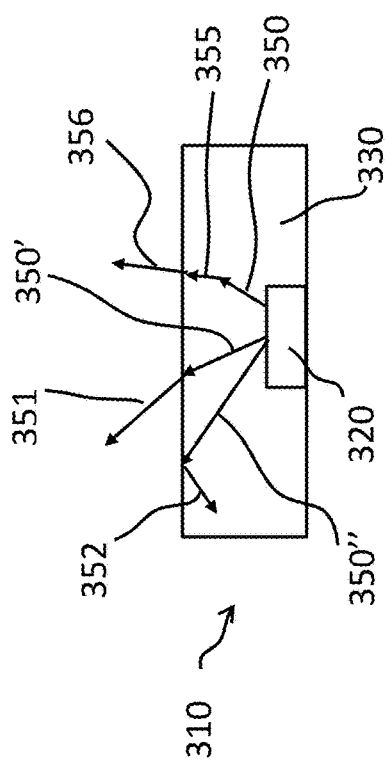
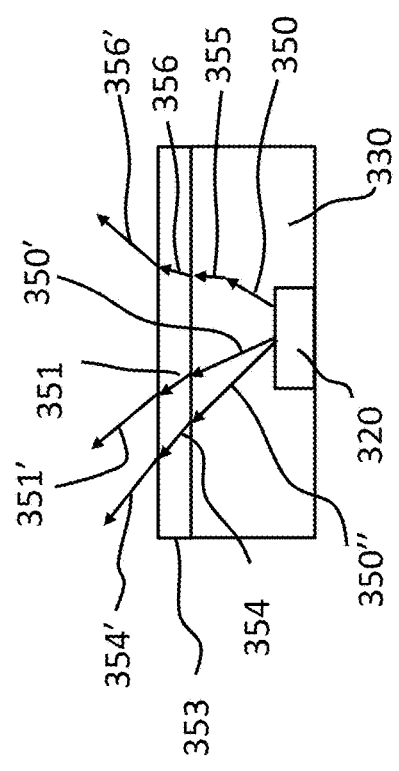

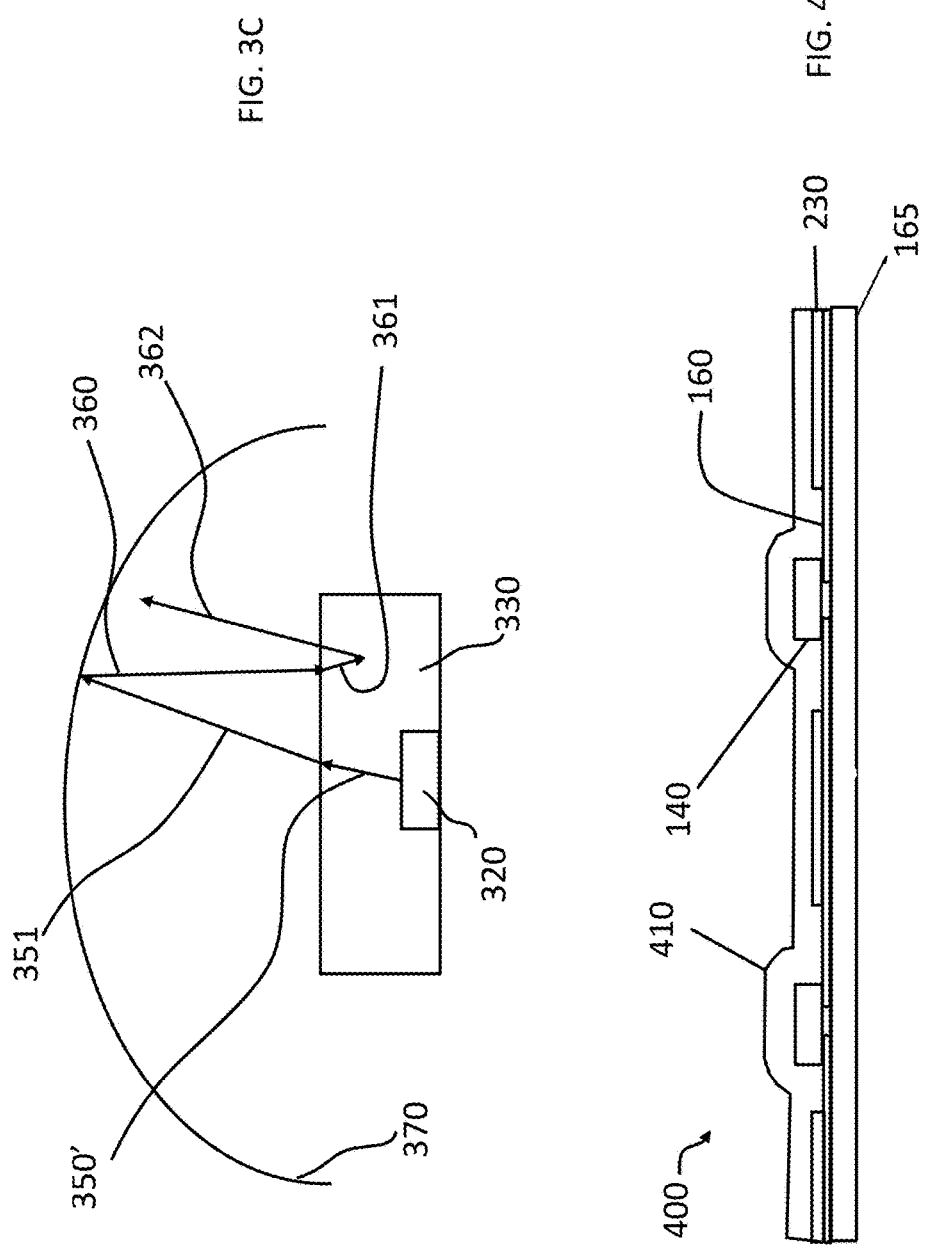

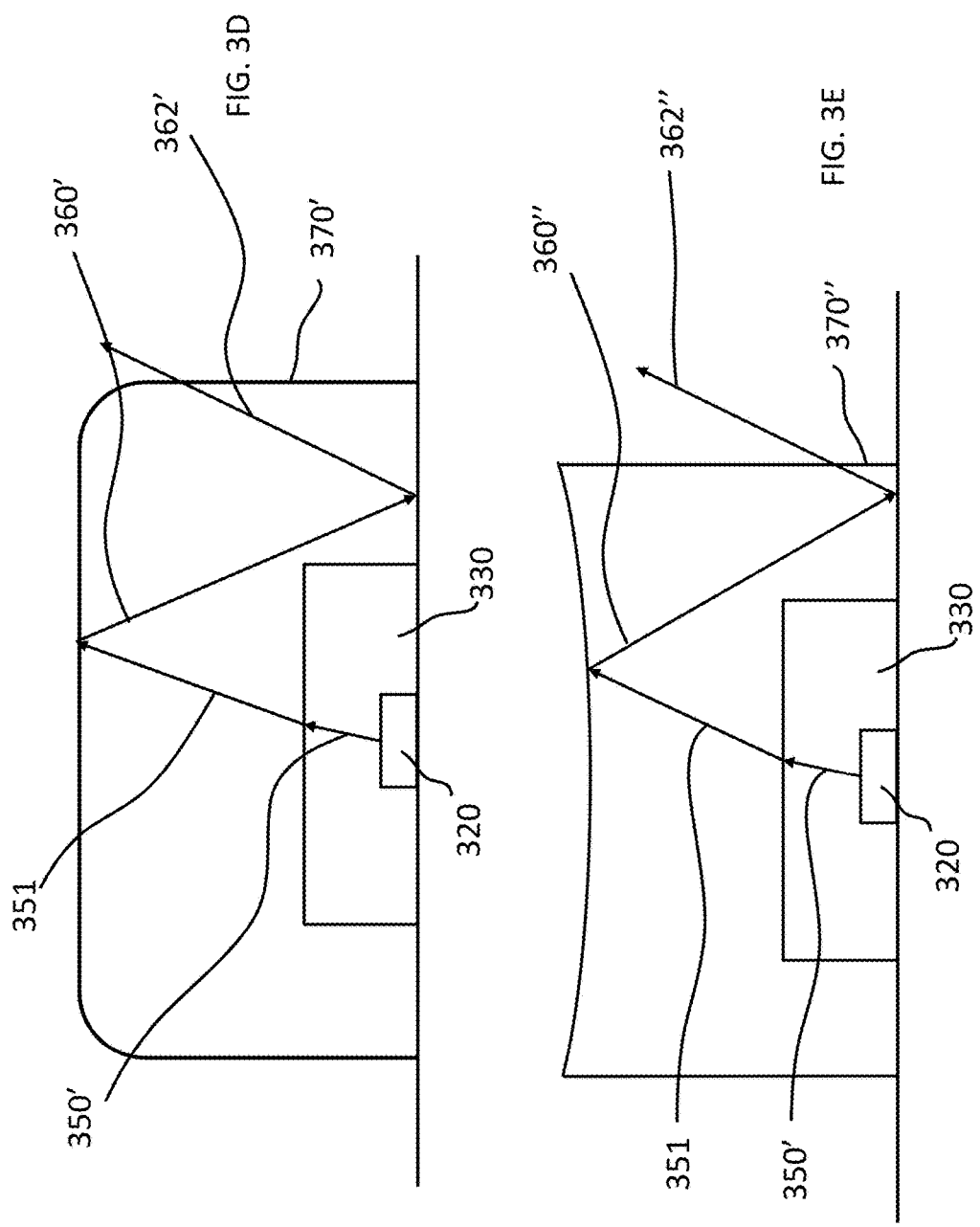

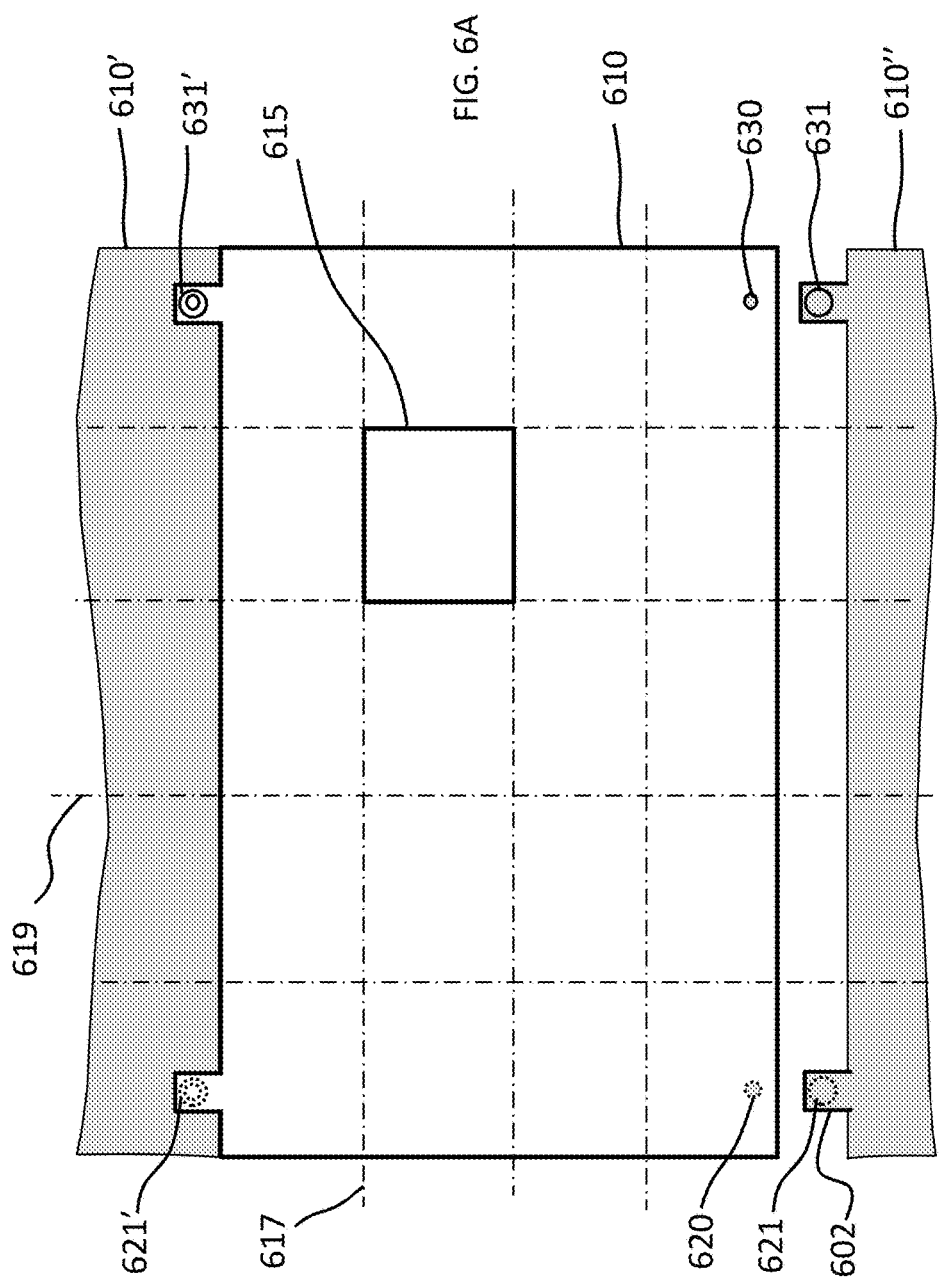

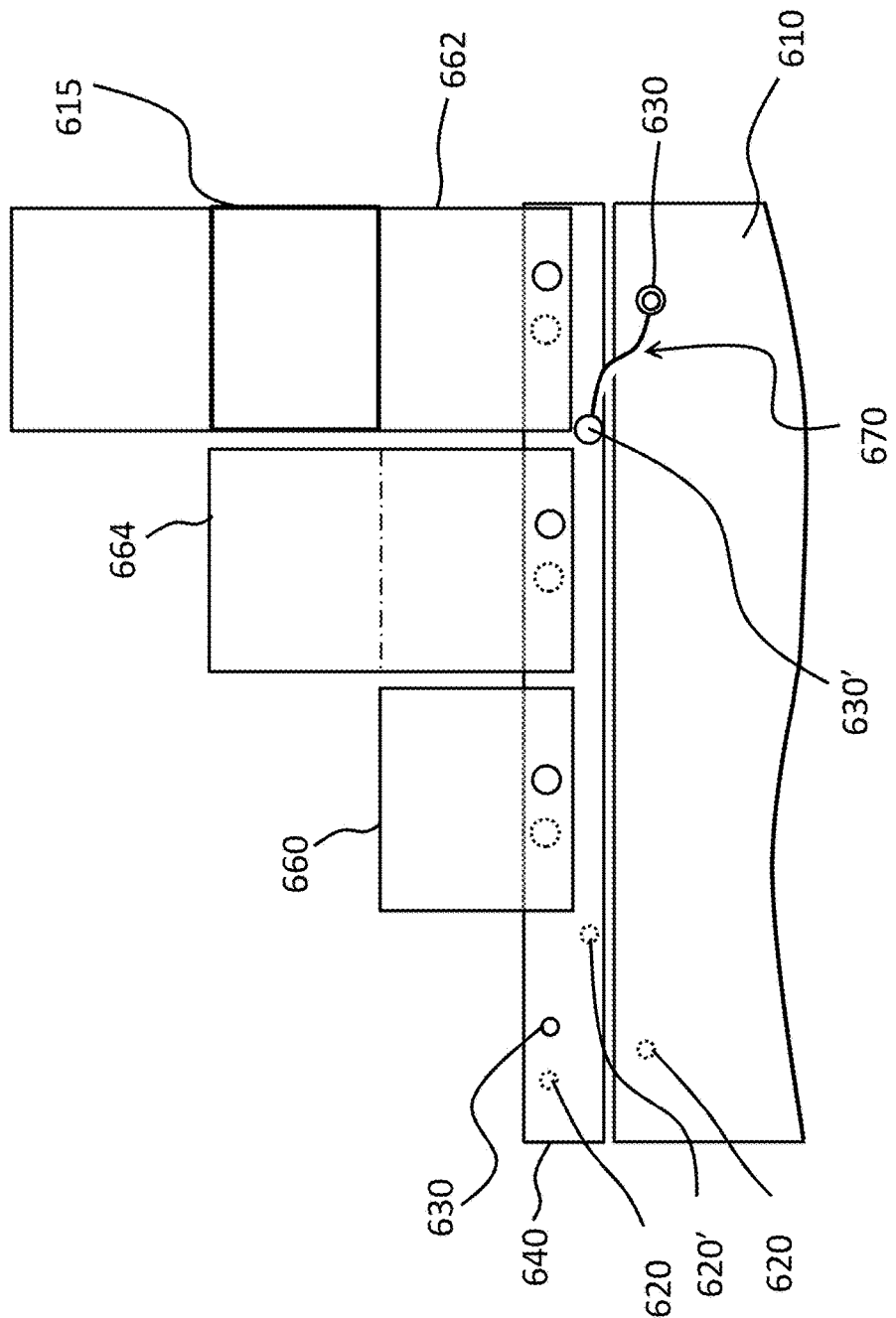

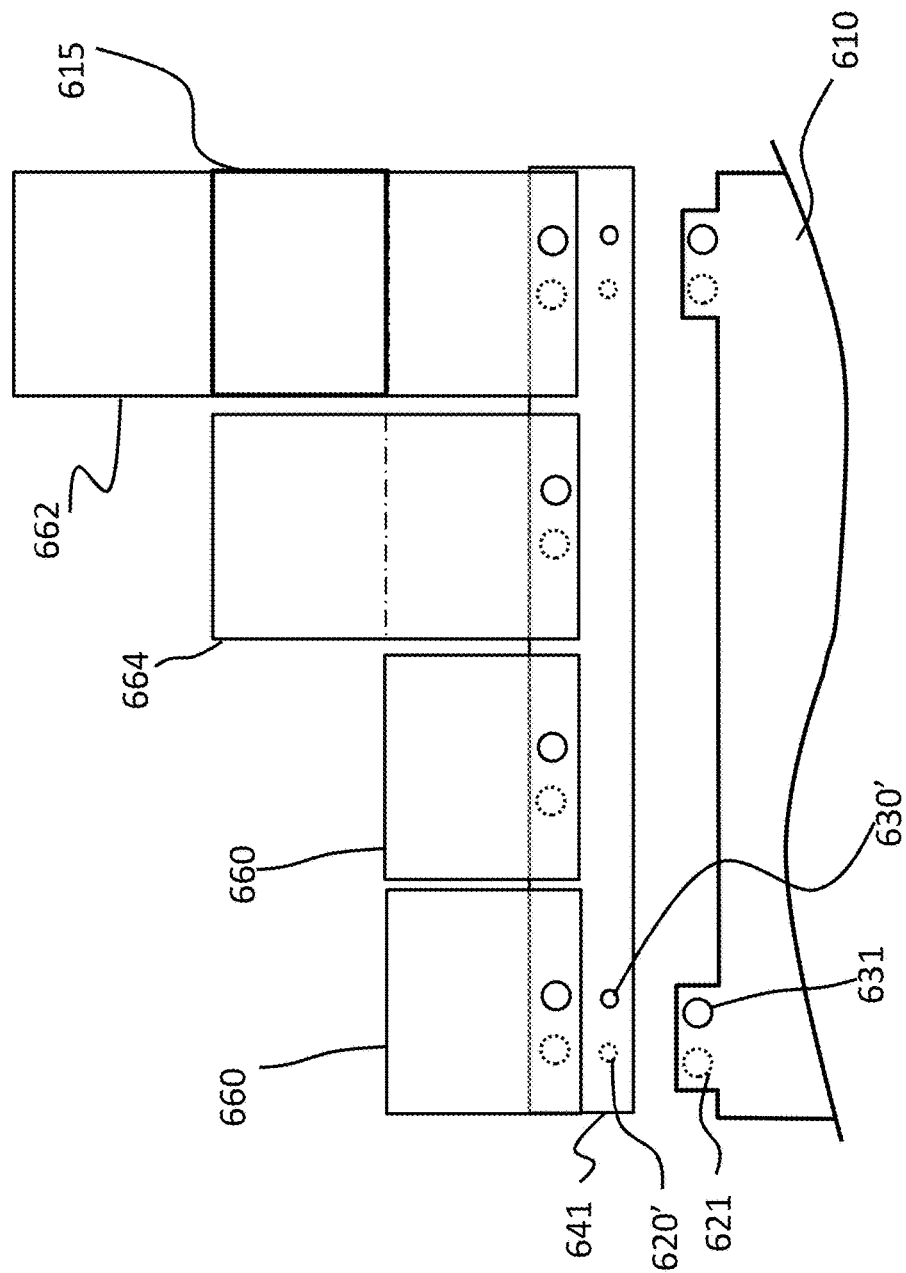

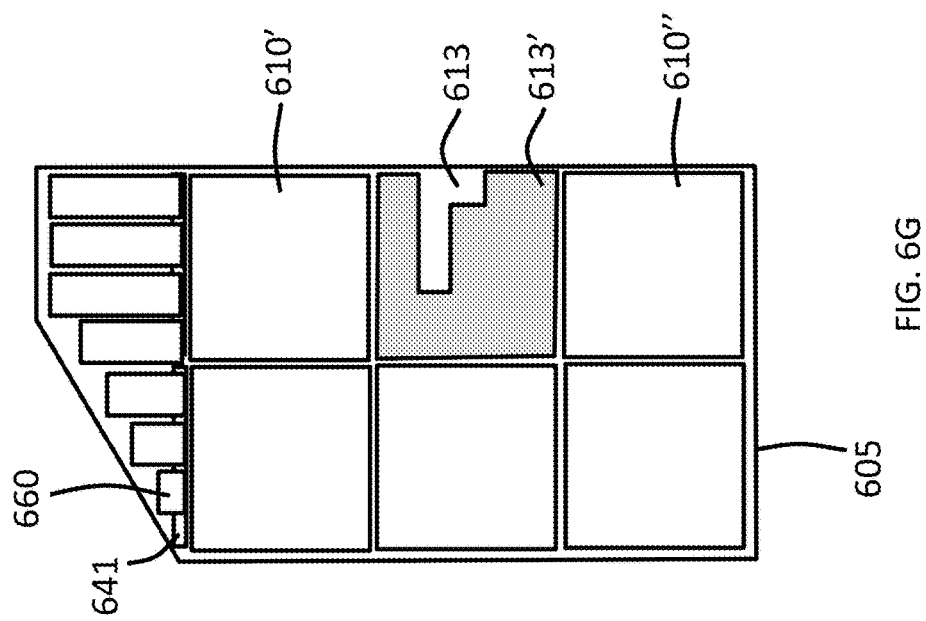
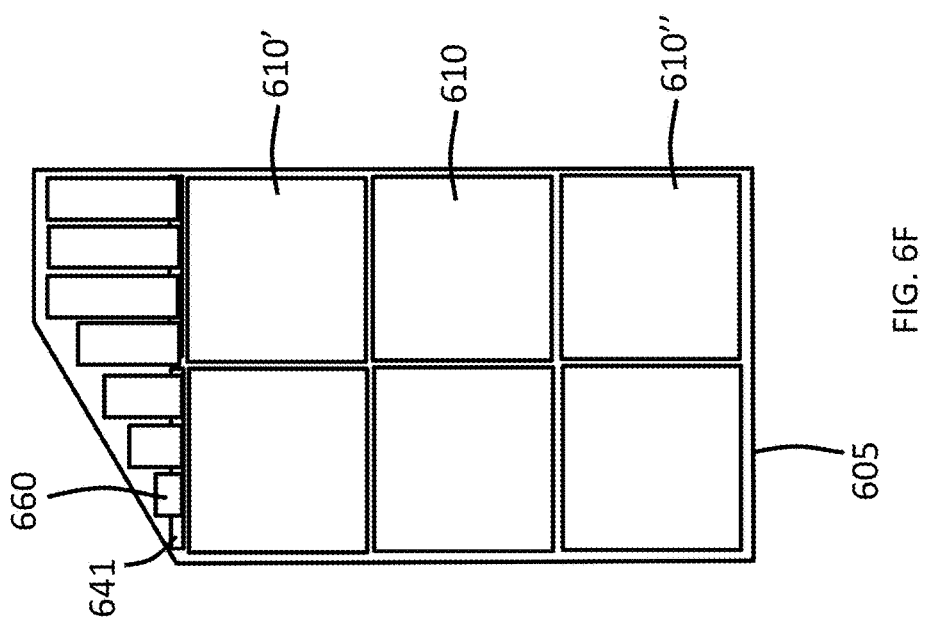

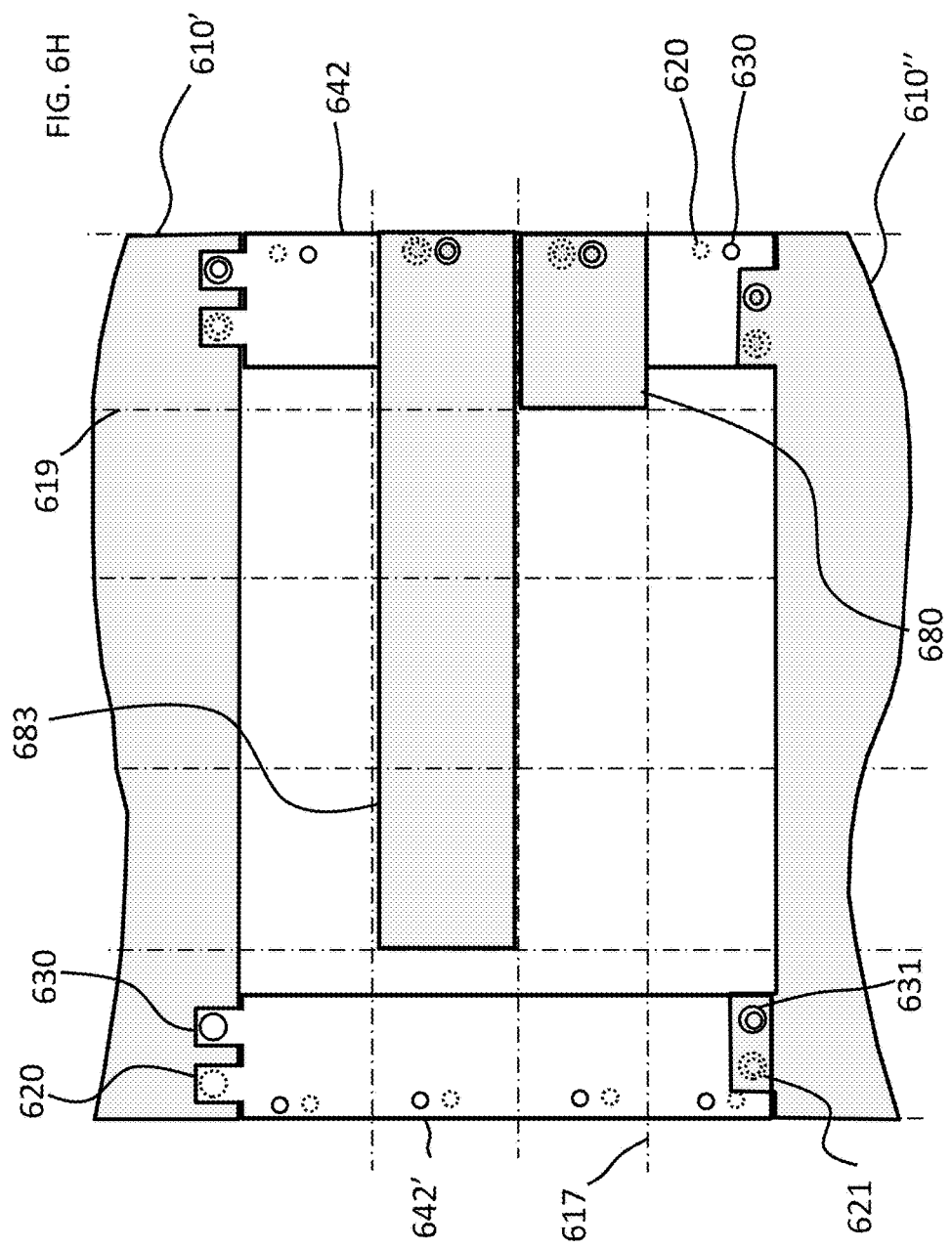

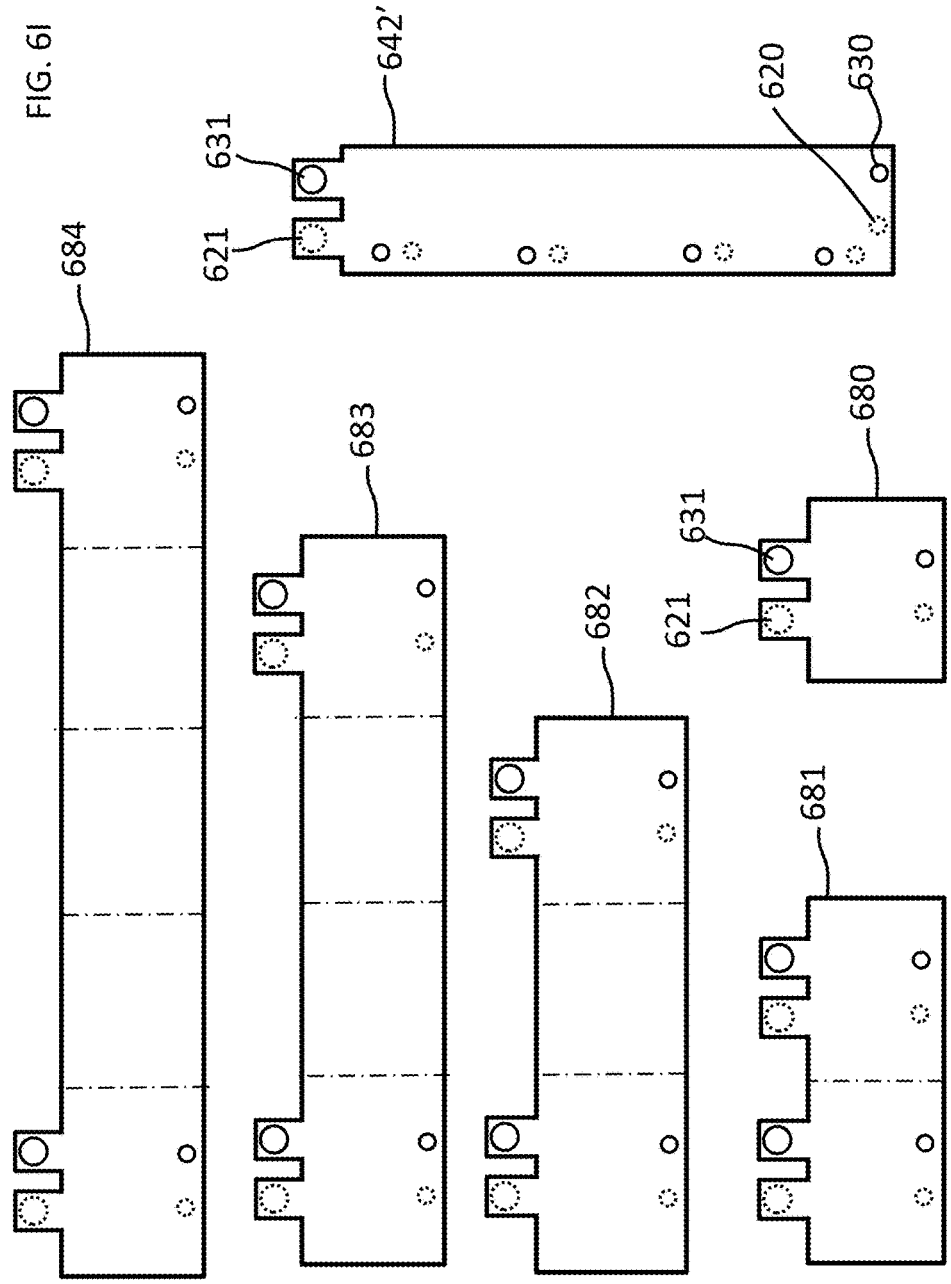

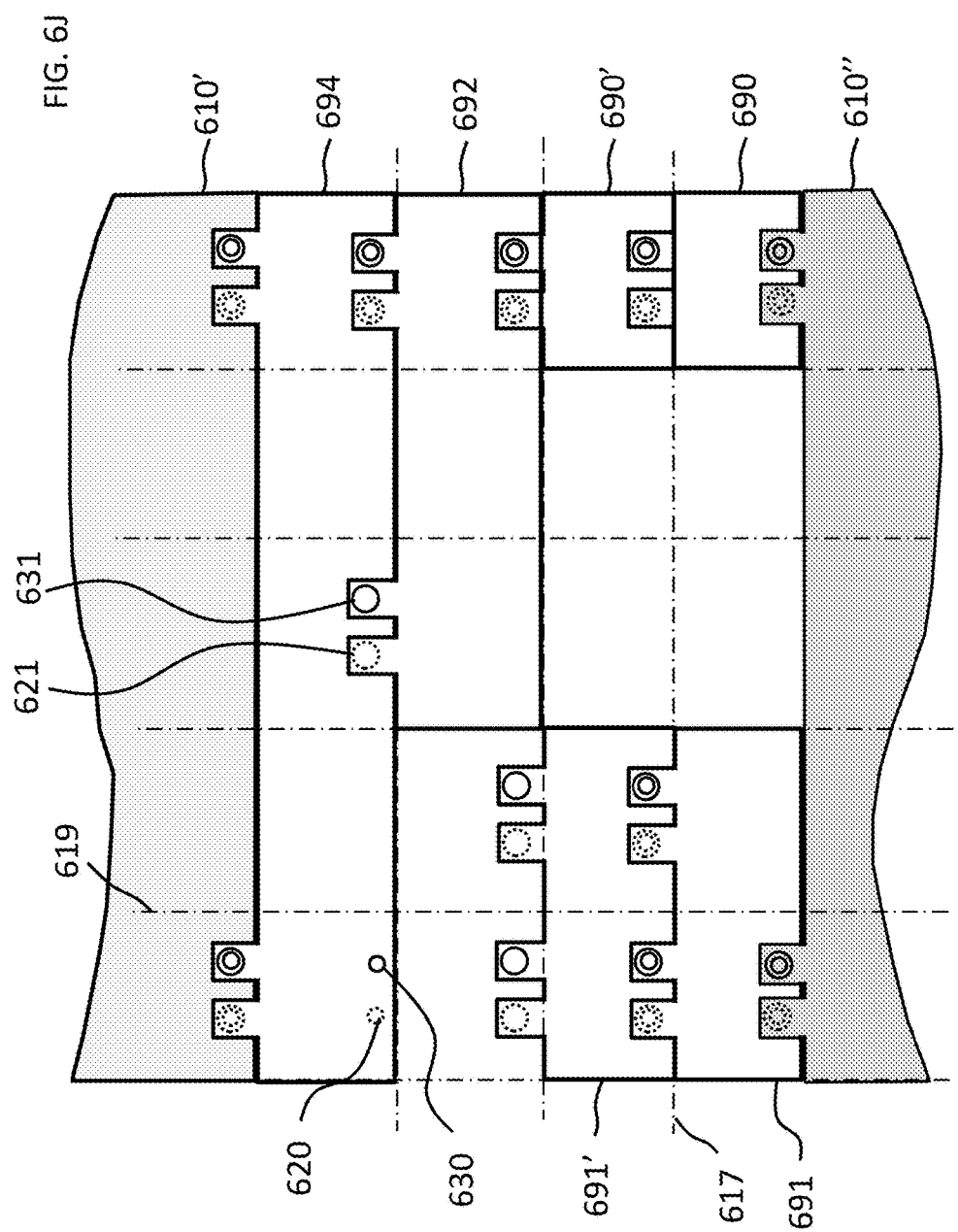

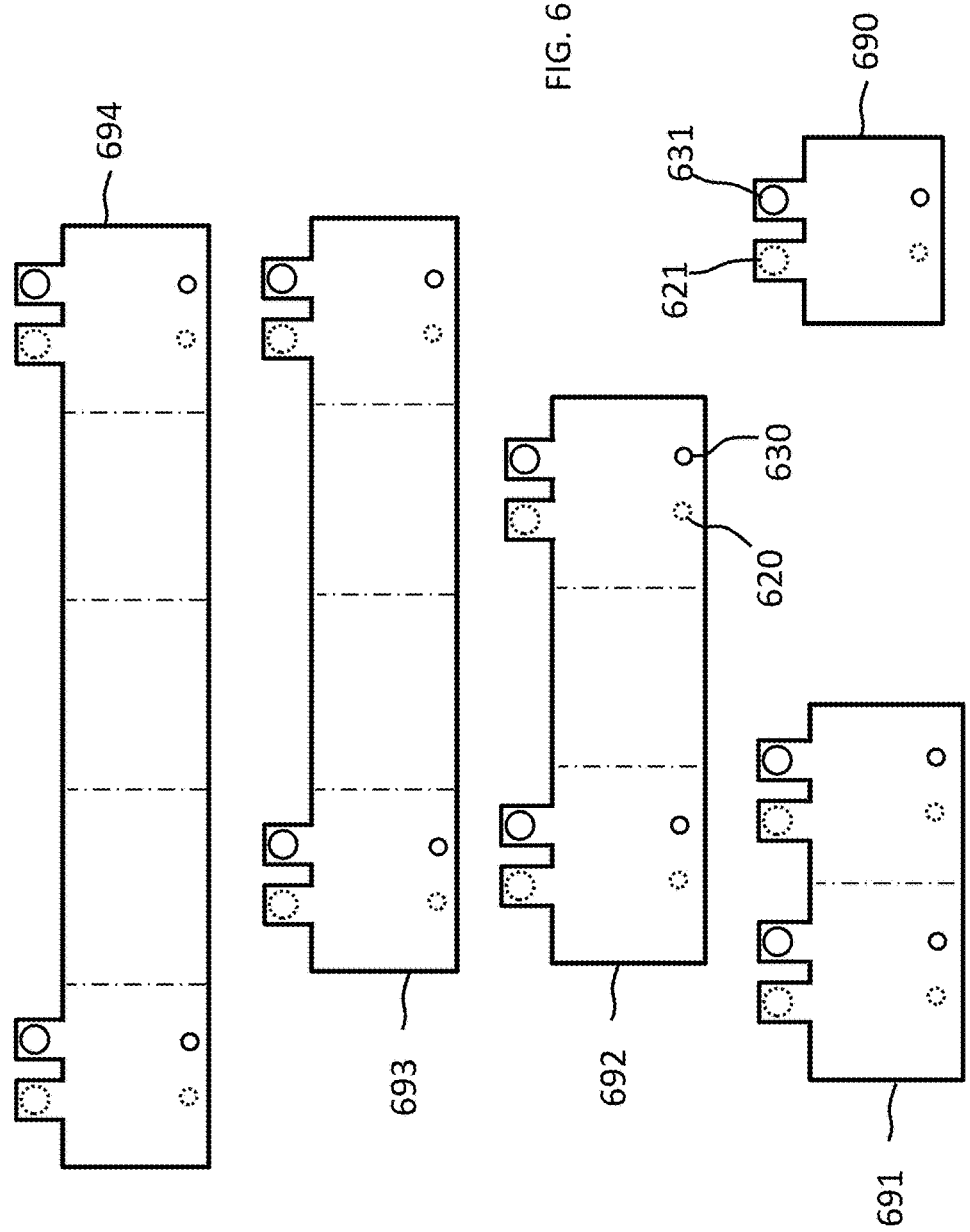

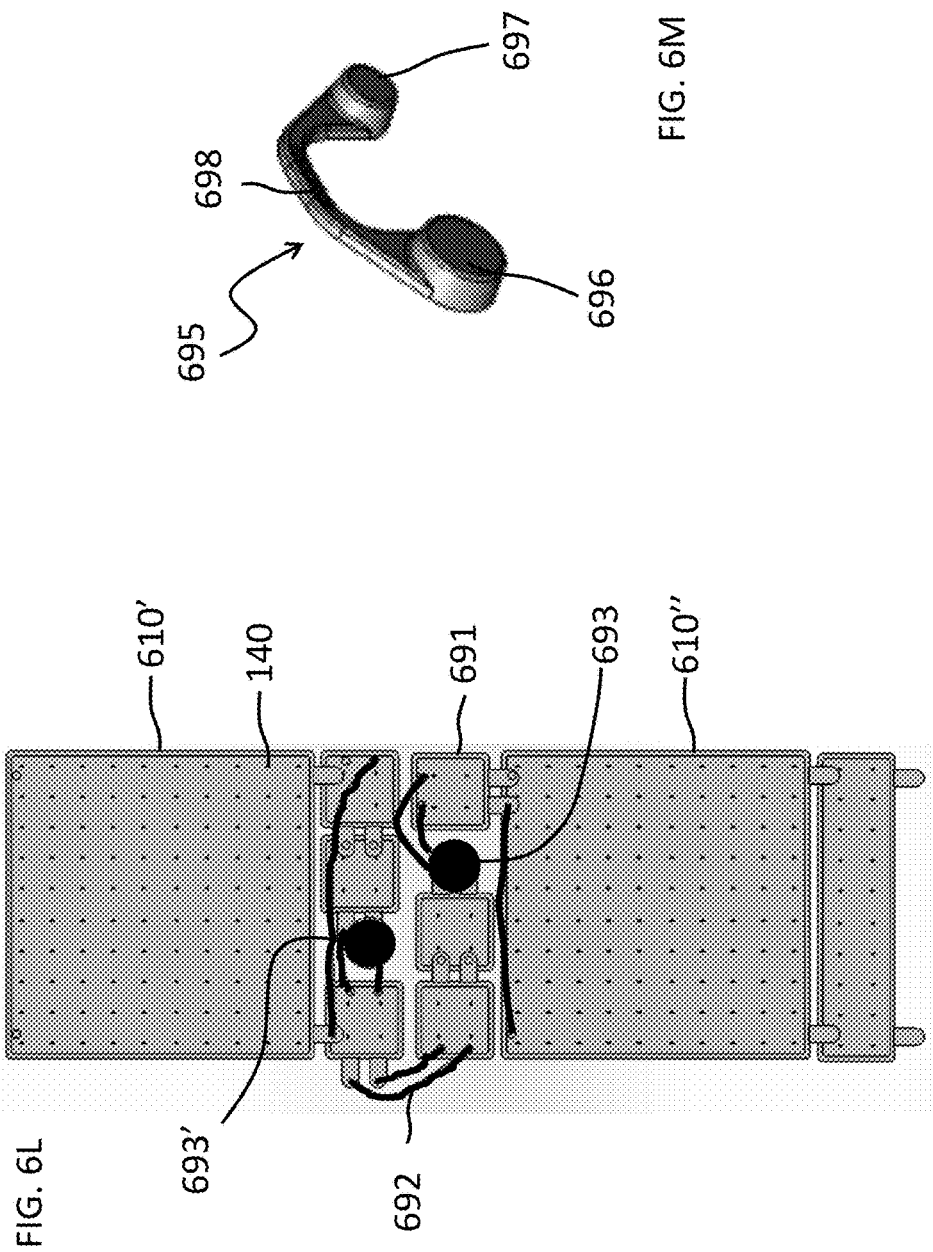

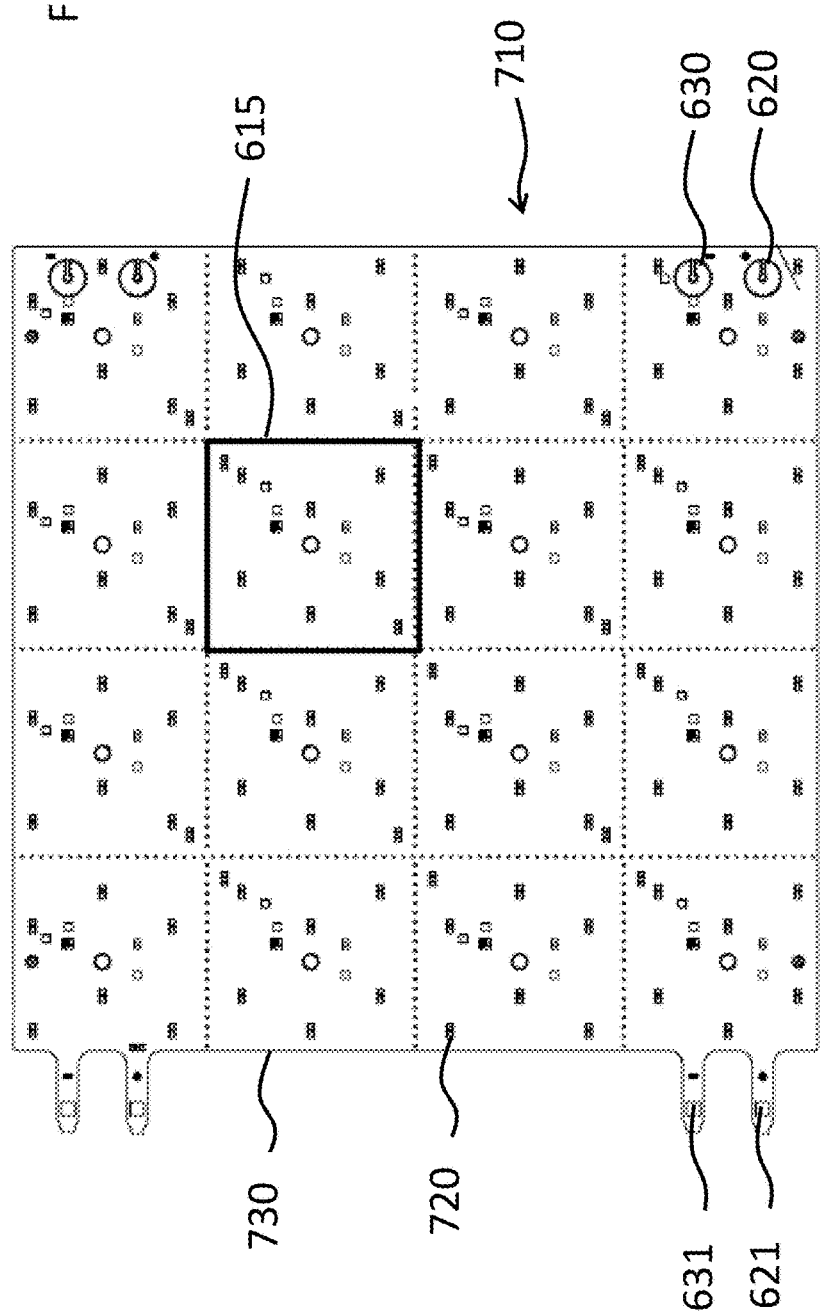

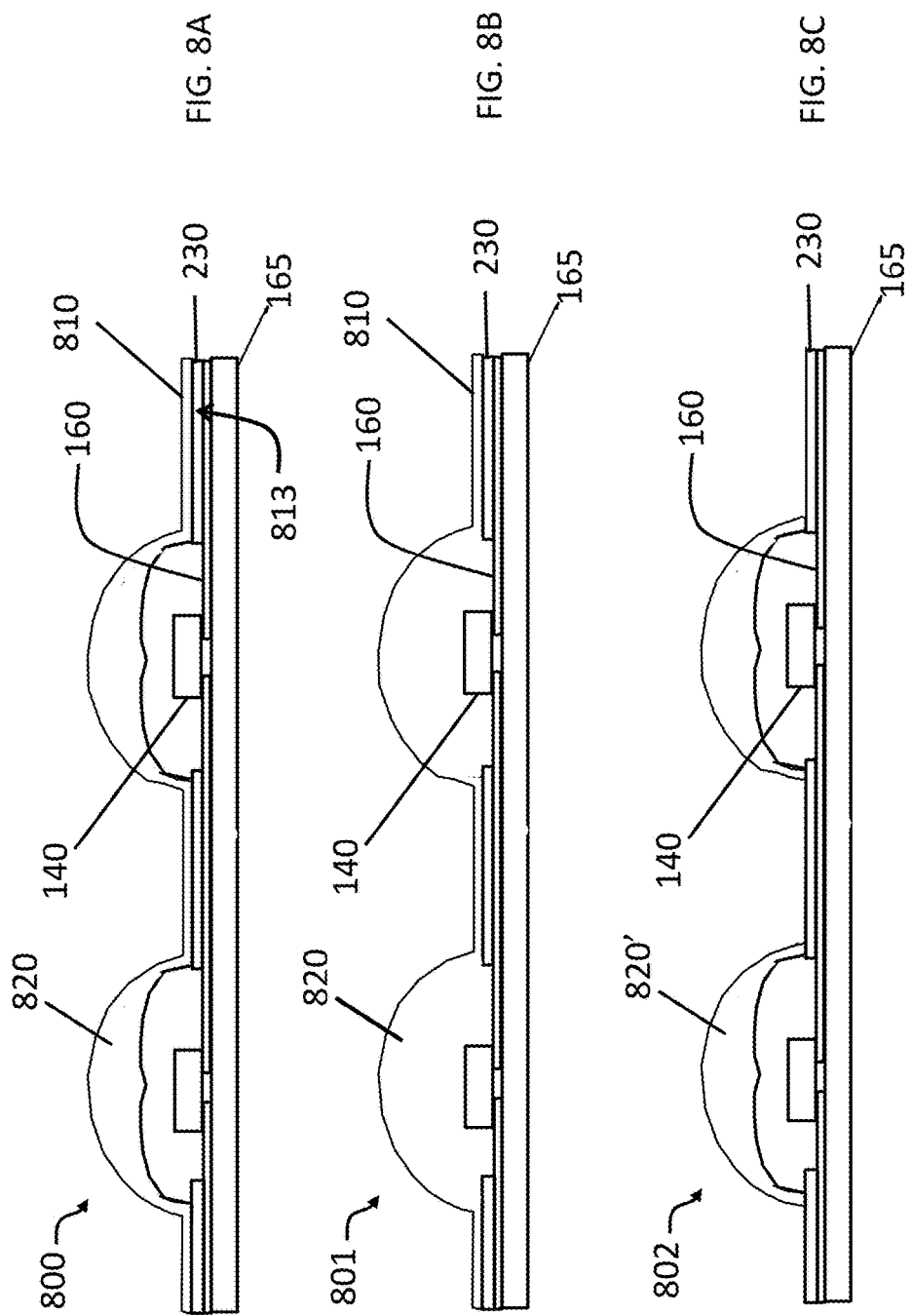

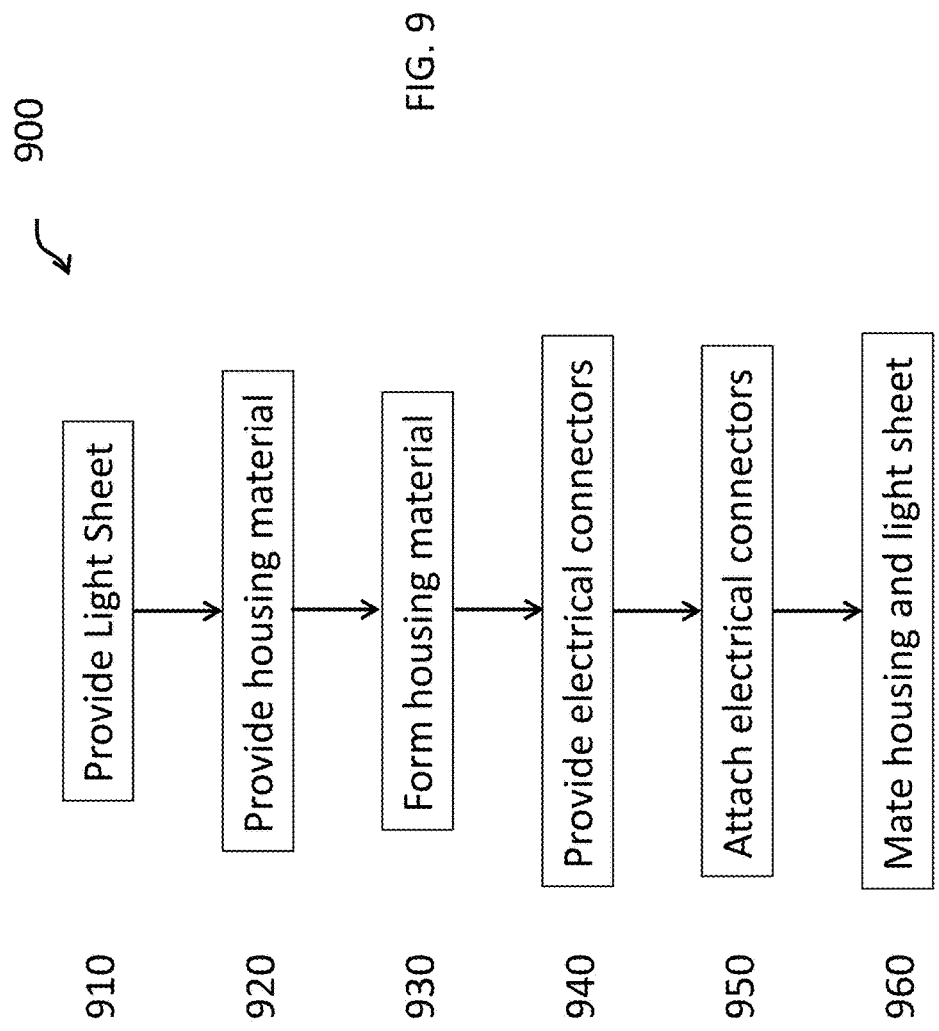

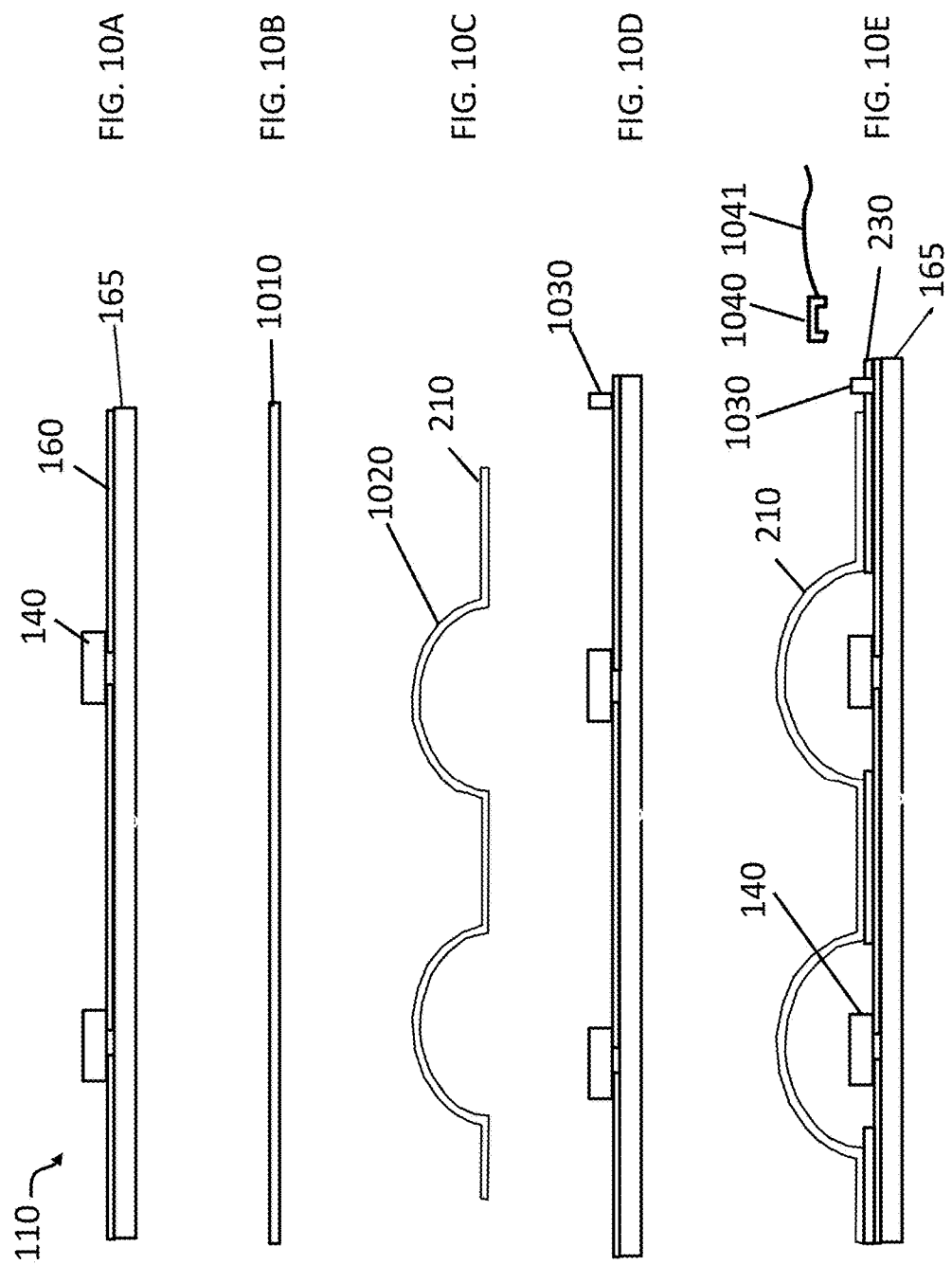

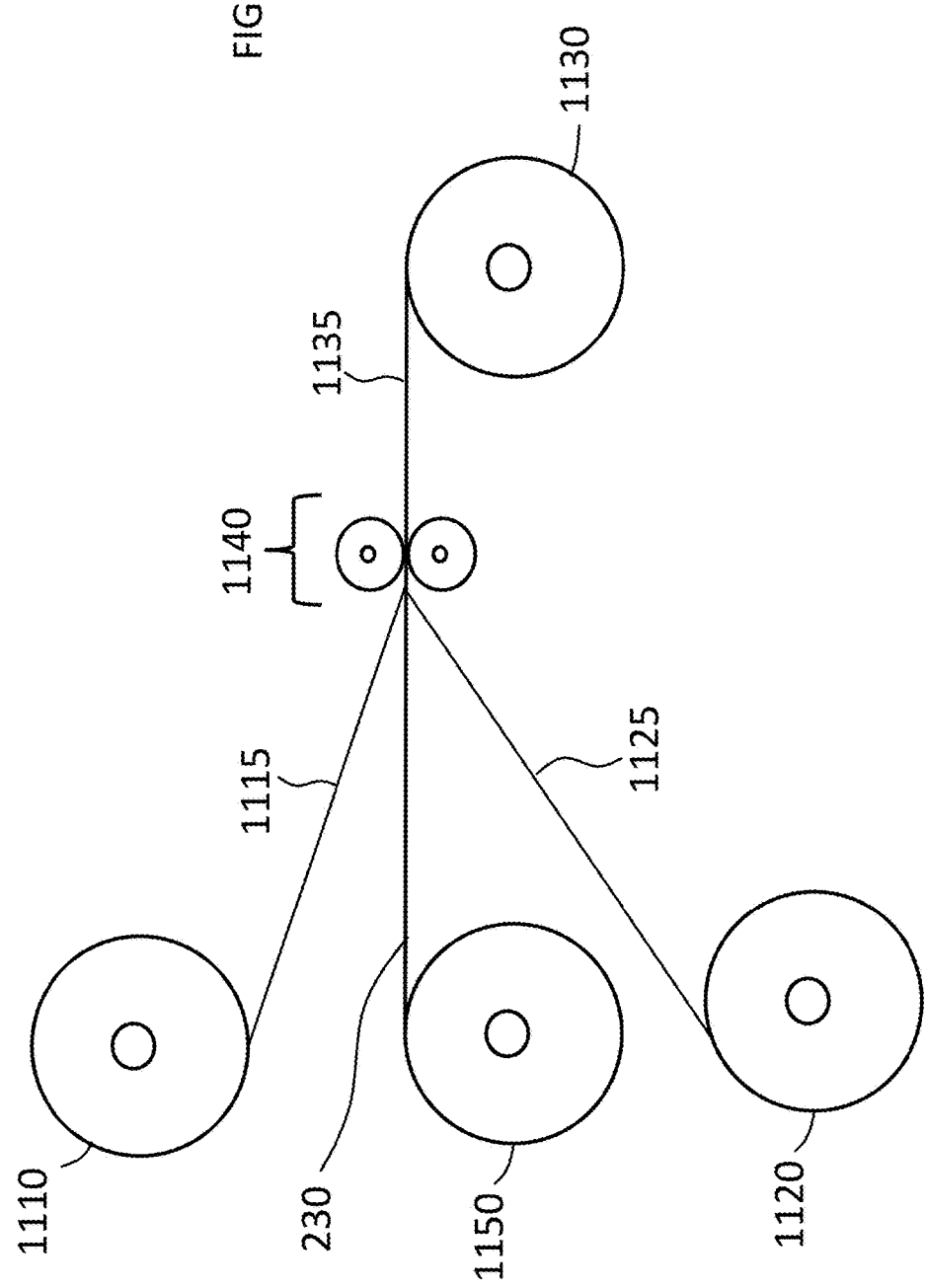

SEALED AND SEALABLE SCALABLE LIGHTING SYSTEMS INCORPORATING FLEXIBLE LIGHT SHEETS AND RELATED METHODS

RELATED APPLICATIONS

This application claims the benefit of and priority to U.S. Provisional Patent Application No. 62/409,586, filed Oct. 18, 2016, the entire disclosure of which is hereby incorporated herein by reference. This application is also a continuation-in-part of U.S. patent application Ser. No. 15/296,590, filed Oct. 18, 2016, which is a continuation of U.S. patent application Ser. No. 14/301,859, filed Jun. 11, 2014, which (i) claims the benefit of and priority to U.S. Provisional Patent Application No. 61/834,183, filed Jun. 12, 2013, the entire disclosure of which is hereby incorporated herein by reference, and (ii) is a continuation-in-part of U.S. patent application Ser. No. 14/195,175, filed on Mar. 3, 2014, which is a continuation of U.S. patent application Ser. No. 13/970,027, filed Aug. 19, 2013, now issued as U.S. Pat. No. 8,704,448, which is a continuation-in-part of U.S. patent application Ser. No. 13/799,807, filed Mar. 13, 2013, which claims the benefit of and priority to U.S. Provisional Patent Application No. 61/697,411, filed Sep. 6, 2012, the entire disclosure of each of which is hereby incorporated herein by reference.

FIELD OF THE INVENTION

In various embodiments, the present invention generally relates to electronic devices, and more specifically to array-based lighting devices.

BACKGROUND

Solid-state lighting is an attractive alternative to incandescent and fluorescent lighting systems for a wide range of lighting applications, and in particular for exterior applications, because of its relatively higher robustness, and long life. However, conventional solid-state lighting systems featuring light-emitting diodes (LEDs) have a number of limitations related to thermal management of heat generated by the LEDs that may complicate the fabrication of sealed, weatherproof or waterproof systems. Because of the sealing requirements, traditional exterior LED lighting systems typically have a rigid structure and a fixed size, making it difficult to illuminate arbitrarily sized areas. For example, back lighting, either for decorative or signage purposes, is widely used in exterior applications, and in most cases, the size and shape of the area to be illuminated is not a perfect fit for traditional exterior lighting systems. Such backlighting systems may have very large sizes, for example hundreds of feet on a side, may have odd shapes, such as curve or non-right-angle joints or may not be flat, but have a three-dimensional shape. The result is uneven illumination, for example relatively darker regions in between each illumination unit and at the edges of the area, which cannot effectively be illuminated by fixed size systems or relatively brighter areas associated with each illumination unit in the system.

Traditionally the issue of uneven illumination is addressed by increasing the depth of the lighting system and/or reducing the transmittance of the surface to be illuminated. While both of these approaches do address the issue of uneven illumination, these solutions come with increased cost, reduced efficiency and undesirable aesthetics.

In many lighting applications it is desirable to have lighting systems or luminaires that are thin, low-volume, and lightweight in order to meet certain building requirements, aesthetic design requirements or so that the lighting system is unobtrusive. In other applications it is desirable to be able to conform the illumination source to a curved surface. Increasing the depth of the system to achieve acceptable intensity uniformity is at odds with these needs and also increases the cost of the system because more material is required for the system itself as well as the mounting hardware. Reducing the transmittance of the illuminated surface also reduces the system efficiency.

In both cases, the actual flux from the LEDs typically must be increased to achieve the desired intensity of the illuminated surface, increasing the up-front and operating costs, as well as adding more cost and complexity for thermal management of the heat generated by the additional LEDs. In large measure the heat from LEDs is generally extracted by conduction, which typically requires relatively large amounts of material with a high thermal conductivity, such as metal core printed circuit boards (MCPCBs), heat sinks, and in some cases active (e.g., forced-air) cooling. Such thermal-management solutions are significantly more complicated when required to be located within a sealed system and are typically not sufficiently flexible to permit conforming to curved surfaces. Furthermore, they take up significantly more space than the LEDs themselves, resulting in increased size and volume of exterior LED-based lighting systems. In addition to higher cost, exterior LED lighting systems may have potentially reduced reliability and operational lifetime resulting from higher LED junction temperatures that may exist in sealed systems.

In view of the foregoing, a need exists for systems and techniques enabling the low-cost design and manufacture of sealed and sealable compact, reliable, high-brightness lighting systems able to produce uniform illumination over arbitrarily sized areas.

SUMMARY

In accordance with certain embodiments of the present invention, lighting systems incorporate flexible light sheets having light-emitting elements (e.g., light-emitting diodes such as packaged light-emitting diodes and bare-die light-emitting diodes) thereon. The light sheets may be utilized to fabricate a collection of assemblable, differently shaped illumination elements that may be assembled and electrically connected together in order to illuminate a two-dimensional area having an arbitrary shape. In various embodiments, the shape of each illumination element is defined by a one-dimensional or two-dimensional contiguous arrangement of "illumination unit cells," each of which may encompass a minimum set of light-emitting elements (e.g., one or more light-emitting strings) such that the unit cell emits light at a predetermined luminous flux density. In this manner, since each of the illumination elements is composed of a number of the unit cells, each illumination element also emits light at approximately the same predetermined luminous flux density over its entire area. Thus, in various embodiments, each of the illumination elements emits light at a luminous flux density within ±10%, within ±5%, or even within ±2% of each of the other illumination elements, thereby enabling the illumination of arbitrary areas with a high degree of uniformity. Since each of the illumination elements has a different shape, one or more of each of the illumination elements may be assembled into a shape approximately conforming to the desired area for illumination. (As utilized herein, a shape "approximately conforming to" a desired area has an area within ±10%, within ±5%, or even within ±2% of the area to be illuminated; in various embodiments, the shape may conform to the area to within the geometric limits imposed by the shape and size of the illumination unit cells utilized to form the illumination units (for example, curved edges of an area to be illuminated may be approximated by angular edges in embodiments in which the illumination unit cells are polygons such as squares or rectangles).)

In various embodiments, top and/or bottom housings, either or both of which may be polymeric, may be utilized to seal at least portions of the light sheets and form sealed regions that may be water-resistant or waterproof. The housings may also be shaped to reflect, diffuse, and/or shape the light emitted by the light-emitting elements. The housings may even define structural features such as protruding ribs for mechanical stability. While most, if not all, of the light-emitting elements of the light sheets are preferably safely located within the sealed regions, the lighting systems typically incorporate conductive couplings that extend out of the sealed regions (without disrupting the seal over the light-emitting elements) and enable the provision of power from an external power source to the light-emitting elements. Lighting systems in accordance with embodiments of the invention may thus be advantageously deployed in harsher and/or moist environments where exposure to dirt, dust, moisture, etc. is possible or frequent. The lighting systems may be fabricated in bulk by, e.g., roll-to-roll processes and even separated from larger "sheets" of the lighting device components, preferably without disrupting the seal on and/or around each individual lighting system (or "partial" lighting system). As used herein, a "sealed region" refers to a portion of a light sheet or lighting system having a periphery at least partially defined by a seal between two housings, a housing and the light sheet, and/or a housing, light sheet, and/or another sealing material (e.g., a transparent material disposed between the light sheet and a housing. A sealed region may also include a portion of a light sheet coated with a housing, i.e., the housing may be a coating or sealant material conformally or non-conformally coating (and thus directly contacting) at least some portions of the light sheet (and, e.g., light-emitting elements, conductive traces, etc. on the light sheet) thereunder. Embodiments of the invention may incorporate aspects and details disclosed in U.S. patent application Ser. No. 14/301,859, filed on Jun. 11, 2014, the entire disclosure of which is incorporated by reference herein.

Various embodiments of the present invention feature a sealed thin light sheet that does not require any additional heat sinking or thermal management. In various embodiments, the light sheet may also be flexible and may be curved or folded to achieve one or more specific characteristics or attributes, for example, to permit manufacture of a compact, foldable system and/or to achieve a specific light-distribution pattern. In various embodiments of the present invention, the light sheet typically includes or consists essentially of an array of light-emitting elements (LEEs) electrically coupled by conductive elements formed on a flexible substrate, for example as described in U.S. patent application Ser. No. 13/799,807, filed Mar. 13, 2013 (the '807 application), or U.S. patent application Ser. No. 13/970,027, filed Aug. 19, 2013 (the '027 application), the entire disclosure of each of which is herein hereby incorporated by reference.

In an aspect, embodiments of the invention feature a system of lighting components for illuminating an arbitrary two-dimensional area. The system includes, consists essentially of, or consists of a plurality of assemblable illumination elements. Each illumination element includes, consists essentially of, or consists of a substrate, first and second spaced-apart power conductors disposed over the substrate, a plurality of light-emitting elements that are spaced apart and interconnected into one or more light-emitting strings, and one or more electrical connectors each electrically coupled to at least one of the first or second power conductors. Each light-emitting string (i) includes a control element disposed over the substrate and electrically connected to the light-emitting elements in the light-emitting string and configured to provide a predetermined current to the light-emitting elements in the light-emitting string, (ii) includes two or more of the light-emitting elements, (iii) has a first end electrically connected to the first power conductor, and (iv) has a second end electrically connected to the second power conductor. Each illumination element has a different shape defined by a one-dimensional or two-dimensional contiguous arrangement of illumination unit cells. Each illumination unit cell (i) is polygonal, (ii) encompasses at least one light-emitting string, and (ii) emits light at a predetermined luminous flux density, such that each of the illumination elements emits light at approximately the predetermined luminous flux density.

Embodiments of the invention may include one or more of the following in any of a variety of combinations. The predetermined luminous flux density of each illumination element may be within ±10%, ±5%, or ±2% of the predetermined luminous flux density of any other illumination element. One or more of the illumination elements may be flexible. The system may include a power supply electrically coupled to the one or more electrical connectors of a first illumination element, and power from the power supply may be supplied to one or more other illumination elements via the first illumination element. The power supply may be configured to provide a substantially constant voltage to the illumination elements. The power supply may be configured to adjust a light output of at least one illumination element by pulse-width-modulating a voltage or a current of the power supply.

The system may include a power-distribution element. The power-distribution element may include, consist essentially of, or consist of one or more first connector sets and one or more second connection point sets. The one or more first connector sets may each include, consist essentially of, or consist of one or more first electrical connectors each configured for connection to an electrical connector of an illumination element. The one or more second connection point sets may each include, consist essentially of, or consist of one or more second electrical connection points for receiving power from an external source of power. Any of the second electrical connection points may be a connection point for a bare wire or a flying lead or may be a connector analogous to one or more of the electrical connectors found on the illumination elements. Power received via the one or more second connection point sets may be distributed, on the power-distribution element, to the one or more first connector sets. The system may include a power supply, and the power supply may be the external source of power for the power-distribution element. The power supply may be configured to provide a substantially constant voltage to the illumination elements. The power supply may be configured to adjust a light output of at least one illumination element by pulse-width-modulating a voltage or a current of the power supply. The power supply may be directly coupled to the one or more second connection point sets (e.g., via a connection such as an electrical connector, a wire, or other connection). (In embodiments in which the power supply is "indirectly coupled" to the one or more second connection point sets, the power supply is directly coupled to a different element that is directly coupled to the one or more second connection point sets, such as one of the illumination elements, and power from the power supply flows through that different element to the power-distribution element.) The one or more second connection point sets may be directly coupled to one or more of the illumination elements, and power may be supplied to the power-distribution element via the one or more of the illumination elements. The power-distribution element may contain no light-emitting elements thereon. The power-distribution element may include a substrate, and the substrate may include, consist essentially of, or consist of the same substrate as that of one or more of the illumination elements. The power-distribution element may be flexible.

When the plurality of illumination elements are positioned adjacent to each other and connected together via the electrical connectors, across the plurality of illumination elements, the light-emitting elements may be spaced apart at a substantially constant first pitch in a first direction, and the first pitch may be maintained between and among the plurality of illumination elements (i.e., the first pitch may be maintained even across interfaces between different illumination elements). When the plurality of illumination elements are positioned adjacent to each other and connected together via the electrical connectors, across the plurality of illumination elements, the light-emitting elements may be spaced apart at a substantially constant second pitch in a second direction different from (e.g., substantially perpendicular to) the first direction, and the second pitch may be maintained between the plurality of illumination elements. The first pitch and the second pitch may be substantially equal.

At least one illumination element may include at least one optical element (e.g., a lens, prism, collimator, mirror, reflector, etc.), which may be configured for focusing and/or shaping light from the illumination element to a desired illumination pattern. An optic may be disposed on or over at least one illumination element. The optic may include, consist essentially of, or consist of a lens, a diffuser, a refractive optic, a reflective optic, a Fresnel optic, a fabric, a translucent material panel, a graphic panel, and/or a membrane. A collective thickness of the at least one illumination element and the optic may be less than 500 mm. A collective thickness of the at least one illumination element and the optic may be at least 10 mm, at least 20 mm, at least 50 mm, or at least 100 mm. A collective thickness of the at least one illumination element and the optic may range from 100% to 500% of a spacing between the light-emitting elements disposed on the at least one illumination element.

At least one control element may be configured to receive a control signal representing the predetermined current. At least one power conductor may be configured to provide a control signal to the at least one control element. At least one illumination element may include a second control element (i) electrically connected to at least one light-emitting string, and (ii) configured to control the at least one light-emitting string to produce an optical characteristic of light emitted thereby. The optical characteristic may include, consist essentially of, or consist of light intensity, output power, color temperature, color point, spectral power distribution, color rendering index, and/or light distribution pattern. The plurality of light-emitting elements of at least one illumination element may include, consist essentially of, or consist of at least two groups of light-emitting elements, each group of light emitting-elements having a different optical characteristic. The optical characteristic may include, consist essentially of, or consist of light intensity, output power, color temperature, color point, spectral power distribution, color rendering index, and/or light distribution pattern.

One or more of the illumination elements may include a polymeric top housing sealed to the substrate to form a sealed region in which the light-emitting elements of the illumination element are disposed. The one or more of the illumination elements may be water-resistant or waterproof. The one or more of the illumination elements may have an ingress protection rating of at least IP X5, as specified by International Protection Marking in International Electrotechnical Commission (IEC) standard 60529. The substrate of the one or more of the illumination elements may have a first surface and a second surface opposite the second surface. The light-emitting elements of the one or more of the illumination elements may be disposed over the first surface. The one or more of the illumination elements may include a polymeric bottom housing disposed over the second surface of the substrate opposite the top housing. At least a portion of the bottom housing may contact the second surface of the substrate to form a second sealed region disposed between the bottom housing and the second surface of the substrate. The sealed region and/or the second sealed region may be water-resistant or waterproof. The bottom housing may be spaced away from the second surface (e.g., not in contact with or conforming to the shape of the second surface) in the second sealed region. The bottom housing may be in contact with at least a portion of the second surface in the second sealed region.

The substrate of the one or more of the illumination elements may have a first surface and a second surface opposite the second surface. The light-emitting elements of the one or more of the illumination elements may be disposed on over the first surface. The one or more of the illumination elements may include a polymeric bottom housing disposed over the second surface of the substrate opposite the top housing. At least a portion of the bottom housing may contact the top housing to form a second sealed region disposed between the bottom housing and the second surface of the substrate and/or the top housing. At least a portion of the bottom housing may contact the top housing to form a second sealed region disposed between the bottom housing and the top housing. The sealed region and/or the second sealed region may be water-resistant or waterproof. The top housing and/or the bottom housing may include, consist essentially of, or consist of polyester, acrylic, polystyrene, polyethylene, polyimide, polyethylene naphthalate, polyethylene terephthalate, polypropylene, polycarbonate, acrylonitrile butadiene styrene, polyurethane, silicone, and/or polydimethylsiloxane. The top housing and the bottom housing may include, consist essentially of, or consist of the same material or different materials.

The predetermined luminous flux density of each illumination element may be within ±10%, ±5%, or ±2% of the predetermined luminous flux density of any other illumination element. The one or more of the illumination elements may be flexible. The system may include a power supply electrically coupled to the one or more electrical connectors of a first illumination element, and power from the power supply may be supplied to one or more other illumination elements via the first illumination element. The power supply may be configured to provide a substantially constant voltage to the illumination elements. The power supply may be configured to adjust a light output of at least one illumination element by pulse-width-modulating a voltage or a current of the power supply.

The system may include a power-distribution element. The power-distribution element may include, consist essentially of, or consist of one or more first connector sets and one or more second connection point sets. The one or more first connector sets may each include, consist essentially of, or consist of one or more first electrical connectors each configured for connection to an electrical connector of an illumination element. The one or more second connection point sets may each include, consist essentially of, or consist of one or more second electrical connection points for receiving power from an external source of power. Any of the second electrical connection points may be a connection point for a bare wire or a flying lead or may be a connector analogous to one or more of the electrical connectors found on the illumination elements. Power received via the one or more second connection point sets may be distributed, on the power-distribution element, to the one or more first connector sets. When the one or more first connector sets are connected and the one or more second connection point sets are connected, the power-distribution element may be water-resistant or waterproof. The system may include a power supply, and the power supply may be the external source of power for the power-distribution element. The power supply may be configured to provide a substantially constant voltage to the illumination elements. The power supply may be configured to adjust a light output of at least one illumination element by pulse-width-modulating a voltage or a current of the power supply. The power supply may be directly coupled to the one or more second connection point sets (e.g., via a connection such as an electrical connector, a wire, or other connection). The one or more second connection point sets may be directly coupled to one or more of the illumination elements, and power may be supplied to the power-distribution element via the one or more of the illumination elements. The power-distribution element may contain no light-emitting elements thereon. The power-distribution element may include a substrate, and the substrate may include, consist essentially of, or consist of the same substrate as that of one or more of the illumination elements. The power-distribution element may be flexible.

When the plurality of illumination elements are positioned adjacent to each other and connected together via the electrical connectors, across the plurality of illumination elements, the light-emitting elements may be spaced apart at a substantially constant first pitch in a first direction, and the first pitch may be maintained between and among the plurality of illumination elements (i.e., the first pitch may be maintained even across interfaces between different illumination elements). When the plurality of illumination elements are positioned adjacent to each other and connected together via the electrical connectors, across the plurality of illumination elements, the light-emitting elements may be spaced apart at a substantially constant second pitch in a second direction different from (e.g., substantially perpendicular to) the first direction, and the second pitch may be maintained between the plurality of illumination elements. The first pitch and the second pitch may be substantially equal.

At least one illumination element may include at least one optical element (e.g., a lens, prism, collimator, mirror, reflector, etc.), which may be configured for focusing and/or shaping light from the illumination element to a desired illumination pattern. An optic may be disposed on or over at least one illumination element. The optic may include, consist essentially of, or consist of a lens, a diffuser, a refractive optic, a reflective optic, a Fresnel optic, a fabric, a translucent material panel, a graphic panel, and/or a membrane. A collective thickness of the at least one illumination element and the optic may be less than 500 mm. A collective thickness of the at least one illumination element and the optic may be at least 10 mm, at least 20 mm, at least 50 mm, or at least 100 mm. A collective thickness of the at least one illumination element and the optic may range from 100% to 500% of a spacing between the light-emitting elements disposed on the at least one illumination element.

At least one control element may be configured to receive a control signal representing the predetermined current. At least one power conductor may be configured to provide a control signal to the at least one control element. At least one illumination element may include a second control element (i) electrically connected to at least one light-emitting string, and (ii) configured to control the at least one light-emitting string to produce an optical characteristic of light emitted thereby. The optical characteristic may include, consist essentially of, or consist of light intensity, output power, color temperature, color point, spectral power distribution, color rendering index, and/or light distribution pattern. The plurality of light-emitting elements of at least one illumination element may include, consist essentially of, or consist of at least two groups of light-emitting elements, each group of light emitting-elements having a different optical characteristic. The optical characteristic may include, consist essentially of, or consist of light intensity, output power, color temperature, color point, spectral power distribution, color rendering index, and/or light distribution pattern.

One or more of the illumination elements may include (i) a polymeric top housing disposed over a first surface of the substrate, and (ii) a polymeric bottom housing disposed over a second surface of the substrate opposite the first surface. The top housing may be sealed to the bottom housing to form a sealed region in which the light-emitting elements of the illumination element are disposed. All or a portion of the substrate of the illumination element may be disposed within the sealed region. The one or more of the illumination elements may be water-resistant or waterproof. The one or more of the illumination elements may have an ingress protection rating of at least IP X5, as specified by International Protection Marking in International Electrotechnical Commission (IEC) standard 60529.

In another aspect, embodiments of the invention feature a method of illuminating an area. An area for illumination is defined. The area has an arbitrary size and two-dimensional shape. A plurality of assemblable illumination elements is provided. Each illumination element includes, consists essentially of, or consists of a substrate, first and second spaced-apart power conductors disposed over the substrate, a plurality of light-emitting elements that are spaced apart and interconnected into one or more light-emitting strings, and one or more electrical connectors each electrically coupled to at least one of the first or second power conductors. Each light-emitting string (i) includes a control element disposed over the substrate and electrically connected to the light-emitting elements in the light-emitting string and configured to provide a predetermined current to the light-emitting elements in the light-emitting string, (ii) includes two or more of the light-emitting elements, (iii) has a first end electrically connected to the first power conductor, and (iv) has a second end electrically connected to the second power conductor. Each illumination element has a different shape defined by a one-dimensional or two-dimensional contiguous arrangement of illumination unit cells. Each illumination unit cell (i) is polygonal, (ii) encompasses at least one light-emitting string, and (ii) emits light at a predetermined luminous flux density, such that each of the illumination elements emits light at approximately the predetermined luminous flux density. One or more of each of the illumination elements is assembled, via interconnection of electrical connectors of adjoining illumination elements, into a shape approximately conforming to the area.

Embodiments of the invention may include one or more of the following in any of a variety of combinations. An area of the shape into which the one or more of each of the illumination elements is assembled may be within ±20%, within ±10%, within ±5%, or within ±2% of the area for illumination. The predetermined luminous flux density of each illumination element may be within ±10%, ±5%, or ±2% of the predetermined luminous flux density of any other illumination element. One or more of the illumination elements may be flexible. A power supply may be electrically coupled to the one or more electrical connectors of a first illumination element, and power from the power supply may be supplied to one or more other illumination elements via the first illumination element. The power supply may be configured to provide a substantially constant voltage to the illumination elements. A voltage or a current of the power supply may be pulse-width-modulated to adjust a light output of at least one illumination element.

A power-distribution element may be provided. The power-distribution element may include, consist essentially of, or consist of one or more first connector sets and one or more second connection point sets. The one or more first connector sets may each include, consist essentially of, or consist of one or more first electrical connectors each configured for connection to an electrical connector of an illumination element. The one or more second connection point sets may each include, consist essentially of, or consist of one or more second electrical connection points for receiving power from an external source of power. Any of the second electrical connection points may be a connection point for a bare wire or a flying lead, or may be a connector analogous to one or more of the electrical connectors found on the illumination elements. Power received via the one or more second connection point sets may be distributed, on the power-distribution element, to the one or more first connector sets. A power supply may be provided, and the power supply may be the external source of power for the power-distribution element. The power supply may be configured to provide a substantially constant voltage to the illumination elements. A voltage or a current of the power supply may be pulse-width-modulated to adjust a light output of at least one illumination element. Providing the power supply may include, consist essentially of, or consist of directly coupling the power supply to the one or more second connection point sets (e.g., via a connection such as an electrical connector, a wire, or other connection). (In embodiments in which the power supply is "indirectly coupled" to the one or more second connection point sets, the power supply is directly coupled to a different element that is directly coupled to the one or more second connection point sets, such as one of the illumination elements, and power from the power supply flows through that different element to the power-distribution element.) The one or more second connection point sets may be directly coupled to one or more of the illumination elements, and power may be supplied to the power-distribution element via the one or more of the illumination elements. The power-distribution element may contain no light-emitting elements thereon. The power-distribution element may include a substrate, and the substrate may include, consist essentially of, or consist of the same substrate as that of one or more of the illumination elements. The power-distribution element may be flexible.

When the one or more of each of the illumination elements are assembled into the shape, across the shape, the light-emitting elements may be spaced apart at a substantially constant first pitch in a first direction, and the first pitch may be maintained between and among the plurality of illumination elements (i.e., the first pitch may be maintained even across interfaces between different illumination elements). When the one or more of each of the illumination elements are assembled into the shape, across the shape, the light-emitting elements may be spaced apart at a substantially constant second pitch in a second direction different from (e.g., substantially perpendicular to) the first direction, and the second pitch may be maintained between the plurality of illumination elements. The first pitch and the second pitch may be substantially equal.

At least one optical element (e.g., a lens, prism, collimator, mirror, reflector, ect.) may be provided. The at least one optical element may be configured for focusing and/or shaping light from at least one illumination element to a desired illumination pattern. An optic may be positioned on or over at least one illumination element. The optic may include, consist essentially of, or consist of a lens, a diffuser, a refractive optic, a refractive optic, a Fresnel optic, a fabric, a translucent material panel, a graphic panel, and/or a membrane. A collective thickness of the at least one illumination element and the optic may be less than 500 mm. A collective thickness of the at least one illumination element and the optic may be at least 10 mm, at least 20 mm, at least 50 mm, or at least 100 mm. A collective thickness of the at least one illumination element and the optic may range from 100% to 500% of a spacing between the light-emitting elements disposed on the at least one illumination element.

The predetermined current on an illumination element may be set by issuing a control signal to at least one control element via at least one of the power conductors. An optical characteristic of the emitted light of an illumination element may be controlled by issuing a control signal to a second control element electrically connected to at least one light-emitting string. The optical characteristic may include, consist essentially of, or consist of light intensity, output power, color temperature, color point, spectral power distribution, color rendering index, and/or light distribution pattern. The plurality of light-emitting elements of at least one illumination element may include, consist essentially of, or consist of at least two groups of light-emitting elements, each group of light emitting-elements having a different optical characteristic. The optical characteristic may include, consist essentially of, or consist of light intensity, output power, color temperature, color point, spectral power distribution, color rendering index, and/or light distribution pattern.

A polymeric top housing may be sealed to the substrate of an illumination element to form a sealed region in which the light-emitting elements of the illumination element are disposed. The illumination element may be water-resistant or waterproof. The illumination element may have an ingress protection rating of at least IP X5, as specified by International Protection Marking in International Electrotechnical Commission (IEC) standard 60529. The substrate of the illumination element may have a first surface and a second surface opposite the second surface, and the light-emitting elements of the illumination element may be disposed over the first surface. At least a portion of a polymeric bottom housing may be contacted to the second surface to form a second sealed region disposed between the bottom housing and the second surface of the substrate. The sealed region and/or the second sealed region may be water-resistant or waterproof. The bottom housing may be spaced away from the second surface in the second sealed region. The bottom housing may be in contact with at least a portion of the second surface in the second sealed region. At least a portion of a polymeric bottom housing may be contacted to the top housing to form a second sealed region disposed between the bottom housing and the top housing and/or the second surface of the substrate. The second sealed region may be water-resistant or waterproof. The top housing and/or the bottom housing may include, consist essentially of, or consist of polyester, acrylic, polystyrene, polyethylene, polyimide, polyethylene naphthalate, polyethylene terephthalate, polypropylene, polycarbonate, acrylonitrile butadiene styrene, polyurethane, silicone, and/or polydimethylsiloxane. The top housing and the bottom housing may include, consist essentially of, or consist of the same material or different materials.

The predetermined luminous flux density of each illumination element may be within ±10%, ±5%, or ±2% of the predetermined luminous flux density of any other illumination element. One or more of the illumination elements may be flexible. A power supply may be electrically coupled to the one or more electrical connectors of a first illumination element, and power from the power supply may be supplied to one or more other illumination elements via the first illumination element. The power supply may be configured to provide a substantially constant voltage to the illumination elements. A voltage or a current of the power supply may be pulse-width-modulated to adjust a light output of at least one illumination element.

A power-distribution element may be provided. The power-distribution element may include, consist essentially of, or consist of one or more first connector sets and one or more second connection point sets. The one or more first connector sets may each include, consist essentially of, or consist of one or more first electrical connectors each configured for connection to an electrical connector of an illumination element. The one or more second connection point sets may each include, consist essentially of, or consist of one or more second electrical connection points for receiving power from an external source of power. Any of the second electrical connection points may be a connection point for a bare wire or a flying lead or may be a connector analogous to one or more of the electrical connectors found on the illumination elements. Power received via the one or more second connection point sets may be distributed, on the power-distribution element, to the one or more first connector sets. When the one or more first connector sets are connected (i.e., to connectors on other objects such as illumination elements) and the one or more second connection point sets are connected (i.e., to other objects such as power supplies, other sources of power, illumination elements, etc.), the power-distribution element may be water-resistant or waterproof. A power supply may be provided, and the power supply may be the external source of power for the power-distribution element. The power supply may be configured to provide a substantially constant voltage to the illumination elements. A voltage or a current of the power supply may be pulse-width-modulated to adjust a light output of at least one illumination element. Providing the power supply may include, consist essentially of, or consist of directly coupling the power supply to the one or more second connection point sets (e.g., via a connection such as an electrical connector, a wire, or other connection). (In embodiments in which the power supply is "indirectly coupled" to the one or more second connection point sets, the power supply is directly coupled to a different element that is directly coupled to the one or more second connection point sets, such as one of the illumination elements, and power from the power supply flows through that different element to the power-distribution element.) The one or more second connection point sets may be directly coupled to one or more of the illumination elements, and power may be supplied to the power-distribution element via the one or more of the illumination elements. The power-distribution element may contain no light-emitting elements thereon. The power-distribution element may include a substrate, and the substrate may include, consist essentially of, or consist of the same substrate as that of one or more of the illumination elements. The power-distribution element may be flexible.

When the one or more of each of the illumination elements are assembled into the shape, across the shape, the light-emitting elements may be spaced apart at a substantially constant first pitch in a first direction, and the first pitch may be maintained between and among the plurality of illumination elements (i.e., the first pitch may be maintained even across interfaces between different illumination elements). When the one or more of each of the illumination elements are assembled into the shape, across the shape, the light-emitting elements may be spaced apart at a substantially constant second pitch in a second direction different from (e.g., substantially perpendicular to) the first direction, and the second pitch may be maintained between the plurality of illumination elements. The first pitch and the second pitch may be substantially equal.

At least one optical element (e.g., a lens, prism, collimator, mirror, reflector, etc.) may be provided. The at least one optical element may be configured for focusing and/or shaping light from at least one illumination element to a desired illumination pattern. An optic may be positioned on or over at least one illumination element. The optic may include, consist essentially of, or consist of a lens, a diffuser, a refractive optic, a reflective optic, a Fresnel optic, a fabric, a translucent material panel, a graphic panel, and/or a membrane. A collective thickness of the at least one illumination element and the optic may be less than 500 mm. A collective thickness of the at least one illumination element and the optic may be at least 10 mm, at least 20 mm, at least 50 mm, or at least 100 mm. A collective thickness of the at least one illumination element and the optic may range from 100% to 500% of a spacing between the light-emitting elements disposed on the at least one illumination element.

The predetermined current on an illumination element may be set by issuing a control signal to at least one control element via at least one of the power conductors. An optical characteristic of the emitted light of an illumination element may be controlled by issuing a control signal to a second control element electrically connected to at least one light-emitting string. The optical characteristic may include, consist essentially of, or consist of light intensity, output power, color temperature, color point, spectral power distribution, color rendering index, and/or light distribution pattern. The plurality of light-emitting elements of at least one illumination element may include, consist essentially of, or consist of at least two groups of light-emitting elements, each group of light emitting-elements having a different optical characteristic. The optical characteristic may include, consist essentially of, or consist of light intensity, output power, color temperature, color point, spectral power distribution, color rendering index, and/or light distribution pattern.

A polymeric top housing disposed over a first surface of the substrate of an illumination element may be sealed to a polymeric bottom housing disposed over a second surface of the substrate opposite the first surface to form a sealed region in which the light-emitting elements of the illumination element are disposed. All or a portion of the substrate of the illumination element may be disposed within the sealed region. The illumination element may be water-resistant or waterproof. The illumination element may have an ingress protection rating of at least IP X5, as specified by International Protection Marking in International Electrotechnical Commission (IEC) standard 60529.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "about," "approximately," and "substantially" mean ±10%, and in some embodiments, ±5%. The term "consists essentially of" means excluding other materials that contribute to function, unless otherwise defined herein. Nonetheless, such other materials may be present, collectively or individually, in trace amounts.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other. Substrates, light sheets, components, and/or portions thereof described as "reflective" may be specularly reflective or diffusively reflective unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1A is a circuit diagram of a portion of a light sheet in accordance with various embodiments of the invention;

FIGS. 1B and 1C are schematic plan views of light sheets in accordance with various embodiments of the invention;

FIGS. 2A-2E are schematic cross-sections of lighting devices in accordance with various embodiments of the invention;

FIG. 2G is a schematic cross-section of a lighting device in accordance with various embodiments of the invention;

FIGS. 3A and 3B are schematic cross-sections of lighting devices in accordance with various embodiments of the invention;

FIGS. 3C-3E are partial schematic cross-sections of a lighting device in accordance with various embodiments of the invention;

FIG. 4 is a schematic cross-section of a lighting device in accordance with various embodiments of the invention;

FIGS. 6A-6E are schematic plan views of portions of a lighting-device in accordance with various embodiments of the invention;

FIGS. 6F and 6G are schematic plan views of lighting systems in accordance with various embodiments of the invention;

FIGS. 6H-6M are schematic plan views of portions of a lighting-device in accordance with various embodiments of the invention;

FIG. 7A is a schematic plan view of a lighting system in accordance with various embodiments of the invention;

FIGS. 8A-8C are schematic cross-sections of lighting devices in accordance with various embodiments of the invention;

FIG. 9 is a flowchart of a method of fabrication of lighting devices in accordance with various embodiments of the invention;

FIGS. 10A-10E are schematic cross-sections of a lighting device during various stages of manufacture in accordance with various embodiments of the invention; and FIG. 11 is a schematic diagram of roll-to-roll processing apparatus for the fabrication of lighting devices in accordance with various embodiments of the invention.

DETAILED DESCRIPTION

Figure 1B:
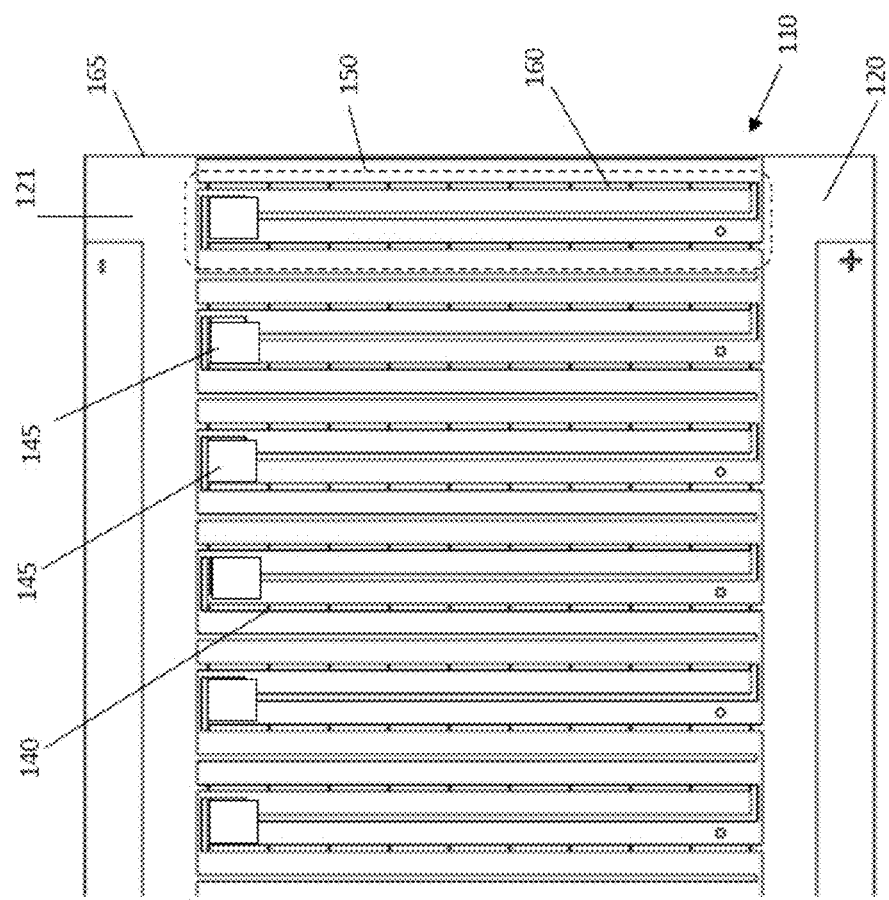

FIG. 1A depicts an exemplary circuit topology of one embodiment of a light sheet, in accordance with embodiments of the present invention, which features conductive elements 160, at least two power conductors 120, 121, multiple LEEs 140, and control elements (CEs) 145. In various embodiments, LEEs 140 may be configured in a regular periodic array, for example a substantially square or rectangular array, where LEEs 140 are separated by pitch (or "spacing") 123 in one direction (for example, a vertical or intrastring direction) and by pitch 125 in a substantially orthogonal direction (for example, a horizontal or interstring direction). In various embodiments, pitch 125 is the same as or substantially the same as pitch 123. While the geometrical layout and pitches 123, 125 are described in connection with the circuit schematic shown in FIG. 1A, such geometry, layout, and pitches are not limitations of the present invention, and in other embodiments the physical layout of the circuit elements may be different than the circuit topology shown in FIG. 1A. Additionally, other embodiments may have different circuit topologies, for example LEEs 140 may be electrically coupled in parallel, in a combination of series and parallel, or any other arrangement. In various embodiments, more than one group of electrically connected LEEs 140 may be electrically coupled to one CE 145, while other embodiments may not require any CEs 145. The specific circuit topology is not a limitation of the present invention.

FIG. 1A shows two power conductors 120, 121, which may be used to provide power to strings 150 of LEEs 140. Each string 150 may include two or more electrically coupled LEEs 140. LEEs 140 in string 150 may be electrically coupled in series, as shown in FIG. 1A; however, this is not a limitation of the present invention, and in other embodiments other examples of electrical coupling may be utilized, for example parallel connections or any combination of series and parallel connections. FIG. 1A shows CE 145 connected in series with LEEs 140 of string 150; however, this is not a limitation of the present invention, and in other embodiments CE 145 may have different electrical coupling between power conductors 120, 121, or may be absent altogether. For example, in some embodiments CE 145 may be separately electrically coupled to power conductors 120, 121 and to the LEE string 150, while in other embodiments each CE 145 may be electrically coupled to two or more strings. The number of strings electrically coupled to each CE 145 is not a limitation of the present invention. Combinations of structures described herein, as well as other electrical connections, all fall within the scope of the present invention. Power conductors 120, 121 may be used to provide power to strings 150, for example AC power, DC power, or power modulated by any other means.

Referring to FIGS. 1B and 1C that depict schematics of exemplary light sheets 110, a light sheet 110 may feature an array of LEEs 140 each electrically coupled between conductive traces 160, as well as power conductors 120, 121 providing power to conductive traces 160 and CEs 145, all of which are disposed over a substrate 165. As utilized herein, a "wiring board" refers to a substrate for LEEs with or without additional elements such as conductive traces or CEs. A wiring board may also be referred to as a light sheet or a circuit board. FIG. 1B shows a portion of a light sheet 110. In the exemplary embodiment depicted in FIG. 1B, power conductors 120, 121 are spaced apart from each other and light-emitting strings (or simply "strings") 150 are connected in parallel across power conductors 120, 121. In various embodiments, for example as shown in FIG. 1B, strings 150 do not cross (i.e., intersect) each other. In other words, power conductors 120, 121 are oriented in one direction and strings 150 are oriented such that they span power conductors 120, 121 in a different direction. As shown in FIG. 1B, strings 150 are substantially perpendicular to power conductors 120, 121. However, this is not a limitation of the present invention, and in other embodiments at least some segments (i.e., portions connecting two or more LEEs 140), or even the entire strings 150, may define a line (not necessarily a straight line) that is not perpendicular to power conductors 120, 121 yet is (at least for an entire string 150) not parallel to power conductors 120, 121. In other embodiments, strings 150 may intersect, for example one string 150 splitting into two or more strings 150, or two or more strings 150 joining to form a reduced number of strings 150. In various embodiments, conductive elements 160 may cross over each other without being electrically coupled to each other (i.e., they may be electrically insulated from each other), and in some embodiments strings 150 may cross over or under each other without being electrically coupled to each other. In some embodiments, all or a portion of one or more strings 150 may extend outside of the area bound by power conductors 120, 121. Various examples of string geometries and conformations utilized in embodiments of the present invention are described in the '807 and '027 applications.

As shown in FIGS. 1B and 1C, LEEs 140 may be positioned across substrate 165 in a regular periodic array, although this is not a limitation of the present invention, and in other embodiments LEEs 140 may occupy any positions on light sheet 110. Power conductors 120, 121 provide power to each LEE string, for example the string 150 encircled by the dashed line in FIG. 1B. Each LEE string 150 typically includes multiple conductive traces 160 that interconnect multiple LEEs 140, as well as one or more CEs 145, which in FIG. 1B is in series with LEEs 140. String 150 shown in FIG. 1B is a folded string, i.e., a string that has three segments electrically coupled in series but positioned as three adjacent segments. A string segment is a portion of a string spanning all or a portion of the region between power conductors 120, 121 in FIG. 1B. In light sheet 110, some string segments may include LEEs 140 while others do not. However, in other embodiments the distribution and position of LEEs 140 along conductive elements 160 and string segments may be different. In various embodiments, a string 150 may be a straight string, i.e., a string with no folds, as shown in FIG. 1C. One end of string 150 is electrically coupled to power conductor 120, while the other end of string 150 is electrically coupled to power conductor 121. As will be discussed, the number of segments in a string 150 is not a limitation of the present invention. Various examples of straight and folded strings utilized in embodiments of the present invention are detailed in the '807 and '027 applications. Note that the example shown in FIG. 1C does not include CEs 145. In various embodiments of the present invention, CEs 145 may not be included or CEs 145 may be included but may not be mounted on substrate 165 or on light sheet 110; rather, they may be mounted on a separate structure (e.g., a separate submount) and electrically connected to one or more of the LEEs on the light sheet.

FIGS. 1A and 1B illustrate three aspects in accordance with various embodiments of the present invention. The first is the multiple strings 150 that are powered by the set of power conductors 120, 121. The second is the positional relationship between the locations of LEEs 140 and CE 145, which is disposed between the conductive traces 160 and between power conductors 120,121, such that the pitch between LEEs 140 is not disrupted by the placement or position of CE 145. The third is the inclusion of a CE 145 in each string of series-connected LEEs 140. Combinations of these three aspects enable light sheet 110 to be economically manufactured in very long lengths, for example in a roll-to-roll process, and cut to specified lengths, forming light sheets, while maintaining the ability to tile, or place light sheets adjacent to each other (e.g., in the length direction), with no or substantially no change in pitch between LEEs 140 or in the optical characteristics across the joint between two adjacent light sheets, as discussed in more detail in the '807 and '027 applications.

In an exemplary embodiment, CE 145 is configured to maintain a constant or substantially constant current through LEEs 140 of string 150. For example, in some embodiments, a constant voltage may be applied to power conductors 120, 121, which may, under certain circumstances may have some variation, or the sum of the forward voltages of LEEs 140 in different strings may be somewhat different, for example as a result of manufacturing tolerances, or the component and/or operational values of the element(s) within CE 145 may vary, for example as a result of manufacturing tolerances or changes in operating temperature, and CE 145 acts to maintain the current through LEEs 140 substantially constant in the face of these variations. In other words, in some embodiments the input to the light sheet is a constant voltage that is applied to power conductors 120, 121, and CEs 145 convert the constant voltage to a constant or substantially constant current through LEEs 140. The design of CE 145 may be varied to provide different levels of control or variation of the current through LEEs 140. In some embodiments, CEs 145 may control the current through LEEs 140 to be substantially constant with a variation of less than about ±25%. In some embodiments, CEs 145 may control the current through LEEs 140 to be substantially constant with a variation of less than about ±15%. In some embodiments, CEs 145 may control the current through LEEs 140 to be substantially constant with a variation of less than about ±10%. In some embodiments, CEs 145 may control the current through LEEs 140 to be substantially constant with a variation of less than about ±5%.

In various embodiments, CEs 145 may, in response to a control signal, act to maintain a constant or substantially constant current through LEEs 140 until instructed to change to a different constant or substantially constant current, for example by an external control signal. In various embodiments, as detailed herein, all CEs 145 may act in concert, that is maintain or change the current through all associated LEEs 140; however, this is not a limitation of the present invention, and in other embodiments one or more CEs 145 may be individually addressed, instructed and/or energized.

Any of the CEs detailed herein (e.g., CE 145) may include, consist essentially of, or consist of one or more programmable control elements as described in U.S. patent application Ser. No. 15/457,172, filed Mar. 13, 2017, the entire disclosure of which is incorporated by reference herein.

In various embodiments, LEEs 140 may include, consist essentially of, or consist of light-emitting diodes (LEDs) or lasers. In various embodiments, light emitted from light sheet 110 is in the form of an array of bright spots, or light-emission points, resulting in a pixelated pattern. However, this is not a limitation of the present invention, and in other embodiments light sheet 110 includes different types of light emitters, for example organic LEDs (OLEDs). In various embodiments, light sheet 110 may emit light homogeneously or substantially homogeneously, for example light sheet 110 may include an array of LEEs 140 behind an optic or diffuser that spreads the light from LEEs 140 homogeneously or substantially homogeneously. In various embodiments, light sheet 110 may include one or more OLEDs emitting homogeneously or substantially homogeneously over light sheet 110.

In the embodiment depicted in FIG. 1B, LEEs 140 are distributed substantially uniformly over light sheet 110; however, this is not a limitation of the present invention, and in other embodiments, LEEs 140 may have a non-uniform distribution. As will be understood, the distributions of LEE 140 on light sheet 110 shown in FIGS. 1B and 1C are not limitations of the present invention, and other embodiments may have other distributions of LEEs 140. In various embodiments, one or more portions of light sheet 110 may be unpopulated with LEEs 140. In various embodiments, the distribution of LEEs 140 on light sheet 110 is specifically chosen to achieve one or more characteristics, for example optical, electrical, thermal or the like, as described herein. In various embodiments, the distribution of LEEs 140 on light sheet 110 may be chosen to create a certain decorative look.

In various embodiments, light sheet 110 may also be cut to length, as discussed in more detail in the '807 and '027 applications. For example, in various embodiments of the present invention light sheet 110 may be cut between strings 150.

In various embodiments, light sheet 110 does not require any additional thermal management or heat-sinking, i.e., the heat generated by LEEs 140 is at least partially accommodated by the structure of light sheet 110 itself, for example substrate 165 and/or conductive elements 160 and/or power conductors 120, 121.

In various embodiments of the present invention, substrate 165 is substantially covered with an array of LEEs 140 interconnected by conductive elements 160; however, in various embodiments one or more portions of substrate 165 may not be populated with LEEs 140.

In various embodiments, all LEEs 140 in the lighting system may be driven at the same or substantially the same current; however, this is not a limitation of the present invention, and in other embodiments different LEEs 140 or different groups of LEEs 140 may be driven at different currents.

In various embodiments, all LEEs 140 in the lighting system may have the same optical characteristics, for example luminous or radiant flux, CCT, color point, CRI, R9, spectral power distribution, light distribution pattern, angular color uniformity, or the like; however, this is not a limitation of the present invention, and in other embodiments different LEEs 140 or different groups of LEEs 140 may have different optical characteristics.

Figure 2F:
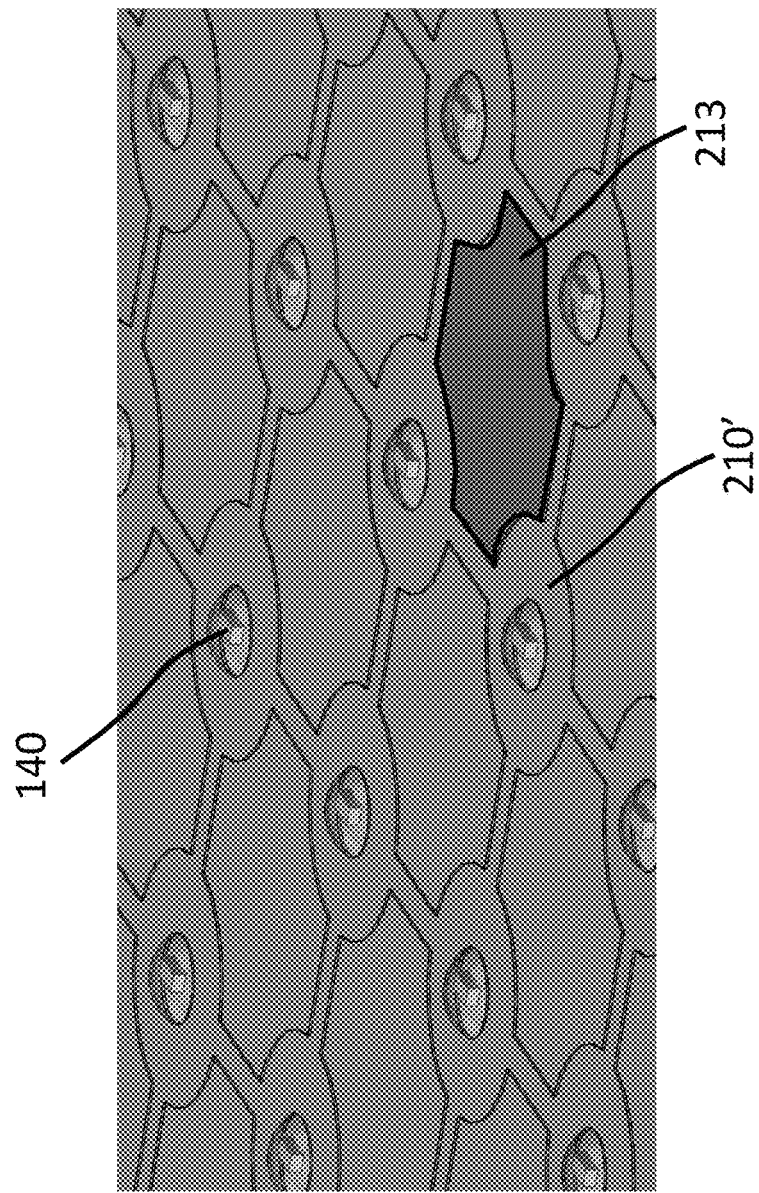
FIG. 2F is a schematic isometric view of a lighting device in accordance with various embodiments of the invention.

FIGS. 2A-2G depict exemplary lighting devices in accordance with embodiments of the present invention, although alternative devices or systems with similar functionality are also within the scope of the invention. FIG. 2A shows a cross-sectional view of a lighting device 200 of the present invention including or consisting essentially of LEEs 140 electrically coupled to conductive traces 160 that are formed over substrate 165, and a top housing 210 adhered to the underlying structure with an adhesion agent 230. Optional CEs 145 are not shown in FIGS. 2A-2G for clarity. While FIG. 2A shows top housing 210 adhered to the underlying structure (e.g., traces 160) with adhesion agent 230, this is not a limitation of the present invention, and in other embodiments portions of adhesion agent 230 may also or instead be in contact with substrate 165.

In various embodiments of the present invention, adhesion agent 230 may include, consist essentially of, or consist of an adhesive, an adhesive tape, a hot melt adhesive, polyurethane, thermoplastic polyurethane (TPU), ethylene vinyl acetate (EVA), a printed adhesive, or the like. In various embodiments, adhesion agent 230 may be optional and top housing 210 may be attached directly to the underlying structure without the use of adhesion agent 230 (e.g., via ultrasonic welding, heat welding, lamination, or clamps or other mechanical means). While FIG. 2A shows top housing 210 adhered to underlying substrate 165 in substantially all areas except in the LEE region, this is not a limitation of the present invention, and in other embodiments top housing 210 may be adhered or attached to underlying substrate 165 in only a portion of the area between top housing 210 and substrate 165.

FIG. 2B shows a cross-sectional view of a lighting device 201 in accordance with embodiments of the present invention and that is similar to lighting device 200 of FIG. 2A, but with the addition of a bottom housing 220. In lighting device 201, bottom housing 220 is attached to the bottom of substrate 165 (i.e., in the depicted embodiment, the side opposite that to which LEEs 140 are attached). While FIG. 2B does not show an adhesion agent between bottom housing 220 and substrate 165, this is not a limitation of the present invention, and in other embodiments adhesion agent (s) and/or alternative joining or bonding mechanisms or means may be utilized as detailed above.

FIG. 2C shows a cross-sectional view of a lighting device 202 in accordance with embodiments of the present invention and that is similar to lighting device 201 of FIG. 2B. In the case of lighting device 202, the bottom housing 220 is at least partially sealed to top housing 210. In various embodiments of the present invention, top housing 210 and bottom housing 220 may be joined at the periphery of lighting device 202, for example in the region 225 in FIG. 2C. While FIG. 2C shows bottom housing 220 shaped to wrap around substrate 165 and meet top housing 210, this is not a limitation of the present invention, and in other embodiments top housing 210 may be shaped to meet bottom housing 220 or both top housing 210 and bottom housing 220 may be shaped or neither top housing 210 or bottom housing 220 may be shaped. While FIG. 2C does not show an adhesion agent between bottom housing 220 and substrate 165 or between top housing 210 and bottom housing 220, this is not a limitation of the present invention, and in other embodiments adhesion agent(s) and/or alternative joining or bonding mechanisms or means may be utilized as detailed above. In various embodiments of the present invention, top housing 210 and bottom housing 220 may be joined by heat welding, high-frequency welding, ultrasonic welding, laser welding, adhesive, glue, tape, or the like. In various embodiments of the present invention, top housing 210 and/or bottom housing 220 may be joined to light sheet 110 or to each other within the periphery of lighting device 202, e.g., to form one or more sealed regions.

In various embodiments, portions of top housing 210 and/or bottom housing 220 may be ribbed, i.e., have protruding segments or may be otherwise structured to provide rigidity to the lighting device. For example, FIG. 2D shows a lighting system 203 having a rib 240.

In various embodiments, substrate 165 and top housing 210 may have the same or substantially the same thermal coefficient of expansion (TCE). In various embodiments, choosing materials for substrate 165 and top housing 210 and/or bottom housing 220 having the same or substantially the same TCE may eliminate or reduce the tendency of the entire structure to curl and/or buckle when the lighting system is exposed to changing temperatures.

In various embodiments of the present invention, substrate 165 and top housing 210 and/or bottom housing 220 may have different TCE, in which case various techniques to reduce curling and/or buckling when exposed to changing temperatures may be employed. In various embodiments of the present invention, ribs or expansion joints, such as rib 240 shown in lighting device 203 of FIG. 2D, may be incorporated to accommodate all or a portion of the expansion and contraction difference between top housing 210 and substrate 165. While not shown in FIG. 2D, similar ribs or joints may be included in bottom housing 220 to accomplish a similar purpose.

In various embodiments of the present invention, a layer of additional material having a TCE closer to (or even substantially equal to) that of substrate 165 than to top housing 210 may be formed over all or a portion of top housing 210, to balance the stress in the structure. FIG. 2E shows a lighting system 204 including a cover layer or stress-balancing layer 250. While FIG. 2E shows stress-balancing layer 250 as one layer this is not a limitation of the present invention, and in other embodiments stress-balancing layer may include, consist essentially of, or consist of two or more layers of the same or different materials. In various embodiments, substrate 165 and cover layer 250 have the same or similar TCEs. In various embodiments, substrate 165 and cover layer 250 are composed of the same material. In various embodiments, substrate 165 and cover layer 250 include, consist essentially of, or consist of PET, and top housing 210 includes, consists essentially of, or consists of acrylic. In various embodiments, substrate 165 has a thickness in the range of about 10 μm to about 150 μm, top housing 210 has a thickness in the range of about 50 μm to about 1000 μm, and cover layer 250 has a thickness in the range of about 25 μm to about 500 μm; however, these dimensions are not a limit of the present invention, and in other embodiments the dimensions may be different. In various embodiments, substrate 165 and cover layer 250 include, consist essentially of, or consist of PET and have thicknesses of about 50 μm and about 50 μm respectively, and top housing 210 has a thickness of about 175 μm and includes, consists essentially of, or consists of acrylic. Cover layer 250 may be substantially transparent to light (e.g., to one or more wavelengths emitted by LEEs 140), or cover layer 250 may be translucent, opaque, or reflective to light or partially transparent, translucent, opaque, or reflective to light (e.g., to one or more wavelengths emitted by LEEs 140).

In various embodiments, portions of top housing 210 may be removed to reduce the area (and thus the magnitude) of stress generated by different in TCE between top housing 210 and substrate 165, as shown in FIG. 2F. FIG. 2F is an isometric view of lighting system 204 in which regions 213 of top housing 210' are removed.

It should be noted that in the foregoing discussion regarding TCE, the conductive traces 160 may also affect the TCE of substrate 165, and it will be understood by those skilled in the art that the TCE of the substrate includes the effect of the conductive traces, when they are present.

While FIGS. 2A-2F show the lighting systems as flat, this is not a limitation of the present invention, and in various embodiments the materials used in the lighting system may be flexible such that the lighting system may be curved or conformed to non-flat shapes, for example as shown in FIG. 2G.

As used herein, the term "housing" broadly connotes any containment structure or medium for fully overlying a top and/or bottom surface of the light sheet 110. A housing may be rigid or flexible, polymeric or other material (e.g., glass), and may interconnect with or be bondable to the light sheet or to another housing over the opposite surface of the light sheet to form a seal, e.g., a water-tight or water-resistant seal, around at least a portion of the light sheet. In various embodiments of the present invention, top housing 210 and bottom housing 220 are fabricated from plastic, for example polyester, acrylic, polystyrene, polyethylene, polyimide, polyethylene naphthalate (PEN), polyethylene terephthalate (PET), polypropylene, polycarbonate, acrylonitrile butadiene styrene (ABS), polyurethane, silicone, olydimethylsiloxane, or the like. In some embodiments of the present invention, top housing 210 and bottom housing 220 are fabricated by molding, vacuforming, and/or thermoforming.

In various embodiments of the present invention, the materials used in the lighting system may be similar or the same, while in other embodiments the lighting system may include, consist essentially of, or consist of two or portions, each portion including, consisting essentially of, or consisting of different materials having different properties or the same or similar materials having different properties. In various embodiments, the lighting system may include, consist essentially of, or consist of two or more portions. For example, in various embodiments the material of light sheet substrate 165 may be the same as that used for the top 210 and/or bottom housing 220; however, this is not a limitation of the present invention, and in other embodiments the material of top housing 210 and/or bottom housing 220 may include, consist essentially of, or consist of a material different from that used for substrate 165. For example, in various embodiments the different components of the lighting system may include, consist essentially of, or consist of the same or similar materials having different shrinkage rates, thermal coefficients of expansion, transparency, brittleness, crystallinity, melting points, or the like.

In various embodiments of the present invention, all or a portion of top housing 210 is transparent to a wavelength of light emitted by LEEs 140, for example having a transmittance to a wavelength of light emitted by LEEs 140 of at least 75%, or at least 85%, or at least 95%. In various embodiments of the present invention, all or a portion of top housing 210 may include a diffuser, for example to diffuse or scatter a wavelength of light emitted by LEEs 140.

In various embodiments of the present invention, all or a portion of bottom housing 220 is transparent to a wavelength of light emitted by LEEs 140, for example having a transmittance to a wavelength of light emitted by LEEs 140 of at least 75%, or at least 85%, or at least 95%, while in other embodiments all or a portion of bottom housing 220 may be translucent or opaque to a wavelength of light emitted by LEEs 140. In various embodiments of the present invention, all or a portion of bottom housing 220 or an inner surface 221 of bottom housing 220 may be reflective to a wavelength of light emitted by LEEs 140, for example having a reflectance to a wavelength of light emitted by LEEs 140 of at least 75%, or at least 85%, or at least 95%.

In various embodiments of the present invention, the materials of construction, for example substrate 165, top housing 210, and/or bottom housing 220, include, consist essentially of, or consist of materials having low flammability. One measure of flammability is defined by Underwriter Laboratories (UL) standard 94, the entire disclosure of which is incorporated by reference herein. UL94 includes various rating levels, for example UL94 V-1, UL94 V-2, UL94 V-0, UL94 V5B, UL94 V5A, and the like. In various embodiments of the present invention, the materials of construction are chosen to provide a certain level of flame retardance to the lighting system, for example, as measured by the UL94 flammability standard. In various embodiments of the present invention, the lighting system, for example as shown in FIGS. 2A, 2C-2F, 3A-3E, 6B-6D, and the like, the lighting has a UL94 rating of at least UL94 V-1, or at least UL94 V-0, or at least UL94 5B, or at least UL94 5A.

In various embodiments of the present invention, housings 210, 220 may be configured to protect light sheet 110, for example to provide mechanical protection, protection from dust, water, etc. One method for rating different levels of environmental protection is an IP rating as specified by International Protection Marking in International Electrotechnical Commission (IEC) standard 60529, providing classification of degrees of protection provided by enclosures for electrical equipment, the entirety of which is hereby incorporated by reference herein. In various embodiments, lighting devices of the present invention may have any IP rating, for example from IP00 to IP 69k, or any other IP rating. In various embodiments, lighting devices of the present invention have an IP 44 rating, or an IP65 rating or an IP66 rating or an IP67 rating or an IP68 rating. In general for an IP XY rating, "X" indicates the level of protection for access to electrical parts and ingress to solid foreign objects, while "Y" indicates the level of protection for ingress of harmful water. For example, an IP44 rating provides access and ingress protection for objects greater than about 1 mm and protection from water splashing on the system. In another example, an IP66 rating provides a dust-tight enclosure and protection from water jets incident on the system. In various embodiments an IP rating may be specified as IPX6, which indicates a rating including any level of protection for access to electrical parts and ingress to solid foreign objects and a specific (6) level for protection for ingress of harmful water. Specific details of the requirements and test method are detailed within the IP specification.

In various embodiments of the present invention, the interior region formed by housings 210, 220 may additionally contain a desiccant to absorb excess moisture and/or water vapor and prevent degradation or corrosion of light sheet 110 and associated components. In various embodiments of the present invention, the interior region formed by housings 210, 220 may be purged with an inert gas, for example nitrogen or argon, prior to sealing to reduce the moisture and/or water vapor concentration and prevent degradation or corrosion of light sheet 110 and associated components.

In various embodiments of the present invention, the interior region formed by housings 210, 220 may be evacuated to a relatively low pressure, or may be filled with air. In various embodiments of the present invention, all or portions of the interior region formed by housings 210, 220 may be filled with a material that is transparent or substantially transparent to a wavelength of light emitted by LEEs 140. In various embodiments of the present invention, the transparent material includes, consists essentially of, or consists of silicone, polyurethane, epoxy, or other suitable materials. Examples of such transparent materials include materials from the ASP series of silicone phenyls manufactured by Shin Etsu, or the Sylgard series manufactured by Dow Corning. In various embodiments of the present invention, the transparent material may reduce total-internal-reflection (TIR) losses of LEEs 140 and may provide enhanced optical coupling between LEEs 140 and bottom housing 220. In various embodiments of the present invention, the transparent material has an index of refraction greater than about 1.4, or greater than about 1.45.

In various embodiments of the present invention, a flexible membrane or diaphragm may be disposed within a portion of a housing or substrate 165 to accommodate expansion and contraction of the atmosphere within the sealed region that may occur during storage and/or operation, for example as a result of changes in temperature or altitude. In various embodiments of the present invention, all or a portion of a housing or substrate 165 has sufficient flexibility to accommodate such expansions and contractions of the atmosphere within the sealed region.

In various embodiments of the present invention, undesirable changes in one or more optical characteristics may occur if top housing 210 substantially changes the transmission, absorption and/or reflection of light at the emission surface of LEE 140, and this may be of particular concern when LEE 140 includes, consists essentially of, or consists of a phosphor-converted LEE or LED. As discussed herein, this may occur in various configurations or geometric arrangements of LEE 140 and top housing 210. The optical characteristics may include, but are not limited to, one or more of intensity, correlated color temperature (CCT), color point, color rendering index (CRI), R9, spectral power distribution, spatial intensity distribution, and angular color uniformity.

In various embodiments, phosphor-converted LEEs include a pump source and a wavelength-conversion material surrounding all or a portion of the pump source. The pump source produces radiation in a first radiation range; a portion of that radiation is absorbed by the wavelength conversion material and re-emitted at a second wavelength range different from the first wavelength range and the combination of the first and second wavelengths are what is observed. In some cases, all or substantially all of the pump radiation is absorbed by the wavelength-conversion material.

Phosphor-converted LEDs typically use a LED chip and a phosphor for the pump source and the wavelength-conversion material. In white-emitting phosphor-converted LEDs, the LED typically has a relatively narrow emission in the UV and/or blue wavelength range and the phosphor has a relatively broad emission in the yellow-red range, the combination of these appearing as white light. Changes in the ratio of the intensity of the blue and converted light may thus result in a change in the observed color.

In typical white LEDs, the blue chip has a Lambertian intensity distribution while the phosphor (which may be, e.g., phosphor particles suspended in a transparent material such as silicone or epoxy) has an isotropic intensity distribution. This difference in spatial intensity distribution typically results in an angular non-uniformity of the observed color. As will be discussed herein, in various embodiments of the present invention interaction with top housing 210 may modify the relative intensities of the pump light and converted light and/or modify their intensity distributions, leading to undesirable changes in one or more optical characteristics of the lighting system. In particular this may lead to undesirable changes in the color, color point, or correlated color temperature (CCT).

FIG. 3A shows a cross-sectional schematic of a generic phosphor-converted LED 310 including, consisting essentially of, or consisting of a blue-emitting chip 320 and a phosphor 330 (details of the LED package and electrical connections within the package are not shown for clarity). As will be understood by those skilled in the art, there are many different configurations of phosphor-converted LEEs and the structures shown in FIG. 3A-3C are used to demonstrate general characteristics of these devices and are not limiting to the present invention.

A portion of blue light 350 generated by blue chip 320 is absorbed by phosphor 330 and is converted to yellow/red light 355, exiting LEE 310 as light 356. A second portion of blue light 350, identified as light 350', reaches the top surface of phosphor 330, exits the package without being absorbed by phosphor 330, and is identified as light 351. A third portion of blue light 350, identified as 350", is reflected back from the top surface of phosphor 330, and is identified as light 352. Blue light 352 may be absorbed by phosphor 330, reflected back out of the package, or absorbed within the package. Reflection at the interface between phosphor 330 and air occurs because of the different indices of refraction of these materials. Typically, phosphor materials have an index of refraction in the range of about 1.3 to about 1.6, while air has an index of refraction of about 1. As described by Snell's Law, the difference in indices of refraction on opposite sides of an interface determines a critical angle, above which light incident on the interface is reflected—this is known as total internal reflection (TIR).

In various embodiments of the present invention, the phosphor-air interface is replaced by a phosphor-top housing interface, for example as shown in FIG. 3B, and in various embodiments this may also change the optical properties of the lighting system. The top housing 353 has a different index of refraction than air (typically higher), and thus the amount and/or spatial distribution of the blue and converted light may be changed, leading to a change in optical properties, particularly color. Typically, blue light TIR is reduced because the refractive index difference between the phosphor and the transparent layer is less than that between the phosphor and air, and consequently more blue light is extracted out of the LED. The greater amount of extracted blue light results in a higher CCT, as described with reference to FIG. 3B. As shown in FIG. 3B, a portion of blue light 350 generated by blue chip 320 is absorbed by phosphor 330 and is converted to yellow/red light 355, exits LEE 310 as light 356 and is transmitted through top housing 353 as light 356, and exits the system as light 356'. A second portion of blue light 350, identified as 350', reaches the top surface of phosphor 330, exits LEE 310 without being absorbed by phosphor 330, is identified as light 351, and is transmitted through top housing 353 and exits the system as light 351'. A third portion of blue light 350, identified as 350", rather than being reflected back from the top surface of phosphor 330 as is the case in FIG. 3A, is transmitted through the top housing 353 as light 354 and exits the system as light 354'.

While FIG. 3B shows all light being transmitted through top housing 353, this may not always occur; in some cases light may be reflected from top housing 353, for example as shown in FIG. 3C. FIG. 3C shows blue light 350', exiting the LEE as blue light 351, reflecting off of housing 370, the reflected light identified as light 360, re-entering the LEE as light 361, being absorbed by phosphor 330 and re-emitting as light 362. Without housing 370 in place, the emitted light is blue, while with housing 370 in place the emitted light is the converted light, thus reducing the observed CCT.

In various embodiments of the present invention, it may be desirable for the top housing to have relatively minimal or no impact on the optical characteristics of the system. In various embodiments of the present invention, the optical impact of the top housing may be minimized or eliminated by various techniques. In various embodiments of the present invention, the top housing may be configured such that it does not change or does not substantially change the transmission and/or reflection of light at the emission surface of LEE 140. In various embodiments, this may be accomplished by spacing the top housing apart from the LEEs, thus eliminating direct optical coupling (formation of a layer in direct contact with the emitting surface of the LEE having an index of refraction substantially different from that of air, or substantially larger than 1, for example less than about 1.1) between the two that may result in modification of the optical characteristics of the light emitted by the LEEs, as discussed with reference to FIGS. 3A and 3B. For example, in various embodiments of the present invention the region under the top housing may include, consist essentially of, or consist of air or a gas or a partial or complete vacuum.

As shown in FIG. 3C, even if the top housing is spaced apart from the LEE, changes may occur by virtue of light reflecting off of the top housing and re-entering the LEE. Re-entry of previously emitted light may be reduced or eliminated by, for example, appropriate design of the shape and spacing of the top housing. For example, as described herein with reference to FIG. 3C, blue light 350' exits the LEE as blue light 351, reflecting off of housing 370, the reflected light identified as light 360, re-entering the LEE as light 361, being absorbed by phosphor 330 and re-emitting as light 362. Thus, reflection from housing 370 results in a reduction in the observed CCT. Referring to FIG. 3D, which schematically shows housing 370' having a different shape, blue light 350' exits the LEE as blue light 351, reflecting off of housing 370'. The reflected light identified as light 360', instead of re-entering the LEE as shown in FIG. 3C, is incident on the region adjacent to the LEE (for example the substrate) and is reflected as light 361, which exits the lighting system without re-entering the LEE and being re-absorbed and color or wavelength shifted by phosphor 330.

FIG. 3E shows a schematic of a differently shaped housing 370", again resulting in light 360" that is reflected off of housing 370" not re-entering the LEE the LEE and being re-absorbed and color or wavelength shifted by phosphor 330.

Using known optical design techniques, and without undue experimentation, the shape of housing 370 may be designed in conjunction with the light-distribution pattern of the LEE to eliminate, substantially eliminate, or significantly reduce the amount of light that is reflected from housing 370, or any other features in the lighting system, back into the LEE. In various embodiments, it may be desirable to form top housing 210 in such a way that it is in contact with the emitting surface of LEE 140 (for example where top housing includes, consists essentially of, or consists of a conformal coating), and in such cases the change in optical characteristics may be minimized or eliminated by, for example, choice of material and thickness of material. For example, lighting system 400 of FIG. 4 includes a top housing 410 in contact with LEEs 140. In various embodiments, top housing 410 may include, consist essentially of, or consist of a conformal coating, for example silicone, polyurethane, TPU, EVA, or the like. Using a material with an index of refraction that is matched to or substantially matched to that of the phosphor (typically this is the index of refraction of the binder in which the phosphor particles are suspended, typically silicone or epoxy), will in various embodiments minimize the impact of the differing indices of refraction. In addition, the impact of differing indices of refraction may be reduced by reducing the thickness of top housing 210.

Table 1 below shows the measured CCT change for three different top housing thicknesses in an optically coupled structure similar to that shown in FIG. 4. In this example, LEEs 140 are conformally coated with TPU and the measurements are performed in an integrating sphere. As shown in Table 1, there is a relatively significant increase in CCT for TPU thicknesses between about 15 mil and about 25 mil, and then a much larger increase for a TPU thickness of about 50 mil. As also shown, the CCT increase is larger for higher starting CCT values.

TABLE 1

| CCT | TPU Thickness (mil) | CCT Change (K) | CCT Change (%) |
|---|---|---|---|
| 2700 | 15 | 180 | 7% |
|  | 25 | 220 | 8% |
|  | 50 | 582 | 22% |
| 4000 | 15 | 436 | 11% |
|  | 25 | 495 | 12% |
|  | 50 | 1431 | 36% |

Table 2 below shows the measured CCT change for a non-optically coupled structure similar to that shown in FIGS. 2A-2G. In this example, top housing 210 is PET and has a thickness of about 100 μm and the measurements are performed in an integrating sphere. As shown, the change in CCT is relatively smaller than for the configuration discussed in reference to Table 1 and the change is also in the opposite direction. In this configuration, the CCT decreases slightly because of re-entry and re-emission of light from LEE 140.

TABLE 2

| CCT | CCT Change (K) | CCT Change (%) |
|---|---|---|
| 2700 | −48 | −1.7% |
| 5700 | −215 | −3.6% |

In various embodiments of the present invention, the configuration and material of top housing 210 may be chosen to minimize the impact on the optical characteristics of LEE 140 by following the overall principle of minimizing changes in the reflection and transmission of light at the light emission interface of LEE 140. For example, top housing 210 may be chosen to have a high transparency to a wavelength of light emitted by LEE 140, to minimize light reflection from top housing 210 back into LEE 140. In various embodiments of the present invention, top housing 210 may have a transmittance of a wavelength of light emitted by LEE 140 of at least about 75% or at least about 85%, at least about 95% or at least 98%. In various embodiments of the present invention, all or portions of the interior surface of top housing 210 may be coated with an anti-reflection coating designed to minimize or eliminate reflection of light within the wavelength range of light emitted by LEE 140. In various embodiments of the present invention, top housing 210 may be shaped to minimize or eliminate reflection of light from top housing 210 back into LEE 140. Any of these techniques may be used alone or in combination or with other techniques for minimizing changes in the reflection and transmission of light at the light emission interface of LEE 140.

In various embodiments of the present in invention, the lighting system may be cut or separated into more than one portion, with at least one or the cut portions retaining operability, as described in detail in the '807 and '027 applications and U.S. patent application Ser. No. 14/699, 149, filed on Apr. 29, 2015 (the '149 application), the entire disclosure of which is incorporated by reference herein. In various embodiments, all cut portions may retain operability. Referring to FIG. 2A, if lighting system 200 is cut or separated at cut line 290, the edge of conductive trace 160 may be exposed at the separation interface, that is at the cut line. In various embodiments of the present invention, it may be acceptable to leave the relatively small cross-sectional area of the conductive traces exposed; however, in other embodiments this may not be desirable.

Various techniques may be used to seal the edges of exposed conductive traces. For example, in various embodiments of the present invention the exposed edges of the conductive traces may be covered by a tape, gel, adhesive, silicone rubber or other material that is electrically insulating and/or that provides the desired level of protection, for example weather proof, water proof, IP65, or IP67, or the like. In various embodiments of the present invention, a clip, cover, extrusion, or sleeve may be positioned over the exposed conductive trace edges after cutting. In various embodiments, such a clip may include, consist essentially of, or consist of silicone or polyurethane and may also employ gel insulation in the extrusion to improve the seal.

Figure 5:
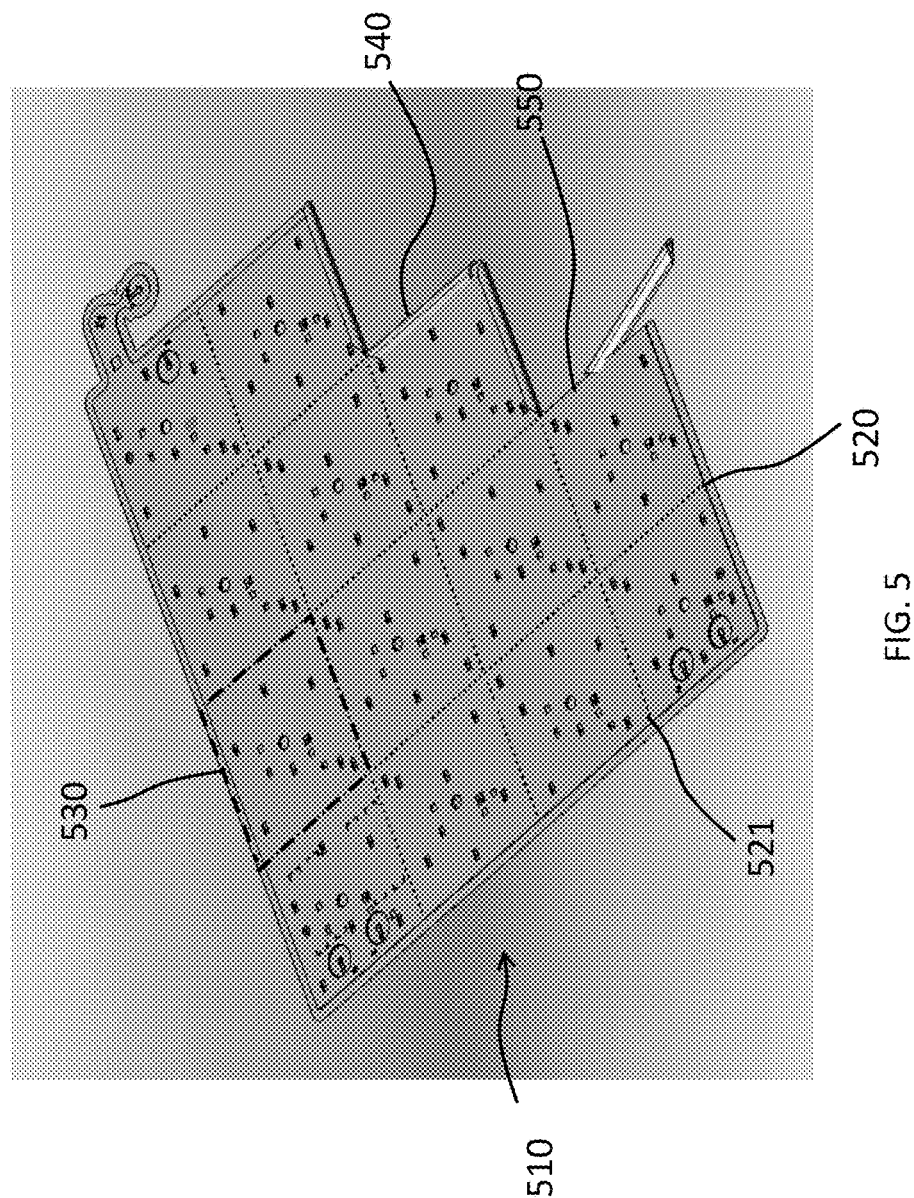
FIG. 5 is a schematic of a lighting device in accordance with various embodiments of the invention.

FIG. 5 shows an example of a sealed lighting system in accordance with various embodiments of the present invention that includes cuttable or separable light sheet 510 having an array of cut lines 520 and 521 defining a 4×4 array (16 in total) of elements 530 that may be removed as required. FIG. 5 shows three elements 530 removed from one corner of light sheet 510 and clips or covers 540 covering all or a portion of cut edge 550. In various embodiments of the present invention, covers 540 may cover all or substantially all of cut edge 550; however, this is not a limitation of the present invention, and in other embodiments cover 540 may cover only a portion of cut edge 550, for example the portion of cut edge 550 that includes an exposed edge of a conductive trace. Various embodiments of the present invention may include a system that includes, consists essentially of, or consists of multiple sealed light sheets of different sizes and a connector system that matches the environmental or other requirements of the sealed light sheets. In various embodiments of the present invention the luminous flux of each sealed light sheet per unit area may be substantially the same, for example in various embodiments the difference between the luminous fluxes per unit area for the different sized sheets may be less than about 20%, or less than about 10%, or less than about 5%, or less than about 2%.

Such a system may be used to provide even, uniform illumination over different sized and shaped areas, without exposure of any live electrical components or conductors. In various embodiments of the present invention, the multiple sealed tiles and the connector system have the same or substantially the same characteristics with respect to protection from environmental impact, dust, abrasion and the like; however, this is not a limitation, and in other embodiments the characteristics of the sealed light sheets and connector system may be different. For example, the sealed light sheets and the electrical connectors may be designed to meet the desired requirements for water resistance, water proofing, dust resistance, or to meet various ingress protection ratings such as IP65, IP67, or the like. In various embodiments, such light sheets may include power conductors to transmit power to adjacent light sheets, while in other embodiments one or more power bus components may be utilized to provide power to multiple light sheets, as described in the '149 application. In various embodiments of the present invention, sealing of the light sheets may use one or more techniques or structures discussed herein, for example sealed with one or more of a top housing, bottom housing, a conformal coating, or the like. The sealing mechanism is not shown in FIGS. 5, 6A-6J and 7A and 7B for clarity.

Figure 6C:
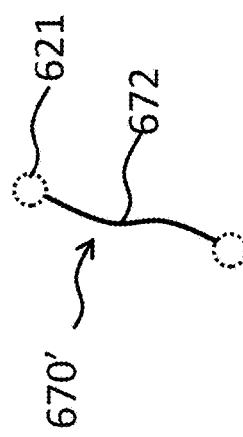
Figure 6D:
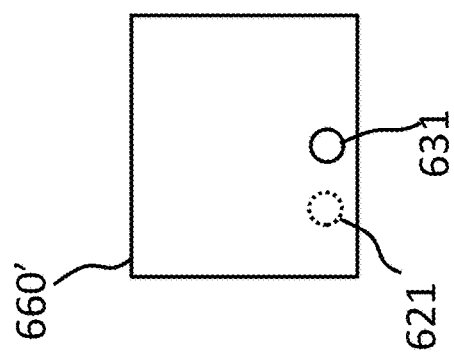

FIG. 6A shows a schematic of a lighting system in accordance with various embodiments of the present invention including or consisting essentially of a sealed light sheet or tile 610 that features electrical connectors 620 and 630 that mate with electrical connectors 621 and 631 respectively. Light sheet 610 also includes an array of LEEs (not shown in FIGS. 6A-6l for clarity) formed over at least a portion of light sheet 610, which are electrically coupled to and energized through the connector system (connectors 620, 621, 630, and 631). In various embodiments, power conductors on the light sheet electrically couple connector 630 to connector 631 on the same sheet (for example, power conductors on the light sheet electrically couple connector 630 to connector 631' on light sheet 610) and electrically couple connector 620 to connector 621 on the same sheet (for example, power conductors on the light sheet electrically couple connector 620 to connector 621' on light sheet 610). Power is utilized from these power conductors to energize LEEs on the light sheet. In an installation of light sheets, power may be provided to one end of a column or set of light sheets (FIG. 6A shows part of a column of light sheets including light sheets 610", 610, and 610'). Such systems are described in detail in the '807, '027, and '149 applications. The LEEs and wiring on light sheet 610 are not shown for clarity, and the specifics of the array size, layout of the array, and electrical connection scheme are not limitations of the present invention. This permits formation of a column of electrically connected light sheets, in which connectors 620 and 630 on light sheet 610 are mated with connectors 621 and 631 respectively on a second light sheet 610" (shown not connected for clarity in FIG. 6A) and connectors 621 and 631 on light sheet 610 are mated with connectors 620 and 630 respectively on a third light sheet 610'.

In FIG. 6A and related figures, connectors 620 and 630 are shown as a relatively smaller circle than connectors 621 and 631, and connectors 620 and 621 are shown with dashed lines. In various embodiments of the present invention, the connectors may be polarized to prevent misconnection. In various embodiments, the connectors may have a gender, for example connectors 620 and 630 may be male connectors while connectors 621 and 631 may be female connectors or vice-versa; however, this is not a limitation of the present invention, and in other embodiments the connectors may have other configurations. In various embodiments, connectors 621 and 631 may be formed on tabs that overlap connectors 620 and 630 (for example tab 602 in FIG. 6A); however, this is not a limitation of the present invention, and in other embodiments the connectors may have other configurations.

Light sheet 610 is composed of a number of elements or sub-units 615; in FIG. 6A, light sheet 610 is a 5×4 array of 20 elements 615 that are defined by orthogonal lines 617 and 619; however, the number, size and/or shape of elements 615 are not a limitation of the present invention, and in other embodiments light sheet 610 may include, consist essentially of, or consist of fewer or more elements 615 that may have different shapes and/or sizes. Each element 615 includes one or more LEEs, and in various embodiments each element 615 has the same number, configuration and physical layout of LEEs; however, this is not a limitation of the present invention, and in other embodiments these may be different. In various embodiments of the present invention, the light intensity and light intensity uniformity is the same or substantially the same for each element 615, such that forming elements 615 adjacent to each other provides uniform intensity over all of the elements 615 with no substantially brighter or darker areas at the interface between adjacent elements 615. As discussed herein, any number or position of elements 615 may be present or not, permitting the lighting system to accommodate penetrations for example for sprinkler heads, light switches, other lighting fixtures, cameras, or the like. The minimum increment of resolution is the element (or "illumination unit cell") 615, and in various embodiments the element 615 size may be increased or decreased as required for the application. In various embodiments, each illumination unit cell 615 corresponds to one or more light-emitting strings, each of which features two or more interconnected LEEs and a control element for regulating the current to the LEEs.

While light sheets 610 in FIG. 6A may be utilized to provide a sealed lighting system in accordance with embodiments of the present invention, for example the use of a top and or bottom housing as well as connectors designed to meet the sealing requirements (e.g., IP54, IP65, IP67, or the like, as discussed herein), separation of such a lighting system into smaller units may result in the exposure of one or more conductive traces within lighting system 610 to the ambient environment. As discussed above, in various embodiments it may be advantageous to be able to provide a system that may be shaped and sized without exposure of conductive traces or other conductive elements.

FIG. 6B shows a schematic of an embodiment of the present invention that includes sealed light sheet 610 as described in reference to FIG. 6A, and in which light sheet 610 is electrically coupled to a power distribution system 640 that includes multiple connectors 620 and 630. In various embodiments of the present invention, all connectors 620 on power distribution system 640 are electrically coupled together (but not to connectors 630), and all connectors 630 on power distribution system 640 are electrically coupled together (but not to connectors 620). Power is provided to power distribution system 640 from connectors 620 and 630 on light sheet 610 to connectors 620' and 630' on power distribution system 640 through jumpers 670 (only one jumper 670 is shown for clarity; unconnected jumper 670' is also shown in FIG. 6C). In various embodiments jumper 670 includes, consists essentially of, or consists of a conductor or wire 672 electrically coupled at one end to a first connector and electrically coupled at an opposite end to a second connector. In various embodiments, the gender of the first connector may be different from the gender of the second connector; however, in other embodiments the connector gender at each end of the wire may be the same, or one or both connector may not be present. The power is then transferred through connectors 620 and 630 on power distribution system 640 to sub-tiles 660, 662 and 664, to energize LEEs on the sub-tiles.

In various embodiments of the present invention, each sub-tile includes, consists essentially of, or consists of an integer number of elements 615 (FIG. 6A), for example sub-tiles 660 and 660' include, consist essentially of, or consist essentially of one element 615, sub-tile 664 includes, consists essentially of, or consists of two elements 615, and sub-tile 662 includes, consists essentially of, or consists of three elements 615. The connectors on the sub-tiles mate with connectors on power distribution system 640, providing power to the LEEs on that element. As discussed with reference to FIG. 6A, in various embodiments of the present invention each element has the same or substantially the same light intensity and light intensity uniformity; in addition, disposing or locating elements adjacent to each other provides uniform intensity over all of the elements with no substantially brighter or darker areas at the interfaces between adjacent elements. Sub-tile 660' is shown in unconnected form in FIG. 6D, while sub-tiles 660, 662 and 664 are shown as connected in FIG. 6B. As shown in FIG. 6B, sub-tiles with varying number of elements may be used to form a wide variety of uniformly illuminated shapes, to permit uniform illumination of a wide range of features or structures. While not shown for clarity, the components of the system shown in FIG. 6B are sealed as detailed herein (i.e., with a top housing and/or a bottom housing), for example including power distribution system 640, jumpers, connectors, and sub-tiles.

FIG. 6E shows an example of a variation of the system shown in FIG. 6B in accordance with various embodiments of the invention. In the case of the system of FIG. 6E, the jumper system is replaced by connectors. While FIG. 6E shows the connectors that replace the jumpers as being the same as those that connect the light sheets or sub-tile elements, this is not a limitation of the present invention, and in other embodiments other connectors may be used. In the system of FIG. 6E, light sheet 610 includes connectors 621 and 631 that mate and electrically couple with connectors 620' and 630' on power distribution system 641. In various embodiments of the present invention, all connectors 620 on power distribution system 641 are electrically coupled together (but not to connectors 630) and all connectors 630 on power distribution system 641 are electrically coupled together (but not to connectors 620). Power is provided to power distribution system 641 from connectors 621 and 631 on light sheet 610 to connectors 620' and 630' on power distribution system 640 (power distribution system 641 in FIG. 6E is shown disconnected from light sheet 610, for clarity). Tile elements are connected to power distribution system 641 in a similar fashion as that described in reference to FIG. 6B. While not shown for clarity, in various embodiments the components of the system shown in FIG. 6E are sealed as detailed herein (i.e., utilizing a top housing and/or a bottom housing), for example including power distribution system 641, jumpers, connectors, and sub-tiles.

In various embodiments of the present invention, the systems of FIGS. 6B and 6E may be used to provide uniform intensity illumination over areas having different shapes and sizes, for example over shape 605 shown in FIG. 6F. In various embodiments, shape 605 may be defined by its application, for example back lighting a sign, in a piece of furniture, a luminous wall or ceiling, or the like. In various applications, it may also be necessary to be able to accommodate one or more penetrations or areas without light within the shape, not just at the edge, for example to remove all or a portion of light sheet 610 (the area in which all or a portion of the light sheet is removed is identified as 613') in FIG. 6F, leaving illuminated portion 613, as shown in FIG. 6G. Note that in various embodiments all or portions of power distribution system 642, 642' may be positioned within non-illuminated portion 613'.

FIG. 6H shows a schematic of a lighting system in accordance with various embodiments of the present invention designed to accommodate the need for penetrations or empty areas in the lighting system, without exposed conductors, as may be produced by cutting a light sheet into two or more portions. The configuration shown in FIG. 6H is designed to remove all or portions of the light sheet in area 613' and leave illuminated portion 613, as shown in FIG. 6G; however, this is not a limitation of the present invention and as will be discussed herein, different illuminated portions or non-illuminated (e.g., no light sheet present) portions and shapes may be produced. In various embodiments of the present invention, the system of FIG. 6H includes, consists essentially of, or consists of power distribution systems 642 and 642' and various sub-tiles. The lighting system of FIG. 6H includes sub-tiles 680 and 683 while FIG. 6I shows a set of sub-tiles 680, 681, 682, 683 and 684. FIG. 6I also shows power distribution system 642'. Note that in various embodiments of the system there are two different power distribution systems for the left and right side, identified as 642' and 642 respectively in FIG. 6H. In the example shown in FIGS. 6H and 6I, the connector order for sub-tile connectors is reversed in power distribution system 642 compared to power distribution system 642' to permit connection of the same sub-tiles to both power distribution systems; however, this is not a limitation of the present invention, and in other embodiments other connector configurations may be used. In various embodiments, a full set of sub-tiles includes sub-tiles with the full complement of elements along the width of tile 610. In the example of FIGS. 6H and 6I, tile 610 has five elements across its width and a full complement of sub-tiles includes five sub-tiles with one, two, three, four, and five elements each, as shown in FIG. 6I; however, this is not a limitation of the present invention, and in various embodiments sub-tiles may have any shape or size.

Referring to FIG. 6H, power distribution systems 642 and 642' electrically connect light sheet 610" to light sheet 610' to transmit power from light sheet 610" to light sheet 610'. In addition, all connectors 620 on power distribution systems 641 and 642' are electrically connected together and all connectors 630 on power distribution systems 641 and 642' are electrically connected together. This permits energization of sub-tiles by connecting them to a pair of connectors 620, 630 through connectors 631 and 621 on the sub-tiles. While FIG. 6H shows both power distribution systems 642 and 642', this is not a limitation of the present invention, and in other embodiments only one may be utilized; for example, in FIG. 6F no sub-tiles are connected to power distribution system 642' so it may be removed. In this case, power to light sheet 610' is provided solely through power distribution system 642. In the example shown in FIG. 6H, sub-tile 683 includes four elements (as shown by the dashed element designation lines 617 and 619), while sub-tile 680 includes one element. With this arrangement any number or position of elements may be present or not, permitting the lighting system to accommodate penetrations for example for sprinkler heads, light switches, other lighting fixtures, cameras, or the like. The minimum increment of sub-tile is the element, and in various embodiments the element size may be increased or decreased as required for the application. While not shown for clarity, in various embodiments the components of the system shown in FIGS. 6H and 6I are sealed, for example including power distribution system 642 and sub-tiles.

FIG. 6J shows a schematic of an embodiment of the present invention designed to accommodate the need for penetrations or empty areas in the lighting system, without exposed conductors, as may be produced by cutting a light sheet into two or more portions. In contrast to the system of FIGS. 6H and 6I, the system of FIGS. 6J and 6K only uses sub-tiles and does not use power distribution systems. FIG. 6K shows a full complement of sub-tiles for a system having five elements across the width of the light sheet, including sub-tiles 690, 691, 692, 693 and 694, having one, two, three, four, and five elements each respectively. As discussed herein, an element is an area of a light sheet 610 and in the example shown in FIG. 6J, each element is defined by lines 617 and 619, resulting in a 4×5 array for a total of 20 elements. The size of each element and thus the resolution or granularity of the system may be changed by using fewer or more elements, for example a 4×4 array, a 5×5 array, or the like.

In the example of FIG. 6J, each tab has one connector positioned on it, in contrast to the systems of FIGS. 6H and 6I, in which the two complementary connectors are positioned on one tab. By complementary, it is meant that in a system energized by a typical voltage or current, there are positive and negative terminals and these may correspond to connectors 621 and 631 respectively or connectors 620 and 630 respectively. In various embodiments, other energization schemes may be utilized, which may have more than just one positive and one negative line, in which case the number of connectors may be modified accordingly. For example, systems that may accommodate white color tuning, color tuning, or full color ability, or that incorporate addressability the ability to selectively energize portions of the system, may utilize more than two complementary connectors. While FIGS. 6J and 6K show one connector per tab, this is not a limitation of the present invention, and in other embodiments more than one connector may be positioned on a tab.

The system of FIG. 6J includes, consists essentially of, or consists of two two-element sub-tiles 691 and 691', two one-element sub-tiles 690 and 690', one three-element sub-tile 692, and one five-element sub-tile 694. Use of the different sub-tile sizes permits configuring a system with sub-tiles in any of the element areas. While not shown for clarity, the components of the system shown in FIGS. 6J and 6K are sealed as detailed herein (i.e., via use of a top housing and/or bottom housing).

FIG. 6L shows an example of a system in accordance with embodiments of the present invention in which all sub-tiles have a size of one element area and the desired configuration is formed from multiple single element sub-tiles. In various embodiments of the present invention, the difference in the luminous flux per unit area of all of the different size sub-tiles is less than about 20%, or less than about 10%, or less than about 5%, or less than about 2%.

In various embodiments, the single element sub-tiles may be connected by jumpers 692 and/or by connectors. In the example shown in FIG. 6L, the system is configured to accommodate two circular penetrations, identified as 693 and 693'; however, any configuration with single-element resolution may be achieved by different arrangements of single-element sub-tiles. While not shown for clarity, the components of the system shown in FIG. 6L are sealed. LEEs 140 are shown in the system of FIG. 6L. For example, sub-tile 691 includes, consists essentially of, or consists of four LEEs 140; however, the number of LEEs on a tile or sub-tile is not a limitation of the present invention, and in other embodiments tiles and sub-tiles may include fewer or more LEEs 140.

In various configurations, not all of the connectors are actually connected to another sub-tile or light sheet. For example, in FIG. 6J connectors 621 and 631 on sub-tile 691' are not connected in this example, as there is no sub-tile "above" them. In various embodiments of the present invention such non-connected connectors may be sealed in a permanent or reversible manner, for example to provide the same level of sealing as the remainder of the system or to provide the same or different level of ingress protection. In various embodiments, one or more connectors may be sealed using a liquid or gel sealant, for example polyurethane, silicone, RTV or the like; for example, the connector, and in some embodiments all or a portion of the tab on which the connector is disposed, is coated with the sealant to prevent exposure of the connector to the ambient environment. In various embodiments, one or more connectors may be sealed with a cap that covers substantially the entirety of the one or more connectors. FIG. 6M shows an example of a cap system 695 in accordance with embodiments of the present invention that includes, consists essentially of, or consists of cap 696 and cap 697 mechanically joined by connector 698. In various embodiments, cap 696 and 697 may be sized to provide a seal to the electrical connectors on the light sheets. For example, in various embodiments cap 696 and 697 may have the same size or may have different sizes (as shown in FIG. 6M). While FIG. 6M shows a cap system 695 having two caps 696 and 697 that may mate to, for example connectors 621 and 632 on sub-tile 690 of FIG. 6K, this is not a limitation of the present invention, and in other embodiments cap system 695 may include, consist essentially of, or consist of one cap or more than two caps. In various embodiments, cap system 695 may be manufactured by various means, for example additive manufacturing such as printing, injection molding or the like. In various embodiments, cap system 695 may include or consist of materials such as silicone, polyurethane, TPU, rubber, or the like.

While the systems described with reference to FIGS. 6A-6L show rectangular sub-tiles, this is not a limitation of the present invention, and in other embodiments other size sub-tile shapes may be utilized, for example circular, triangular, pentagonal, hexagonal, trapezoidal or any arbitrary shape. As noted in reference to FIGS. 6A-6M, in various embodiments light sheets 610 may have one or two connector pairs; however, this is not a limitation of the present invention, and in other embodiments light sheets 610 may have other numbers of connector pairs, or connectors may not be configured in pairs. As noted in reference to FIGS. 6A-6M, in various embodiments light sheets 610 may have connectors formed on one or more tabs; however, this is not a limitation of the present invention, and in other embodiments light sheets 610 may have no tabs, more than two tabs, or may have connectors formed on any portion of the light sheet. In various embodiments, connectors may be formed on a sub mount such as a circuit board, which may be disposed on light sheet 610. In various embodiments of the present invention, one or more connectors may be replaced by jumpers or jumper wires.

Figure 7B:
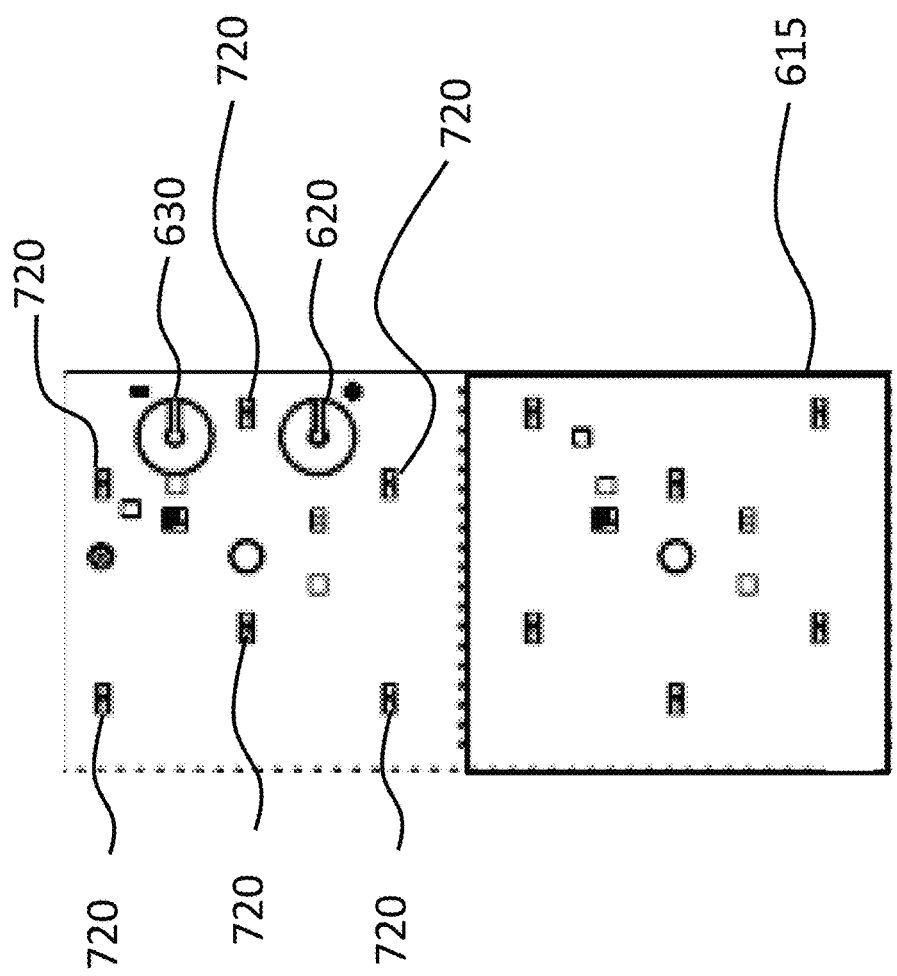
FIG. 7B is a schematic plan view of a portion of a lighting system in accordance with various embodiments of the invention.

FIG. 7A shows an example of a light sheet in accordance with embodiments of the present invention (the seal for the light sheet in FIG. 7A and 7B is not shown for clarity). Light sheet 710 in FIG. 7A includes, consists essentially of, or consists of a substrate 730 on which are disposed or mounted LEEs 720 and connectors 620, 621, 630, and 631. In various embodiments, on a light sheet, connectors 620 and 621 are electrically coupled and connectors 630 and 631 are electrically coupled, but connectors 620 and 621 are not electrically coupled to connectors 630 and 631. Light sheet 710 also includes multiple conductive traces providing the electrical connection between connectors 620 and 621 and between connectors 630 and 631 (these conductive traces are also identified as power conductors) and other conductive traces interconnecting LEEs 720 and connecting LEEs 720 to the power conductors (conductive traces and power conductors not shown for clarity). In various embodiments, LEEs 720 may be electrically connected in series within each element 615; however this is not a limitation of the present invention, and in other embodiments LEEs 720 may be electrically connected in parallel or a series/parallel arrangement or any configuration within each element 615. In various embodiments, LEEs 720 within each element 615 may be separately powered from the power conductors, while in other embodiments LEEs 720 from two or more elements 615 may be electrically coupled together and then electrically coupled to the power conductors. The electrical and/or physical configuration of LEEs 720 within an element 615 or on light sheet 710 is not a limitation of the present invention.

FIG. 7B shows an expanded view of two elements 615 from the upper right corner of light sheet 710 of FIG. 7A. Each element 615 includes six LEEs 720; however, this is not a limitation of the present invention, and in other embodiments an element may include fewer or a larger number of LEEs 720. LEEs 720 are arranged in two staggered columns, with each column containing three LEEs 720; however, this is not a limitation of the present invention, and in other embodiments LEEs 720 may be positioned in a different configuration. The configuration of LEEs 720 is not a limitation of the present invention.

In various embodiments of the present invention, each element may additionally include a current control or current regulating circuit. In various embodiments, the circuit may be designed or configured to provide a constant or substantially constant current to LEEs 720, for example within each element 615 or on light sheet 710, as described further in the '807 and '027 applications.

As discussed herein, the systems discussed in reference to FIGS. 5, 6A-6M, and 7A and 7B provide for the ability to produce uniform or substantially uniform intensity over arbitrary shapes and sizes using lighting system of the present invention without any exposed conductors.

In various embodiments of the present invention, embodiments of the present invention may additionally include one or more optical elements to control one or more optical characteristics, for example luminous or radiant flux, CCT, CRI, R9, spectral power distribution, light-distribution pattern, angular color uniformity, or the like. FIG. 8A shows a cross-sectional schematic of lighting system 800 in accordance with various embodiments of the present invention, in which the optic includes an optic substrate 810 having multiple optical elements 820 on one side of optic substrate 810 and a second side (or "face") 813 opposite the first side that is substantially flat and positioned adjacent to or in contact with substrate 165 and/or conductive traces 160. In various embodiments, optic elements 820 may be spaced apart from LEEs 140, as shown in FIG. 8A; however, this is not a limitation of the present invention, and in other embodiments optical elements 820 may be in contact with LEEs 140. For example, in various embodiments of the present invention, optic elements 820 may include indentations into which fit one or more LEEs 140, for example as in lighting system 810 shown in FIG. 8B.

FIG. 8C shows a cross-sectional schematic of lighting system 802 in accordance with various embodiments of the present invention, in which multiple individual optical elements 820' are positioned over LEEs 140. In contrast to the lighting systems of FIGS. 8A and 8B, lighting system 802 does not include optical substrate 810.

Optic substrate 810 and/or optic elements 820 may be attached to the underlying structure using a variety of techniques, for example using an adhesive, glue, heat-activated adhesive, mechanical fasteners, adhesive tape, a hot melt adhesive, TPU, EVA or the like. In various embodiments of the present invention, double-sided tape, such as 3M 467MP may be used to affix optic substrate 810 and/or optical elements 820 to the underlying structure and/or to form the seal. In various embodiments of the present invention, a liquid adhesive, such as Dymax 3099, may be used to affix optic substrate 810 and/or optical elements 820 to the underlying structure and/or to form the seal. In various embodiments of the present invention, optic substrate 810 and/or optical elements 820 may replace or partially replace top housing 210 and provide a seal to the underlying structure.

Optical elements 820 may all be the same or may be different from each other. Optical elements 820 may include, consist essentially of, or consist of, e.g., a refractive optic, a diffractive optic, a TIR optic, a Fresnel optic, or the like, or combinations of different types of optical elements. Optical elements 820 may be shaped or engineered to achieve a specific light-distribution pattern from the array of light emitters, phosphors and/or optical elements.

In various embodiments of the present invention one optical element 820 is associated with each LEE 140, while in other embodiments multiple LEEs 140 are associated with one optical element 820, or multiple optical elements 820 are associated with a single LEE 140, or no engineered optical element is associated with any LEEs 140, for example portions of optic substrate 810 thereover may merely be flat or roughened surfaces. In various embodiments, the optical elements 820 scatter, diffuse, and/or spread out light generated by LEEs 140.

FIGS. 8A-8C show the axis of each optical element 820 as substantially aligned with the center of a LEE 140; however, this is not a limitation of the present invention, and in other embodiments optical element 820 may be shifted in one or more lateral directions with respect to a LEE 140, as detailed in U.S. Patent No. 8,746,923, filed Dec. 4, 2012, the entire disclosure of which is incorporated by reference. It should be noted that alignment, as used herein, may mean that the center of one structure, for example a LEE 140, is aligned with the center of another structure, for example an optical element 820; however, this is not a limitation of the present invention, and in other embodiments alignment refers to a specified relationship between the geometries of multiple structures.

Optical substrate 810 may be substantially optically transparent or translucent. For example, optical substrate 810 may exhibit a transmittance or reflectance greater than about 70%, or greater than 80%, or greater than 90% or greater than 95% for optical wavelengths ranging between about 400 nm and about 700 nm. Optical substrate 810 may include, consist essentially of, or consist of a material that is transparent to a wavelength of light emitted by LEEs 140, for example having a transmittance greater than about 75%, or greater than about 85% or greater than about 95% to a wavelength of light emitted by LEEs 140. Optical substrate 810 may be substantially flexible or rigid. Optical elements 820 may be formed in or on optical substrate 810. For example, optical elements 820 may be formed by etching, polishing, grinding, machining, molding, embossing, extruding, casting, or the like. The method of formation of optical elements 260 is not a limitation of embodiments of the present invention.

Lighting systems in accordance with various embodiments of the present invention may have a thickness in the range of about 1 mm to about 50 mm, or in the range of about 2 mm to about 25 mm or in the range of about 2 mm to about 10 mm.

Lighting systems in accordance with various embodiments of the present invention may have a relatively light weight, for example having a weight per area of less than about 5 kg/m$^2$, or less than about 3 kg/m$^2$ or less than about 1.5 kg/m$^2$. It should be noted that the weights described herein do not necessarily include a driver that drives LEEs 140.

Relatively lightweight lighting devices have several advantages. First, they reduce the weight load on the building, potentially permitting a reduction in new construction costs. Second, they are easier to handle and install. In some embodiments of the present invention, a lightweight lighting device may be installed, either temporarily or permanently, using hook-and-loop fasteners, adhesive, tape, dry wall hangers, nails, screws, or the like. Third, shipping costs typically depend on size and weight. The reduced weight of lighting devices of embodiments of the present invention may thus reduce shipping costs. The relatively thin profile of lighting devices of embodiments of the present invention permits increased shipping density, for example more lighting devices per shipping box or pallet, also resulting in lower shipping and storage costs. In some embodiments, lighting devices or ribbed lighting devices of embodiments of the present invention may be designed to stack relatively tightly, with little need for additional space or packing material for protection.

In various embodiments of the present invention the lighting systems, for example including a top housing, an optical substrate and/or optical elements, may be flexible or substantially flexible, for example having a radius of curvature of less than about 500 cm or less than about 250 cm or less than about 100 cm or less than about 50 cm.

Lighting systems in accordance with various embodiments of the present invention may be manufactured in a variety of ways. FIG. 9 shows a flow chart of a process 900 for forming in accordance with various embodiments of the present invention. Process 900 is shown having six steps; however, this is not a limitation of the present invention, and in other embodiments the invention has more or fewer steps and/or the steps may be performed in different order. In step 910, a light sheet is provided. In step 920, housing material is provided, e.g., as a single piece or multiple pieces of material. In step 930, one or more pieces of housing (i.e., housing components) are formed from the housing material. In step 940, an electrical connector is provided. In step 950, the electrical connectors are electrically coupled to the appropriate conductive traces and/or power conductors. In step 960, the housing component(s) and light sheet are mated to form the lighting device. In various embodiments of the present invention, the electrical connectors are mated with the light sheet in step 960; however, this is not a limitation of the present invention, and in other embodiments the electrical connector may be mated with the light sheet in a different step or in a separate step.

FIGS. 10A-10E depict one embodiment of process 900. In this embodiment, a light sheet 110 is provided in step 910, as shown in FIG. 10A. The manufacture of the light sheet 110 includes provision of a substrate 165, forming conductive traces 160 on the substrate 165, attaching and electrically coupling LEEs 140 and optionally other components to the conductive traces 160 and the substrate 165. Additional details may be found herein and in the '807 and '027 applications. However, the specific method of manufacture of light sheet 110 is not a limitation of the present invention, and in other embodiments other methods of manufacture of light sheet 110 may be utilized. For example, in some embodiments light sheet 110 may include, consist essentially of, or consist of an interconnected array of inorganic LEDs, while in other embodiments light sheet 110 may include one or more organic light emitting diode (OLED) elements. In step 920 the housing material is provided. Depending on the specific lighting device structure, this may be one piece of housing material or multiple pieces of housing material. In various embodiments, the material for all housing components is the same, while in other embodiments different housing components may include or consist essentially of different materials. For example, for the device described in reference to FIG. 2A, material for the housing components is provided, as shown in FIG. 10B. FIG. 10B shows of material 1010 that will be used to manufacture top housing 210. In this example material 1010 is clear and has a transmittance to a wavelength of light emitted by LEEs 140 greater than about 90%.

In step 930 the housing components are formed. In various embodiments of the present invention, forming may be cutting to a specific shape, while in other embodiments this may include shaping the material, for example to have a specific three-dimensional shape. In other embodiments of the present invention, step 930 may include applying one or more coatings to the materials provided in step 920. For example, for the device described in reference to FIG. 2A, material 1010 is cut to size and bumps are formed therewithin by thermoforming to form top housing 210, while material 520 is cut to size to form bottom housing 220, as shown in FIG. 10C. The method of cutting, shaping, and/or coating of materials is not a limitation of the present invention. In various embodiments of the present invention, forming the housing may include, consist essentially of, or consist of die cutting one or more materials and laminating and/or adhering two or more layers together.

In step 940 one or more electrical connectors to the light sheet are provided and in step 950 the electrical connectors are attached to the light sheet. FIG. 10D shows connector 1030 attached to conductive trace 160. In various embodiments of the present invention all or a portion of the connectors may also be electrically and/or mechanically coupled and/or attached to appropriate conductive traces on substrate 165 during step 910.

In various embodiments of the present invention, connectors may be attached using a variety of means, for example including soldering, adhesive, conductive adhesive, anisotropic conductive adhesive, crimping, eyeleting or the like. In various embodiments of the present invention, electrical connection includes providing power to light sheet 110, for example to power conductors 120, 121, while in other embodiments communication and/or control signals may also be required to be coupled to light sheet 110. Electrical coupling to the conductive traces or power conductors on light sheet 110 may be accomplished in a variety of ways. In various embodiments of the present invention, electrical coupling to the conductive traces may be accomplished by attaching wires to the appropriate conductive traces. In various embodiments, electrical coupling to the conductive traces may be accomplished by a pressure connection. In various embodiments of the present invention, the connectors have the same or substantially the same or no worse characteristics with respect to ingress protection rating or requirements for the sealed lighting system.

In various embodiments of the present invention, electrical coupling to the conductive traces may be accomplished by attaching one or more wires directly to a conductive element, for example with solder or conductive adhesive or anisotropic conductive adhesive, and such wires are connected together or to other systems using connection systems with the appropriate ingress protection rating. In various embodiments of the present invention, electrical coupling to the conductive traces may be accomplished by attaching one or more wires to a conductive trace by crimping. Various crimp components may be used for this purpose, for example Autosplice TC series or Nicomatic Crimplex series crimp connectors; however, this is not a limitation of the present invention, and in other embodiments other crimp elements may be used. In various embodiments, wires attached to conductive traces 160 are sealed by top housing 210.

In step 960, the housing elements are mated with the light sheet 110 to form the lighting device. FIG. 10E shows the mated structure. Note that in this example, light sheet 110 extends beyond the edge of top housing 210 and electrical connection to conductive trace 160 is made using connector 1030 and that adhesive material 230 optionally forms a seal around connector 1030. FIG. 10E also shows connector 1040 that mates to connector 1030; connector 1040 is a board-to-wire type connector, with wire 1041 electrically coupled to connector 1040; however, this is not a limitation of the present invention, and in other embodiments other types of connectors may be used.

In various embodiments of the present invention, top housing 210 and bottom housing 220 may be joined by lamination, heat welding, high-frequency welding, ultrasonic welding, laser welding, adhesive, glue, tape, or the like. In various embodiments of the present invention, light sheet 110 may be adhered to one or more portions of the housing, for example, top housing element 210 or bottom housing element 220, before mating. In various embodiments of the present invention, light sheet 110 may be taped or glued to a portion of the housing before mating.

In various embodiments of the present invention, lighting devices may be manufactured in sheets or in a roll-to-roll process. FIG. 11 shows one embodiment of the present invention featuring a roll-to-roll process for manufacture of lighting devices; however, this is not a limitation of the present invention, and in other embodiments the process has more or fewer steps and/or the steps may be performed in different order. The exemplary manufacturing process shown in FIG. 11 begins with three material feed streams, although this is not a limitation of the present invention, and in other embodiments fewer or more material feed streams may be utilized.

A feed roll 1110 supplies material 1115 for top housing 210, a feed roll 1120 supplies light sheet 1125 and a feed roll 1150 supplies adhesive material 230. In various embodiments, top housing may be formed before the joining process (formed top housing material is supplied from feed roller 1110); however, this is not a limitation of the present invention, and in other embodiments forming of housing 210 may occur between feed roller 1110 and mating station 1140.

In various embodiments, LEEs may be attached to light sheet material before the joining process (completed light sheet material is supplied from feed roller 1120); however, this is not a limitation of the present invention, and in other embodiments LEE attachment may occur between feed roller 1120 and mating station 1140. In various embodiments, connectors may be attached to light sheet material before the joining process (completed light sheet material with connectors is supplied from feed roller 1120); however, this is not a limitation of the present invention, and in other embodiments connector attachment may occur between feed roller 1120 and mating station 1140.

In various embodiments, adhesive material 230 may require die cutting before the joining process (for example to remove adhesive material in the region of the LEE) and this optional die cutting may be done prior to the joining process (die cut adhesive material is supplied from feed roller 1150); however, this is not a limitation of the present invention, and in other embodiments die cutting may occur between feed roller 1150 and mating station 1140.

Light sheet 110, adhesive material 230 and top housing 1115 are mated together in joining station 1140. Joining station may include various processes such as cold rolling, hot rolling, lamination or the like. In the system shown in FIG. 11 the completed sealed system 1135 in roll form is taken up by take-up roller 1130; however, this is not a limitation of the present invention, and in other embodiments take-up roller 1130 may be replaced by a sheeting system, that cuts the roll material 1135 into sheets or tiles or sub-tiles.

In various embodiments of the present invention, the electrical connection system has the same protection rating, for example IP rating, as the housing, resulting in a system having the desired rating, for example IP 65, IP 66, IP 67, or IP 68.

As discussed herein, other components may be formed on substrate 165 to provide additional functionality to the lighting devices, for example sensors, such as occupancy sensors, light sensors such as light intensity sensors, humidity sensors, fire and/or smoke sensors, communication systems, or the like.

In various embodiments of the present invention, CE 145 or one or more components making up CE 145 may be changed in the manufacturing process without stopping or significantly slowing down the roll-to-roll process, in a similar fashion as that described herein for changing the type of LEE. For example, feed roll 1120 in FIG. 11 may include light sheet 110 with different portions, each portion having a different CE 145 or one or more different components making up CE 145 or a second light sheet 110 having a different CE 145 or one or more different components making up CE 145 may be spliced onto feed roll 1120. In various embodiments of the present invention, CE 145 or the components making up CE 145 may be formed on substrate 165 between feed roll 120 and mating station 1140. In various embodiments of the present invention, the type of CE 145 or one or more components of CE 145 making up CE 145 may be changed during the manufacturing process, without stopping or significantly slowing down the roll-to-roll manufacturing process. In various embodiments of the present invention, the pattern of conductive elements on substrate 165 may be varied during the manufacturing process, for between feed roll 1120 and mating station 1140.

Such embodiments of the invention result in the ability to manufacture large volumes of lighting devices in a roll-to-roll process with a standardized product, with a semi-custom product or with a fully customized product. For example, customization may include different LEEs 140 having different properties, different conductive trace patterns, different pitch or patterns between LEEs, different drive currents for LEEs 140, or different types of material for the housing. For example, housing elements 210, 220 may include, consist essentially of, or consist of different materials, for example a transparent housing element and a diffusing housing element, or a different thickness material for the housing. Customization may also include options for different substrate materials, for example transparent or opaque to a wavelength of light emitted by LEEs 140, or different thickness substrate, different additional elements such as sensors, communication devices, or the like. In an automated system, in one embodiment of the present invention, the desired quantity and parts are programmed into the system, which then manufactures, in a continuous process, a wide range of differentiated or customized lighting devices having different electrical, optical or physical characteristics.

In various embodiments of the present invention, lighting devices may be manufactured entirely or in part by lamination. For example, the housing may be fabricated by lamination, as when a top housing 210 is formed over LEEs 140 and an optional bottom housing 220 by lamination. In the lamination process, a layer is formed and adhered to light sheet 140 over LEEs 140, providing for example mechanical protection and/or electrical protection (covering conductive traces and other electrically active elements), water and/or moisture protection for example to achieve an IP rating, dust protection, and the like.

In various embodiments, the layer of film to be laminated is adhered to the light sheet using a liquid adhesive that is applied to the light sheet or the film or both before mating, or a dry adhesive that is applied to the film or light sheet or both before mating. In various embodiments, lamination may be performed on a sheet basis, while in other embodiments lamination may be performed using a roll-to-roll process.

In various embodiments, control and/or communication signals, either to or from the lighting system, or in two-way communication with the lighting system, may also be enabled in embodiments of the present invention. For example, such signals may include a dimming signal, signals providing sensor output (e.g., from a sensor such as a light sensor, occupancy sensor or the like), connection to a lighting control system (e.g., DALI, DMX or the like), or a facilities management system, a safety system, or the like. In some embodiments of the present invention, such sensors may be incorporated within power supplies or drivers or on light sheet 110, while in other embodiments such sensors may be incorporated externally to light sheets and/or power supplies and drivers.

In various embodiments of the present invention, such signals may provide control information to the lighting system, for example to energize it, to de-energize it, to change the light level (e.g., dimming), to change the CCT, to change the spectral power density, to change the luminous intensity distribution or the like. In some embodiments of the present invention, such signals may provide information about the lighting system, for example a defect or failure in lighting and/or driver, the temperature of the lighting device and/or driver, the location of the lighting device and/or driver, the optical characteristics of the lighting device or the like.

In various embodiments of the present invention, control and/or communication signals may be transmitted to light sheets and/or drivers wirelessly, for example using light-based communication such as infra-red (IR) or ultra-violet (UV) or visible light, radio-based communication, for example WIFI, Bluetooth or the like.

In various embodiments, warning or other annunciation signals may be displayed by the lighting device. In various embodiments of the present invention, light sheet 110 or portions of light sheet 110 or a lighting system may be energized and de-energized to provide a blinking indication. In some embodiments of the present invention, light sheet 110 may be cut or formed into one or more shapes, symbols or letters, to provide additional information or indications. For example light sheet 110 may be shaped into an arrow, a stop sign, a cross, or other shapes. In various embodiments of the present invention, LEEs 140 on light sheet 110 may be positioned to form one or more shapes, symbols or letters, for example an arrow, a "DO NOT ENTER" sign, a no smoking symbol, a no entry symbol, a symbol for fire, or the like.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a continuous or discontinuous spread of wavelengths. An LEE may feature a phosphorescent or fluorescent material, also known as a light-conversion material, for converting a portion of its emissions from one set of wavelengths to another. In some embodiments, the light from an LEE includes, consists essentially of, or consists of a combination of light directly emitted by the LEE and light emitted by an adjacent or surrounding light-conversion material. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein "reflective" is defined as having a reflectivity greater than 65% for a wavelength of light emitted by the LEE on which the contacts are disposed. In some embodiments, an LEE may include, consist essentially of, or consist of an electronic device or circuit or a passive device or circuit. In some embodiments, an LEE includes, consists essentially of, or consists of multiple devices, for example an LED and a Zener diode for static-electricity protection. In some embodiments, an LEE may include, consist essentially of, or consist of a packaged LED, i.e., a bare LED die encased or partially encased in a package. In some embodiments, the packaged LED may also include a light-conversion material. In some embodiments, the light from the LEE may include, consist essentially of, or consist of light emitted only by the light-conversion material, while in other embodiments the light from the LEE may include, consist essentially of, or consist of a combination of light emitted from an LED and from the light-conversion material. In some embodiments, the light from the LEE may include, consist essentially of, or consist of light emitted only by an LED.

One or more non-LEE devices such as Zener diodes, transient voltage suppressors (TVSs), varistors, etc., may be placed on each light sheet to protect the LEEs 140 from damage that may be caused by high-voltage events, such as electrostatic discharge (ESD) or lightning strikes. In one embodiment, conductive trace segments shown in FIG. 1B or 1C between the LEE strings 150 may be used for placement of a single protection device per light sheet, where the device spans the positive and negative power traces, for example power conductors 120,121. These trace segments also serve to provide a uniform visual pattern of lines in the web direction, which may be more aesthetically pleasing than a light sheet with noticeable gaps between LEE strings 150. In a more general sense, in addition to conductive traces 160 that are part of string 150, additional conductive traces 160 that may or may not be electrically coupled to other strings 150 and/or power conductors 120, 121 may be formed on substrate 165, for example to provide additional power conduction pathways or to achieve a decorative or aesthetically pleasing look to the pattern on the light sheet or to provide a communication pathway to one or more CEs 145, for example to provide a control signal to the one or more CEs 145. These trace segments also serve to provide a uniform visual pattern of lines in the web direction, which may be more aesthetically pleasing than a light sheet with noticeable gaps between LEE strings 150.

In one embodiment, an LEE 140 includes, consists essentially of, or consists of a bare semiconductor die, while in other embodiments LEE 140 includes, consists essentially of, or consists of a packaged LED.

In various embodiments, an LEE 140 may include, consist essentially of, or consist of a "white die" that includes an LED that is integrated with a light-conversion material (e.g., a phosphor) before being attached to the light sheet, as described in U.S. patent application Ser. No. 13/748,864, filed Jan. 24, 2013, or U.S. patent application Ser. No. 13/949,543, filed Jul. 24, 2013, the entire disclosure of each of which is incorporated by reference herein.

In various embodiments, LEEs 140 may emit light in a relatively small wavelength range, for example having a full width at half maximum in the range of about 20 nm to about 200 nm. In various embodiments, all LEEs 140 may emit light of the same or substantially the same wavelength, while in other embodiments different LEEs 140 may emit light of different wavelengths. In various embodiments, LEEs 140 may emit white light, for example that is perceived as white light by the eye. In various embodiments, the white light may be visible light with a spectral power distribution the chromaticity of which is close to the blackbody locus in the CIE 1931 xy or similar color space. In various embodiments, white light has a color temperature in the range of about 2000 K to about 10,000 K. The emission wavelength, full width at half maximum (FWHM) of the emitted light or radiation or other optical characteristics of LEEs 140 may not be all the same and are not a limitation of the present invention.

Advantageously, embodiments of the present invention produce a light sheet 110 having controlled optical characteristics. In some embodiments of the present invention it is advantageous to have multiple light sheets, each of which as a similar CCT, preferably the average CCT of each light sheet during manufacture or use having a relatively narrow CCT distribution. One measure of white color temperature is defined as a MacAdam ellipse. A MacAdam ellipse represents a region of colors on a chromaticity chart, for example the CIE chromaticity diagram, and a one-step MacAdam ellipse represents the range of colors around the center of the ellipse that are indistinguishable to the average human eye, from the color at the center of the ellipse. The contour of a one-step MacAdam ellipse therefore represents barely noticeable differences of chromaticity.

Multiple-step MacAdam ellipses may be constructed that encompass larger ranges of color around the center point. While there are many recommendations as to how tight the color temperature uniformity should be (as measured by MacAdam ellipses or other units), a variation encompassed within a smaller step number of MacAdam ellipses (smaller ellipse) is more uniform than one encompassed within a larger step number of MacAdam ellipses (larger ellipse). For example, a four-step MacAdam ellipse encompasses about a 300K color temperature variation along the black body locus, centered at 3200K, while a two-step MacAdam ellipse encompasses about a 150K color temperature variation along the black body locus, centered at 3200K.

In various embodiments of the present invention, the variation in average CCT between different light sheets 110 is less than 4 MacAdam ellipses, or less than 3 MacAdam ellipses or less than 2 MacAdam ellipses.

Substrate 165 may include, consist essentially of, or consist of a semicrystalline or amorphous material, e.g., polyethylene naphthalate (PEN), polyethylene terephthalate (PET), polycarbonate, polyethersulfone, polyester, polyimide, polyethylene, fiberglass, FR4, metal core printed circuit board, (MCPCB), and/or paper. Substrate 165 may include multiple layers, for example, a semicrystalline or amorphous material, e.g., PEN, PET, polycarbonate, polyethersulfone, polyester, polyimide, polyethylene, and/or paper formed over a second substrate for example comprising, acrylic, aluminum, steel and the like. Depending upon the desired application for which embodiments of the invention are utilized, substrate 165 may be substantially optically transparent, translucent, or opaque. For example, substrate 165 may exhibit a transmittance or a reflectivity greater than 70% for optical wavelengths ranging between approximately 400 nm and approximately 700 nm. In some embodiments substrate 165 may exhibit a transmittance or a reflectivity of greater than 70% for one or more wavelengths emitted by LEEs 140. Substrate 165 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. In some embodiments, substrate 165 may have a thickness in the range of about 10 µm to about 500 µm. In various embodiments of the present invention, substrate 165 is flexible, while in other embodiments substrate 165 may be rigid or semi-rigid. The rigidity of substrate 165 is not a limitation of the present invention. In some embodiments, a flexible substrate 165 is configurable to a radius of curvature of about 1 m or less, or about 0.5 m or less, or even about 0.1 m or less. In some embodiments, a flexible substrate 165 has a Young's Modulus less than about 100 N/m$^2$, less than about 1 N/m$^2$, less than about 0.1 N/m$^2$, or even less than about 0.05 N/m$^2$. In some embodiments, a flexible substrate 165 has a Shore A hardness value less than about 100; a Shore D hardness less than about 100; and/or a Rockwell hardness less than about 150.

Conductive elements, e.g., power conductors 120, 121 and conductive traces 160, may be formed via conventional deposition, photolithography, and etching processes, plating processes, lamination, lamination and patterning, evaporation sputtering or the like or may be formed using a variety of different printing processes. For example, power conductors 120, 121 and conductive traces 160 may be formed via screen printing, flexographic printing, ink-jet printing, and/ or gravure printing. Power conductors 120, 121 and conductive traces 160 may include, consist essentially of, or consist of a conductive material (e.g., an ink or a metal, metal film or other conductive materials or the like), which may include one or more elements such as silver, gold, aluminum, chromium, copper, and/or carbon. Power conductors 120, 121 and conductive traces 160 may have a thickness in the range of about 50 nm to about 1000 µm. In some embodiments, the thickness of power conductors 120, 121 and conductive traces 160 may be determined by the current to be carried thereby. While the thickness of one or more of power conductors 120, 121 and conductive traces 160 may vary, the thickness is generally substantially uniform along the length of the trace to simplify processing. However, this is not a limitation of the present invention, and in other embodiments the thickness and/or material of power conductors 120, 121 and conductive traces 160 may vary. In some embodiments, all or a portion of power conductors 120, 121 and conductive traces 160 may be covered or encapsulated. In some embodiments, a layer of material, for example insulating material, may be formed over all or a portion of power conductors 120, 121 and conductive traces 160. Such a material may include, e.g., a sheet of material such as used for substrate 165, a printed layer, for example using screen, ink jet, stencil or other printing means, a laminated layer, or the like. Such a printed layer may include, for example, an ink, a plastic and oxide, or the like. The covering material and/or the method by which it is applied is not a limitation of the present invention.

In various embodiments of the present invention, all or a portion of substrate 165 and/or power conductors 120, 121 and conductive traces 160 may be covered by a layer having pre-determined optical properties. In various embodiments, the optical properties of substrate 165 or a coating material on substrate 165, for example reflectance, transmittance and absorption, may be utilized to further control the optical characteristics of the lighting system. In various embodiments, substrate 165 or a coating on substrate 165 may be a diffuse reflector, while in other embodiments it may be a specular reflector, and in yet other embodiments it may be designed to have a relatively high absorbance for light emitted by LEEs 140. In various embodiments of the present invention, substrate 165 may have a reflectance of at least 80% or at least 90% or at least 95% to a wavelength of light emitted by LEEs 140. In various embodiments of the present invention, substrate 165 may be transparent or substantially transparent to a wavelength of light emitted by LEEs 140, for example having a transmittance of at least 80% or at least 90% or at least 95% to a wavelength of light emitted by LEEs 140. In various embodiments of the present invention, substrate 165 may be absorbing or substantially absorbing to a wavelength of light emitted by LEEs 140, for example having an absorbance of at least 60% or at least 70% or at least 80% to a wavelength of light emitted by LEEs 140. In various embodiments, substrate 165 or portions of substrate 165 may be configured to diffuse a wavelength of light emitted by LEEs 140. In various embodiments, substrate 165 may have two or more regions, where different regions have different optical characteristics. In various embodiments, the transmittance of a diffuse region is at least 50%, or at least 70% or at least 80%, or at least 90% to a wavelength of light emitted by LEEs 140. The remaining portion of substrate 165 in some embodiments has a reflecting surface, i.e., it is reflecting to a wavelength of light emitted by LEEs 140.

In various embodiments, conductive traces 160 are formed with a gap between adjacent conductive traces 160, and LEEs 140 and CEs 145 are electrically coupled to conductive traces 160 using conductive adhesive, e.g., an isotropically conductive adhesive and/or an ACA, as described in U.S. Pat. No. 8,384,121, filed on Jun. 29, 2011, the entire disclosure of which is incorporated herein by reference. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs. In other embodiments, LEEs 140 and CEs 145 may be attached to and/or electrically coupled to conductive traces 160 by other means, for example solder, reflow solder, wave solder, wire bonding, or the like. The method by which LEEs 140 and CEs 145 are attached to conductive traces 160 is not a limitation of the present invention.

CE 145 may be one component or multiple active and/or passive components. In one embodiment, power conductors 120,121 provide a DC voltage or substantially DC voltage and CE 145 includes, consists essentially of, or consists of a resistor, e.g. a current-limiting resistor. The choice of the resistance value may be a trade-off between a number of parameters and characteristics that may include, e.g., efficiency and current stability. In general, a larger resistance will result in reduced efficiency but greater current stability, while a smaller resistance will result in increased efficiency but reduced current stability. Variations in the current may result from variations in the input voltage (for example across power conductors 120, 121), variations in forward voltage of the LEEs 140 within the string, variations in the value of the current-limiting resistor, variations in current that may occur if one or more LEEs 140 in the string become short-circuited or the like. In the case of CE 145 including, consisting essentially of, or consisting of a resistor, in some embodiments CE 145 is a discrete resistor formed within or on conductive traces 160, such as a chip resistor, a bare-die resistor or surface mount device (SMD) resistor.

As discussed above, in embodiments where CE 145 includes, consists essentially of, or consists of a resistor, there may be trade-offs between efficiency and current stability. While such trade-offs may be acceptable in certain products, other products may require relatively better current stability at higher efficiencies, and in these cases CE 145 may include, consist essentially of, or consist of multiple components or a circuit element, as discussed above. In various embodiments CE 145 includes, consists essentially of, or consists of a field-effect transistor (FET) and a resistor. In various embodiments CE 145 includes, consists essentially of, or consists of two bipolar junction transistors (BJTs) and two resistors.

In various embodiments, the efficiency and current stability increase with the number of components, as does the cost. In some embodiments where CE 145 includes, consists essentially of, or consists of multiple components, the components may be in discrete form (i.e., each component individually electrically coupled to conductive traces 160) or in hybrid form (where multiple separate components are mounted on a submount, which is then electrically coupled to conductive traces 160), or in monolithic form (where multiple components are integrated on a semiconductor chip, for example a silicon-based or other semiconductor-based integrated circuit). In various embodiments, CE 145 may be in bare-die form, while in other embodiments CE 145 may be packaged or potted or the like. In some embodiments, CE 145 may include, consist essentially of, or consist of a bare-die integrated circuit. In some embodiments, the integrated circuit includes, consists essentially of, or consists of multiple active and/or passive devices that are fabricated on a common semiconductor substrate.

In various embodiments, power conductors 120, 121 may provide AC power, or power modulated at different frequencies and in these embodiments CEs 145 may be selected accordingly or may be omitted. In one embodiment, power conductors 120, 121 may provide a standard line voltage, for example about 120 VAC or about 240 VAC or about 277 VAC, for example at about 50 Hz or about 60 Hz. In various embodiments, CEs 145 may accommodate a plurality of input types, and thus be so-called "universal" CEs 145, while in other embodiments different CEs 145 may be required for different input types. The actual component or components of CEs 145 are not limiting to this invention; however, in preferred embodiments of this invention, the positioning of CEs 145 does not disrupt the LEE pitch. In various embodiments of this invention, the positioning of CEs 145 is independent of LEE pitch. As discussed herein, CEs 145 and LEEs 140 may be electrically coupled to conductive traces 160 using a variety of means, for example solder, conductive adhesive or anisotropic conductive adhesive (ACA); however, the method of electrical coupling of CEs 145 and LEEs 140 is not a limitation of the present invention.

In general in the above discussion the arrays of semiconductor dies, light emitting elements, optics, and the like have been shown as square or rectangular arrays; however this is not a limitation of the present invention and in other embodiments these elements may be formed in other types of arrays, for example hexagonal, triangular or any arbitrary array. In some embodiments these elements may be grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A system of lighting components for illuminating an arbitrary two-dimensional area, the system comprising:
    a plurality of assemblable illumination elements, each illumination element comprising:
        a substrate;
        first and second spaced-apart power conductors disposed over the substrate;
        a plurality of light-emitting elements that are spaced apart and interconnected into one or more light-emitting strings, each light-emitting string (i) comprising a control element disposed over the substrate and electrically connected to the light-emitting elements in the light-emitting string and configured to provide a predetermined current to the light-emitting elements in the light-emitting string, (ii) comprising two or more of the light-emitting elements, (iii) having a first end electrically connected to the first power conductor, and (iv) having a second end electrically connected to the second power conductor; and
        one or more electrical connectors each electrically coupled to at least one of the first or second power conductors,
    wherein each illumination element has a different shape defined by a one-dimensional or two-dimensional contiguous arrangement of illumination unit cells, each illumination unit cell (i) being polygonal, (ii) encompassing at least one light-emitting string, and (ii) emitting light at a predetermined luminous flux density, such that the predetermined luminous flux density of each illumination element is within ±10% of the predetermined luminous flux density of any other illumination element.

2. The system of claim 1, wherein one or more of the illumination elements is flexible.

3. The system of claim 1, further comprising a power supply electrically coupled to the one or more electrical connectors of a first illumination element, power from the power supply being supplied to one or more other illumination elements via the first illumination element.

4. The system of claim 3, wherein the power supply is configured to provide a substantially constant voltage to the illumination elements.

5. The system of claim 3, wherein the power supply is configured to adjust a light output of at least one illumination element by pulse-width-modulating a voltage or a current of the power supply.

6. The system of claim 1, further comprising a power-distribution element comprising:
one or more first connector sets each comprising one or more first electrical connectors each configured for connection to an electrical connector of an illumination element; and
one or more second connection point sets each comprising one or more second electrical connection points for receiving power from an external source of power,
wherein power received via the one or more second connection point sets is distributed, on the power-distribution element, to the one or more first connector sets.

7. The system of claim 6, further comprising a power supply, the power supply being the external source of power.

8. The system of claim 7, wherein the power supply is configured to adjust a light output of at least one illumination element by pulse-width-modulating a voltage or a current of the power supply.

9. The system of claim 1, wherein, when the plurality of illumination elements are positioned adjacent to each other and connected together via the electrical connectors, across the plurality of illumination elements, the light-emitting elements are spaced apart at a substantially constant first pitch in a first direction, the first pitch being maintained between the plurality of illumination elements.

10. The system of claim 9, wherein, when the plurality of illumination elements are positioned adjacent to each other and connected together via the electrical connectors, across the plurality of illumination elements, the light-emitting elements are spaced apart at a substantially constant second pitch in a second direction different from the first direction, the second pitch being maintained between the plurality of illumination elements.

11. The system of claim 10, wherein the first pitch and the second pitch are substantially equal.

12. The system of claim 1, further comprising an optic disposed over at least one illumination element.

13. The system of claim 1, wherein at least one control element is configured to receive a control signal representing the predetermined current, and at least one power conductor is configured to provide a control signal to the at least one control element.

14. The system of claim 1, wherein at least one illumination element further comprises a second control element (i) electrically connected to at least one light-emitting string, and (ii) configured to control the at least one light-emitting string to produce an optical characteristic of light emitted thereby.

15. The system of claim 14, wherein the optical characteristic comprises at least one of light intensity, output power, color temperature, color point, spectral power distribution, color rendering index, or light distribution pattern.

16. The system of claim 1, wherein the plurality of light-emitting elements of at least one illumination element comprises at least two groups of light-emitting elements, each group of light emitting-elements having a different optical characteristic.

17. The system of claim 16, wherein the optical characteristic comprises at least one of light intensity, output power, color temperature, color point, spectral power distribution, color rendering index, or light distribution pattern.

18. The system of claim 1, wherein one or more of the illumination elements comprises a polymeric top housing sealed to the substrate to form a sealed region in which the light-emitting elements of the illumination element are disposed.

19. The system of claim 18, wherein the one or more of the illumination elements is water-resistant or waterproof.

20. The system of claim 18, wherein (i) the substrate of the one or more of the illumination elements has a first surface and a second surface opposite the second surface, the light-emitting elements being disposed over the first surface, and (ii) the one or more of the illumination elements further comprises a polymeric bottom housing disposed over the second surface of the substrate opposite the top housing, at least a portion of the bottom housing contacting the second surface of the substrate to form a second sealed region disposed between the bottom housing and the second surface of the substrate.

21. The system of claim 20, wherein the bottom housing is in contact with at least a portion of the second surface in the second sealed region.

22. The system of claim 18, wherein (i) the substrate of the one or more of the illumination elements has a first surface and a second surface opposite the second surface, the light-emitting elements being disposed over the first surface, and (ii) the one or more of the illumination elements further comprises a polymeric bottom housing disposed over the second surface of the substrate opposite the top housing, at least a portion of the bottom housing contacting the top housing to form a second sealed region disposed between the bottom housing and (a) the top housing and/or (b) the second surface of the substrate.

23. The system of claim 18, wherein the top housing comprises at least one of polyester, acrylic, polystyrene, polyethylene, polyimide, polyethylene naphthalate, polyethylene terephthalate, polypropylene, polycarbonate, acrylonitrile butadiene styrene, polyurethane, silicone, or polydimethylsiloxane.

24. The system of claim 18, wherein the predetermined luminous flux density of each illumination element is within ±10% of the predetermined luminous flux density of any other illumination element.

25. The system of claim 18, wherein the one or more of the illumination elements is flexible.

26. The system of claim 18, further comprising a power-distribution element comprising:
one or more first connector sets each comprising one or more first electrical connectors each configured for connection to an electrical connector of an illumination element; and
one or more second connection point sets each comprising one or more second electrical connection points for receiving power from an external source of power,
wherein power received via the one or more second connection point sets is distributed, on the power-distribution element, to the one or more first connector sets.

27. The system of claim 26, wherein, when the one or more first connector sets are connected and the one or more second connection point sets are connected, the power-distribution element is water-resistant or waterproof.

* * * * *